United States Patent
Yamaguchi et al.

(10) Patent No.: US 8,675,383 B2
(45) Date of Patent: Mar. 18, 2014

(54) SEMICONDUCTOR DEVICE

(71) Applicant: Fujitsu Semiconductor Limited, Yokohama (JP)

(72) Inventors: Akihisa Yamaguchi, Yokohama (JP); Eiji Yoshida, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/644,036

(22) Filed: Oct. 3, 2012

(65) Prior Publication Data

US 2013/0088908 A1 Apr. 11, 2013

(30) Foreign Application Priority Data

Oct. 6, 2011 (JP) .................. 2011-221519

(51) Int. Cl.
 *G11C 5/06* (2006.01)

(52) U.S. Cl.
 USPC .......................................... 365/72

(58) Field of Classification Search
 USPC .......................................... 365/72
 See application file for complete search history.

(56) References Cited

U.S. PATENT DOCUMENTS

2013/0087687 A1*  4/2013  Hiyama et al. ............ 250/208.1

FOREIGN PATENT DOCUMENTS

| JP | 2000-114399 A | 4/2000 |
|----|---------------|--------|
| JP | 2002-353340 A | 12/2002 |
| JP | 2009-110594 A | 5/2009 |

OTHER PUBLICATIONS

Y. Hirano et al, "A Novel Low-Power and High-Speed SOI SRAM With Actively Body-Bias Controlled (ABC) Technology for Emerging Generation", IEEE Transactions on Electron Devices, vol. 55, No. 1, Jan. 2008, pp. 365-371, Cited in Specification.

F. Assaderaghi et al, "A Dynamic Threshold Voltage MOSFET (DTMOS) for Ultra-Low Voltage Operation", Department of Electrical Engineering and Computer Science, IEEE Xplore, 1994, pp. 33.1.1-33.1.4, Cited in Specification.

F. Armaud et al, "Low Cost 65nm CMOS Platform for Low Power & General Purpose Applications", Symposium on VLSI Technology Digest of Technical Papers, 2004, pp. 10-11.

L. Chang et al, "Stable SRAM Cell Design for the 32 nm Node and Beyond", Symposium on VLSI Technology Digest of Technical Papers, 2005, pp. 128-129.

* cited by examiner

*Primary Examiner* — Hoai V Ho
*Assistant Examiner* — Pablo Huerta
(74) *Attorney, Agent, or Firm* — Westerman, Hattori, Daniels & Adrian, LLP

(57) ABSTRACT

Memory cells adjacent to each other in a second direction are formed in a first p-type well region, a first n-type well region, and a second p-type well region arranged in a first direction. Each memory cell includes a first transfer transistor and a first driver transistor formed in the first p-type well region, a second transfer transistor and a second driver transistor formed in the second p-type well region, and first and second load transistors formed in the first n-type well region. In an SRAM, gate electrodes of the first and second transfer transistors of the memory cells adjacent to each other in the second direction are electrically connected to first and second word lines, respectively. The first and second word lines are electrically connected to the first and second p-type well regions, respectively.

19 Claims, 50 Drawing Sheets

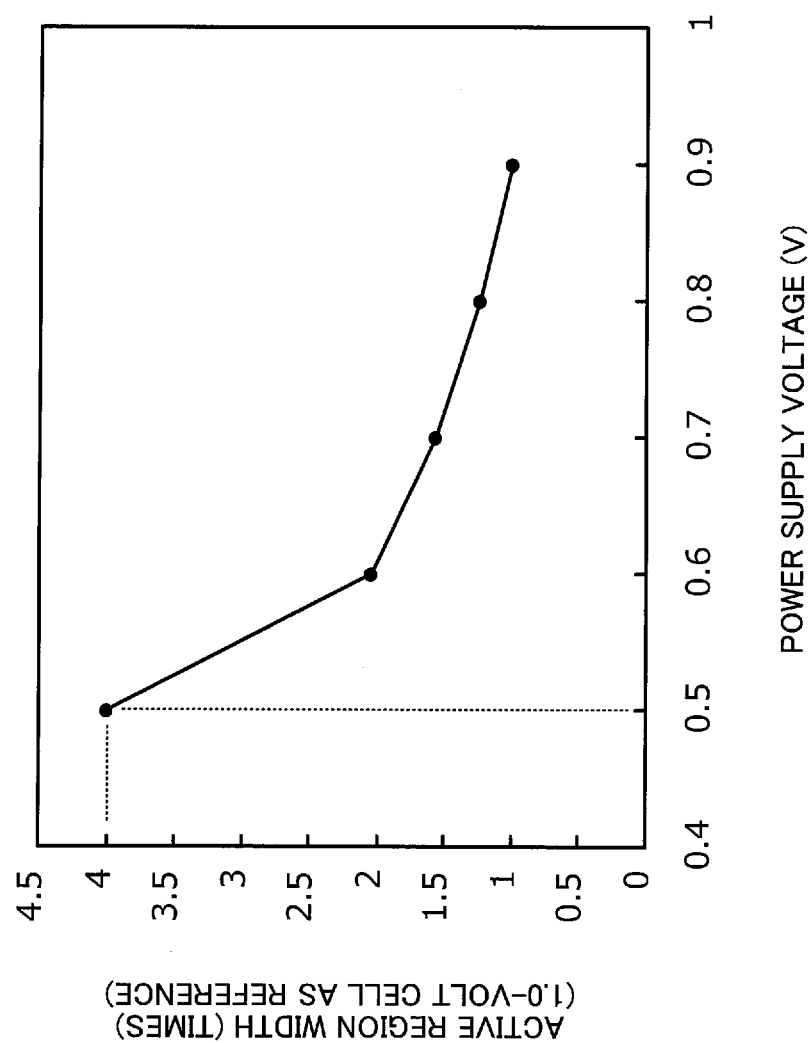

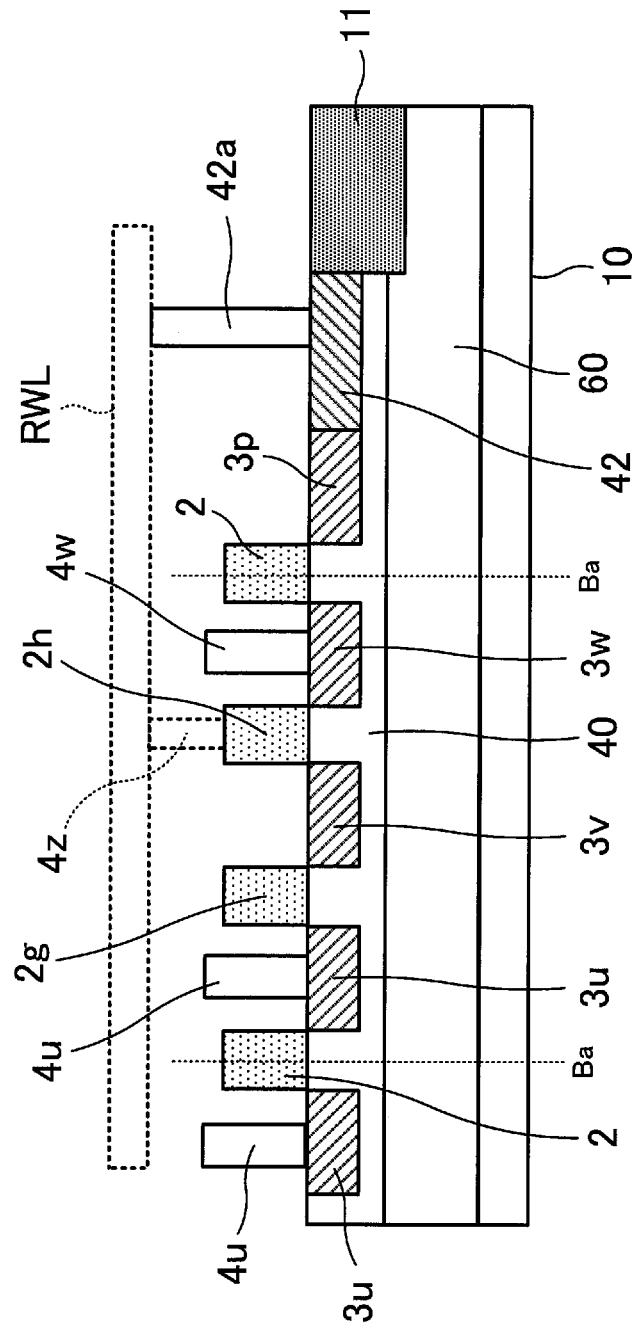

SEMICONDUCTOR DEVICE

CROSS-REFERENCE TO RELATED APPLICATION

This application is based upon and claims the benefit of priority of the prior Japanese Patent Application No. 2011-221519, filed on Oct. 6, 2011, the entire contents of which are incorporated herein by reference.

FIELD

The embodiments discussed herein are related to a semiconductor device.

BACKGROUND

An attempt to decrease the operating voltage, the power consumption, the area, or the like of an SRAM (Static Random Access Memory) included in a semiconductor device is made. For example, a technique for decreasing ON-state threshold voltage by using a DT (Dynamic Threshold voltage) MOS transistor in which a gate electrode and a well region (body) are short-circuited as a determined MOS (Metal Oxide Semiconductor) transistor included in an SRAM cell is known. Furthermore, for example, a technique for controlling threshold voltage by applying a bias to a body on the basis of a bit line signal or by applying potential corresponding to stored data as a substrate bias is known.

Japanese Laid-open Patent Publication No. 2009-110594
Japanese Laid-open Patent Publication No. 2002-353340
Japanese Laid-open Patent Publication No. 2000-114399
IEEE TRANSACTIONS ON ELECTRON DEVICE, Vol. 55, No. 1, pp. 365-371 (January 2008)
IEEE International Electron Devices Meeting 1994, pp. 809-812 (1994)

If the above DTMOS is adopted in an SRAM, then a process for fabricating the SRAM in which the DTMOS is adopted and a semiconductor device including the SRAM may become complex, the costs may rise, and so on. Furthermore, to control threshold voltage for the purpose of decreasing voltage or power consumption by applying determined potential to a well region (body) may make it impossible to, for example, decrease the area of an SRAM cell, depending on circuit structure.

SUMMARY

According to an aspect, there is provided a semiconductor device including a first p-type well region, a first n-type well region, and a second p-type well region arranged in a first direction in a semiconductor substrate, a first active region formed in the first p-type well region, a second active region formed in the second p-type well region, and a third active region and a fourth active region formed in the first n-type well region and arranged in the first direction, memory cells formed by the use of the first p-type well region, the first n-type well region, and the second p-type well region and adjacent to each other in a second direction perpendicular to the first direction, and signal lines electrically connected to the memory cells. Each of the memory cells includes a first n-type transistor including a first gate electrode formed over the first active region and a first n-type region and a second n-type region formed in the first active region on both sides of the first gate electrode, a second n-type transistor including a second gate electrode formed over the first active region on a second n-type region side from the first gate electrode and the second n-type region and a third n-type region formed in the first active region on both sides of the second gate electrode, a first p-type transistor including a third gate electrode formed over the third active region and electrically connected to the second gate electrode and a first p-type region and a second p-type region formed in the third active region on both sides of the third gate electrode, a third n-type transistor including a fourth gate electrode formed over the second active region and a fourth n-type region and a fifth n-type region formed in the second active region on both sides of the fourth gate electrode, a fourth n-type transistor including a fifth gate electrode formed over the second active region on a fifth n-type region side from the fourth gate electrode and the fifth n-type region and a sixth n-type region formed in the second active region on both sides of the fifth gate electrode, and a second p-type transistor including a sixth gate electrode formed over the fourth active region and electrically connected to the fifth gate electrode and a third p-type region and a fourth p-type region formed in the fourth active region on both sides of the sixth gate electrode. The second n-type region, the first p-type region, and the sixth gate electrode are electrically connected to one another. The fifth n-type region, the third p-type region, and the third gate electrode are electrically connected to one another. The signal lines include a first word line electrically connected to the first gate electrodes of two of the memory cells adjacent to each other in the second direction and the first p-type well region and a second word line electrically connected to the fourth gate electrodes of two of the memory cells adjacent to each other in the second direction and the second p-type well region.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 8 is an example of the relationship between power supply voltage and active region width;

FIG. 39 is an example of the SRAM according to the third embodiment (part 2);

DESCRIPTION OF EMBODIMENTS

Figure 1:
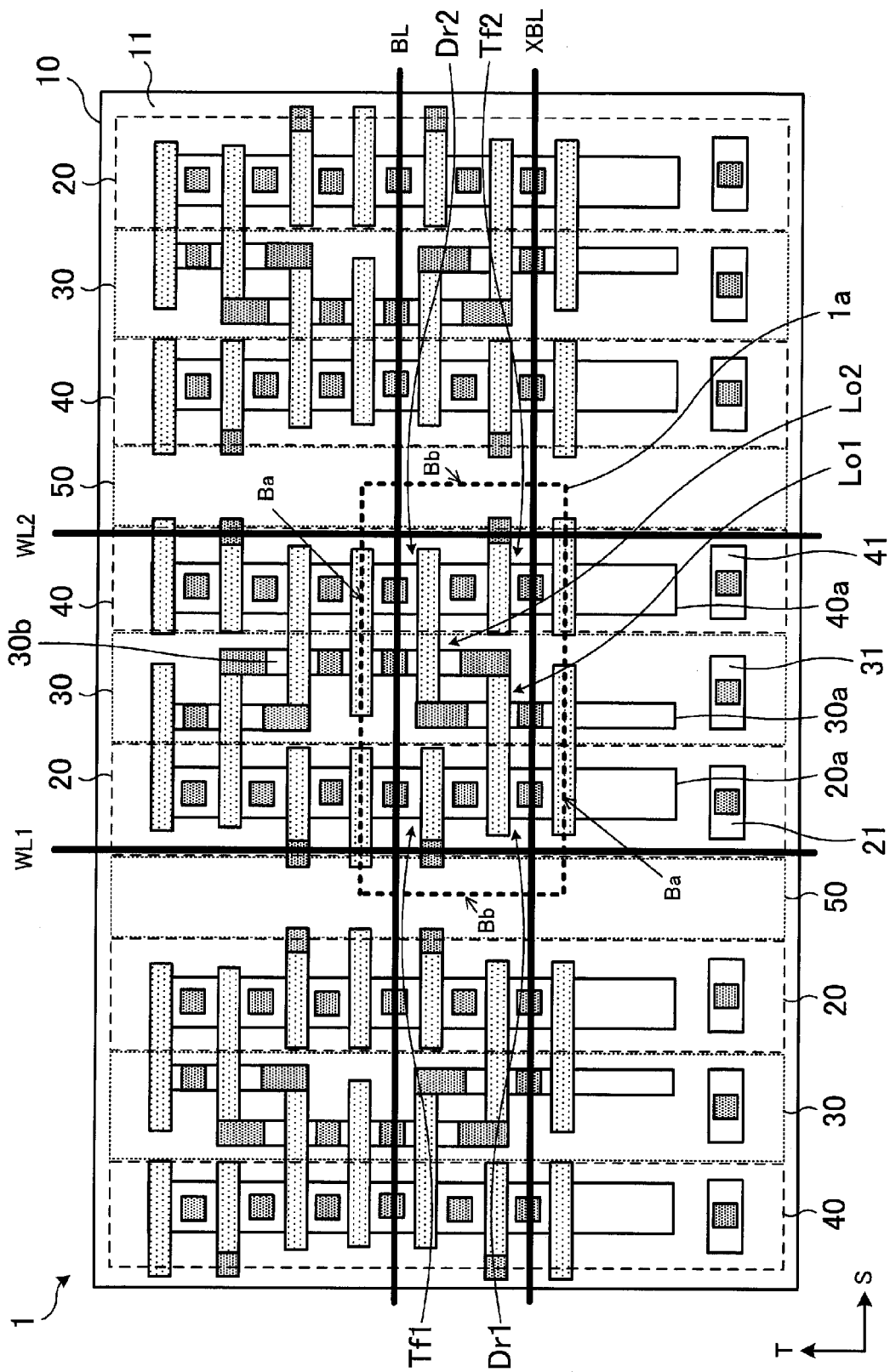
FIG. 1 is an example of an SRAM according to a first embodiment (part 1)

First a first embodiment will now be described with reference to the accompanying drawings, wherein like reference numerals refer to like elements throughout.

Figure 2:
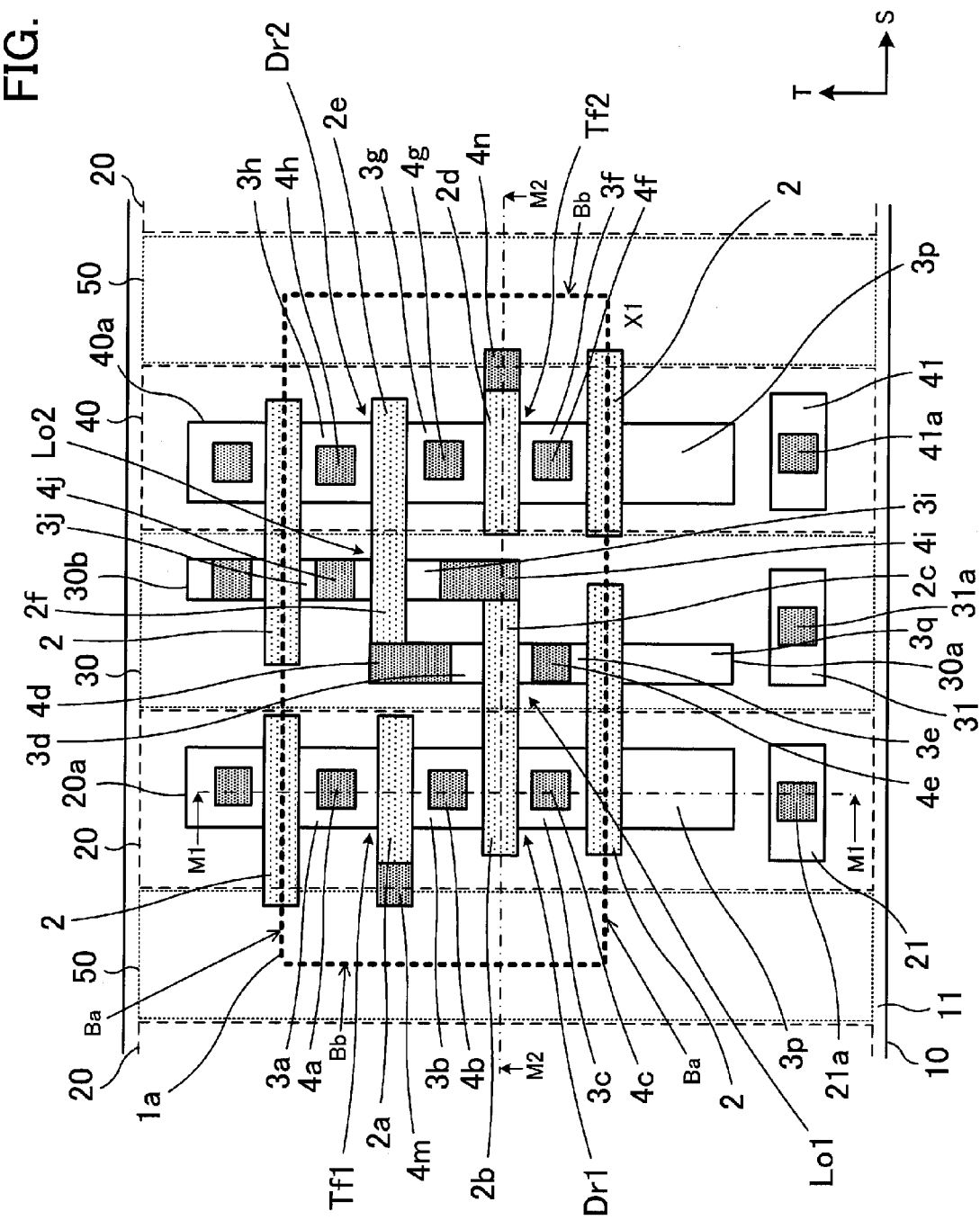
FIG. 2 is an example of an SRAM according to a first embodiment (part 2)
Figure 3A:
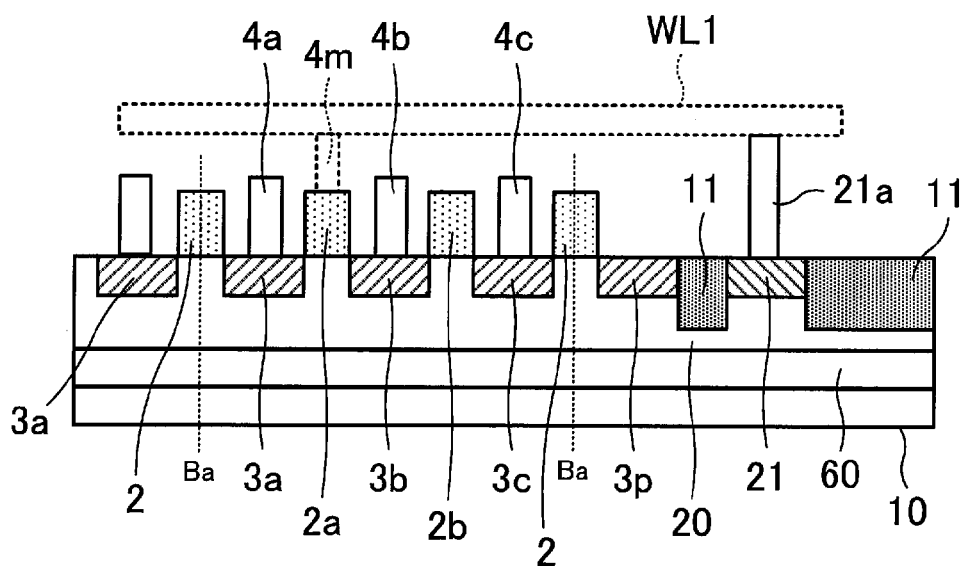
FIGS. 3A and 3B are an example of an SRAM according to a first embodiment (part 3)
Figure 3B:
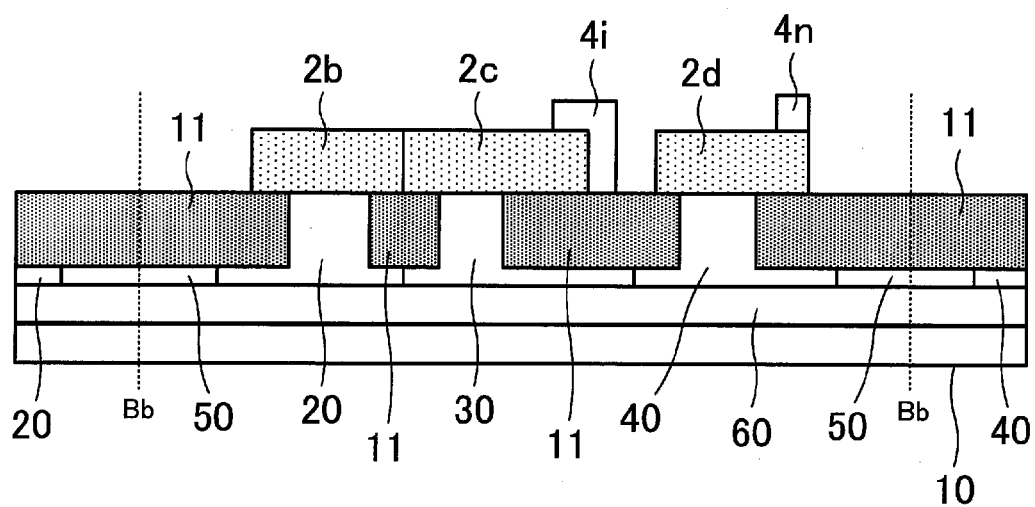
Figure 4:
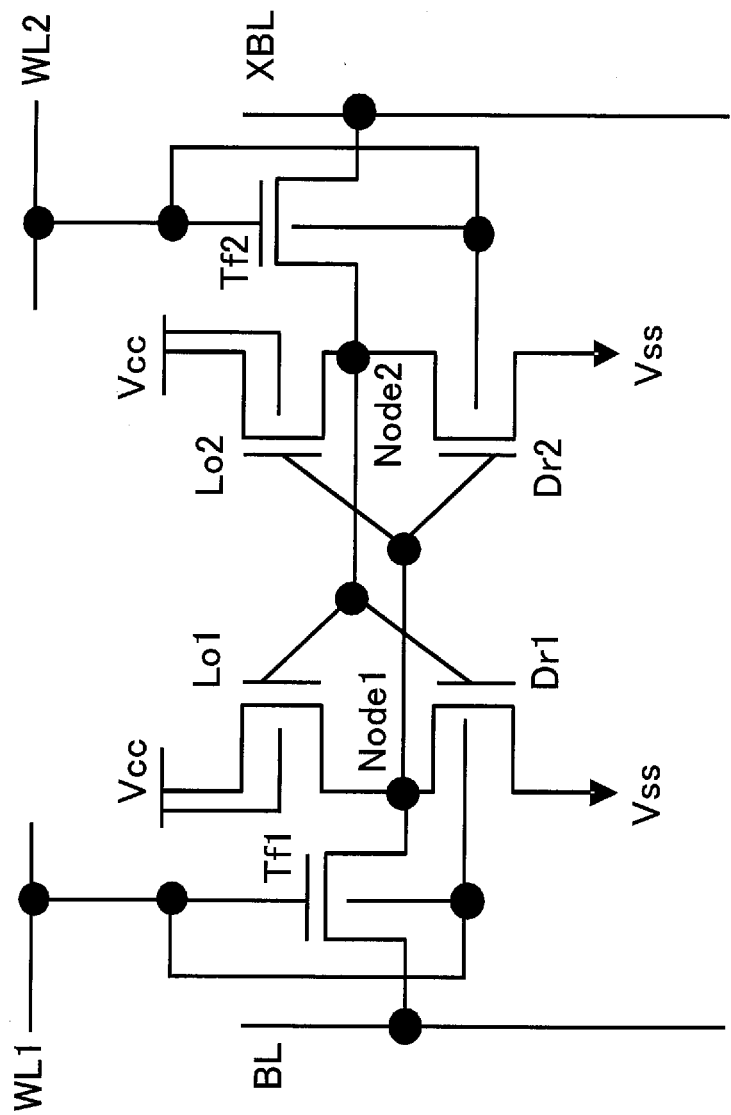
FIG. 4 is a circuit diagram of a memory cell in the SRAM according to the first embodiment.

FIGS. 1 through 3A and 3B are an example of an SRAM according to a first embodiment. FIG. 1 is a fragmentary schematic plan view of an example of an SRAM according to a first embodiment. FIG. 2 is an enlarged schematic view of a portion of the SRAM illustrated in FIG. 1. FIGS. 3A and 3B are fragmentary schematic sectional views of the portion of the SRAM illustrated in FIG. 2. FIG. 3A is a fragmentary schematic sectional view taken along lines M1-M1 of FIG. 2. FIG. 3B is a fragmentary schematic sectional view taken along lines M2-M2 of FIG. 2. In addition, FIG. 4 is a circuit diagram of a memory cell in the SRAM according to the first embodiment.

An SRAM 1 illustrated in FIG. 1 includes a p-type well region 20, an n-type well region 30, and a p-type well region 40 formed in a semiconductor substrate 10. The p-type well region 20, the n-type well region 30, and the p-type well region 40 are arranged in a first direction S and each of them extends in a second direction T perpendicular to the first direction S. The SRAM 1 includes a plurality of combinations of the above p-type well region 20, n-type well region 30, and p-type well region 40. A memory cell 1a illustrated in FIGS.

1 and 2 is formed by the use of one combination of the p-type well region 20, the n-type well region 30, and the p-type well region 40.

An n-type well region 50 is formed between two combinations, that is to say, between the p-type well region 20 included in one combination and the p-type well region 20 included in another combination or between the p-type well region 40 included in one combination and the p-type well region 40 included in another combination. As illustrated in FIGS. 3A and 3B, an n-type well region (deep n-type well region) 60 is formed in a region in the semiconductor substrate 10 which is deeper than the p-type well region 20, the n-type well region 30, the p-type well region 40, and the n-type well region 50. The p-type well region 20 and the p-type well region 40 included in one combination are electrically isolated from each other by the n-type well region 30 and the n-type well region 60. The p-type well region 20 included in one combination and the p-type well region 20 included in another combination are electrically isolated from each other by the n-type well region 50, the n-type well region 60, and an isolation layer 11. The p-type well region 40 included in one combination and the p-type well region 40 included in another combination are electrically isolated from each other by the n-type well region 50, the n-type well region 60, and the isolation layer 11.

The p-type well region 20 includes an active region 20a in which a transfer transistor (Tf1) and a driver transistor (Dr1) are formed. The p-type well region includes an active region 40a in which a transfer transistor (Tf2) and a driver transistor (Dr2) are formed. The n-type well region 30 includes an active region 30a in which a load transistor Lo1 is formed and an active region 30b in which a load transistor Lo2 is formed. These active regions 20a, 40a, 30a, and 30b are defined with the insulating isolation layer 11 formed at a determined depth (smaller than that of the n-type well region 60, for example) in the semiconductor substrate 10.

The SRAM 1 includes a plurality of memory cells 1a. The structure of the memory cell 1a will be described in detail with reference to FIGS. 1 through 3A and 3B.

The memory cell 1a includes the transfer transistor Tf1 and the driver transistor Dr1 formed in the active region 20a of the p-type well region 20 and the load transistor Lo1 formed in the active region 30a of the n-type well region 30. The transfer transistor Tf1 and the driver transistor Dr1 are n-channel MOS transistors (nMOSes) and the load transistor Lo1 is a p-channel MOS transistor (pMOS).

The transfer transistor Tf1 includes a gate electrode 2a formed over the active region 20a and an n-type region 3a and an n-type region 3b formed in the active region 20a on both sides of the gate electrode 2a. The driver transistor Dr1 includes a gate electrode 2b formed over the active region 20a on the n-type region 3b side from the above gate electrode 2a and the n-type region 3b and an n-type region 3c formed in the active region 20a on both sides of the gate electrode 2b. The load transistor Lo1 includes a gate electrode 2c formed over the active region 30a and a p-type region 3d and a p-type region 3e formed in the active region 30a on both sides of the gate electrode 2c. The gate electrode 2b of the driver transistor Dr1 and the gate electrode 2c of the load transistor Lo1 are electrically connected with each other. For example, the gate electrode 2b and the gate electrode 2c can be formed integrally (as one gate electrode).

Furthermore, the memory cell 1a includes the transfer transistor Tf2 and the driver transistor Dr2 formed in the active region 40a of the p-type well region 40 and the load transistor Lo2 formed in the active region 30b of the n-type well region 30. The transfer transistor Tf2 and the driver transistor Dr2 are nMOSes and the load transistor Lo2 is a pMOS.

The transfer transistor Tf2 includes a gate electrode 2d formed over the active region 40a and an n-type region 3f and an n-type region 3g formed in the active region 40a on both sides of the gate electrode 2d. The driver transistor Dr2 includes a gate electrode 2e formed over the active region 40a on the n-type region 3g side from the above gate electrode 2d and the n-type region 3g and an n-type region 3h formed in the active region 40a on both sides of the gate electrode 2e. The load transistor Lo2 includes a gate electrode 2f formed over the active region 30b and a p-type region 3i and a p-type region 3j formed in the active region 30b on both sides of the gate electrode 2f. The gate electrode 2e of the driver transistor Dr2 and the gate electrode 2f of the load transistor Lo2 are electrically connected with each other. For example, the gate electrode 2e and the gate electrode 2f can be formed integrally (as one gate electrode).

In the memory cell 1a the gate electrode 2c (and the gate electrode 2b), the p-type region 3i, and the n-type region 3g are electrically connected with one another via a contact electrode 4i connected to the gate electrode 2c and the p-type region 3i and a contact electrode 4g connected to the n-type region 3g. In addition, in the memory cell 1a the gate electrode 2f (and the gate electrode 2e), the p-type region 3d, and the n-type region 3b are electrically connected with one another via a contact electrode 4d connected to the gate electrode 2f and the p-type region 3d and a contact electrode 4b connected to the n-type region 3b. The contact electrode 4i and the contact electrode 4d are what is called shared contact electrodes.

The n-type region 3a of the transfer transistor Tf1 is electrically connected to one bit line BL included in a bit line pair via a contact electrode 4a. The n-type region 3f of the transfer transistor Tf2 is electrically connected to the other bit line XBL included in the bit line pair via a contact electrode 4f. In the SRAM 1 the bit lines BL and XBL extend in the first direction S.

The n-type region 3c of the driver transistor Dr1 and the n-type region 3h of the driver transistor Dr2 are electrically connected to a ground potential line Vss via contact electrodes 4c and 4h respectively. The p-type region 3e of the load transistor Lot and the p-type region 3j of the load transistor Lo2 are electrically connected to a power supply potential line Vcc via contact electrodes 4e and 4j respectively.

In the SRAM 1 the gate electrode 2a of the transfer transistor Tf1 and the gate electrode 2d of the transfer transistor Tf2 are electrically connected to word lines WL1 and WL2 via contact electrodes 4m and 4n respectively. In the SRAM 1 the word lines WL1 and WL2 extend in the second direction T. The potential levels of the word lines WL1 and WL2 are the same.

As illustrated in FIG. 1, a plurality of memory cells 1a each having the above structure are formed in the second direction T by the use of one combination of the p-type well region 20, the n-type well region 30, and the p-type well region 40 between a pair of the n-type well regions 50. Two adjacent memory cells 1a are symmetrical with respect to a boundary Ba between them.

In the SRAM 1 dummy gate electrodes 2 are formed at the boundary Ba between two memory cells 1a adjacent to each other in the second direction T over one combination of the p-type well region 20, the n-type well region 30, and the p-type well region 40. The p-type active region 20a (p-type well region 20) is under dummy gate electrodes 2. As a result, in the SRAM 1 n-type regions 3a (bit lines BL) or n-type regions 3c of memory cells 1a adjacent to each other in the second direction T are electrically isolated from each other.

Similarly, in the SRAM 1 the p-type active region 40a (p-type well region 40) is under dummy gate electrodes 2. As a result, n-type regions 3h or n-type regions 3f (bit lines XBL) of memory cells 1a adjacent to each other in the second direction T are electrically isolated from each other. Furthermore, in the SRAM 1 the n-type active region 30a (n-type well region 30) is under dummy gate electrodes 2. As a result, p-type regions 3e of memory cells 1a adjacent to each other in the second direction T are electrically isolated from each other. In addition, in the SRAM 1 p-type regions 3e of memory cells 1a adjacent to each other in the second direction T or p-type regions 3j of memory cells 1a adjacent to each other in the second direction T are electrically isolated from each other by the n-type active region 30a or the n-type active region 30b (n-type well region 30) under a dummy gate electrode 2.

A word line WL1 electrically connected to a gate electrode 2a of a transfer transistor Tf1 of a first memory cell 1a via a contact electrode 4m is also electrically connected to a gate electrode 2a of a transfer transistor Tf1 of a second memory cell 1a adjacent to the first memory cell 1a in the second direction T. Furthermore, A word line WL2 electrically connected to a gate electrode 2d of a transfer transistor Tf2 of the first memory cell 1a via a contact electrode 4n is also electrically connected to a gate electrode 2d of a transfer transistor Tf2 of the second memory cell 1a adjacent to the first memory cell 1a in the second direction T.

A p-type tap region 21 and a p-type tap region 41 defined by the isolation layer 11 are formed in the p-type well region 20 and the p-type well region 40, respectively, of the SRAM 1. Similarly, an n-type tap region 31 defined by the isolation layer 11 is formed in the n-type well region 30. A contact electrode 31a is connected to the n-type tap region 31.

A word line WL1 electrically connected to a gate electrode 2a of a transfer transistor Tf1 of each memory cell 1a is electrically connected to the p-type tap region 21 via a contact electrode 21a. Similarly, a word line WL2 electrically connected to a gate electrode 2d of a transfer transistor Tf2 is electrically connected to the p-type tap region 41 via a contact electrode 41a.

That is to say, gate electrodes 2a of transfer transistors Tf1 of memory cells 1a adjacent to each other in the second direction T and the p-type well region 20 in which these transfer transistors Tf1 (and driver transistors Dr1) are formed are short-circuited. Similarly, gate electrodes 2d of transfer transistors Tf2 of memory cells 1a adjacent to each other in the second direction T and the p-type well region 40 in which these transfer transistors Tf2 (and driver transistors Dr2) are formed are short-circuited.

As a result, a circuit illustrated in FIG. 4 is realized in each memory cell 1a of the SRAM 1. A latch section (data storage section) in each memory cell 1a includes a Node 1 and a Node 2. The Node 1 is at a low (L) level and the Node 2 is at a high (H) level. Alternatively, the Node 1 is at the H level and the Node 2 is at the L level. A distinction is made between these two states and 0 or 1 is stored.

As illustrated in FIG. 3B, memory cells 1a adjacent to each other in the first direction S are electrically isolated from each other by a pair of n-type well regions 50 between which a p-type well region 20, an n-type well region 30, and a p-type well region 40 are formed, the n-type well region 60 formed at a depth greater than that of these n-type well regions 50, and the isolation layer 11. Memory cells 1a adjacent to each other in the first direction S are symmetrical with respect to a boundary Bb between them.

As illustrated in FIG. 1, memory cells 1a are arranged in the second direction T. A gate electrode 2a of a transfer transistor Tf1 of a memory cell 1a is electrically isolated from a gate electrode 2a of a transfer transistor Tf1 of a memory cell 1a adjacent thereto in the first direction S. Similarly, a gate electrode 2d of a transfer transistor Tf2 of a memory cell 1a is electrically isolated from a gate electrode 2d of a transfer transistor Tf2 of memory cell 1a adjacent thereto in the first direction S.

The SRAM 1 according to the first embodiment has, for example, the above structure.

In the SRAM 1 a gate oxide film is formed under the gate electrodes 2a through 2f and the dummy gate electrodes 2.

In the SRAM 1 sidewall spacers may be formed on sidewalls of the gate electrodes 2a through 2f and the dummy gate electrodes 2. Furthermore, in the SRAM 1 a salicide layer may be formed as surfaces of the gate electrodes 2a through 2f, the dummy gate electrodes 2, the n-type regions 3a, 3b, 3c, 3f, 3g, 3h, and 3p, the p-type regions 3d, 3e, 3i, 3j, and 3q, the n-type tap region 31, and the p-type tap regions 21 and 41. In addition, in the SRAM 1 an extension region and a halo region may be formed in each of NMOSes (transfer transistors Tf1 and Tf2 and the driver transistors Dr1 and Dr2) and PMOSes (load transistors Lo1 and Lo2).

An SRAM having another structure will now be described in order to compare the SRAM 1 according to the first embodiment with it.

Figure 5A:
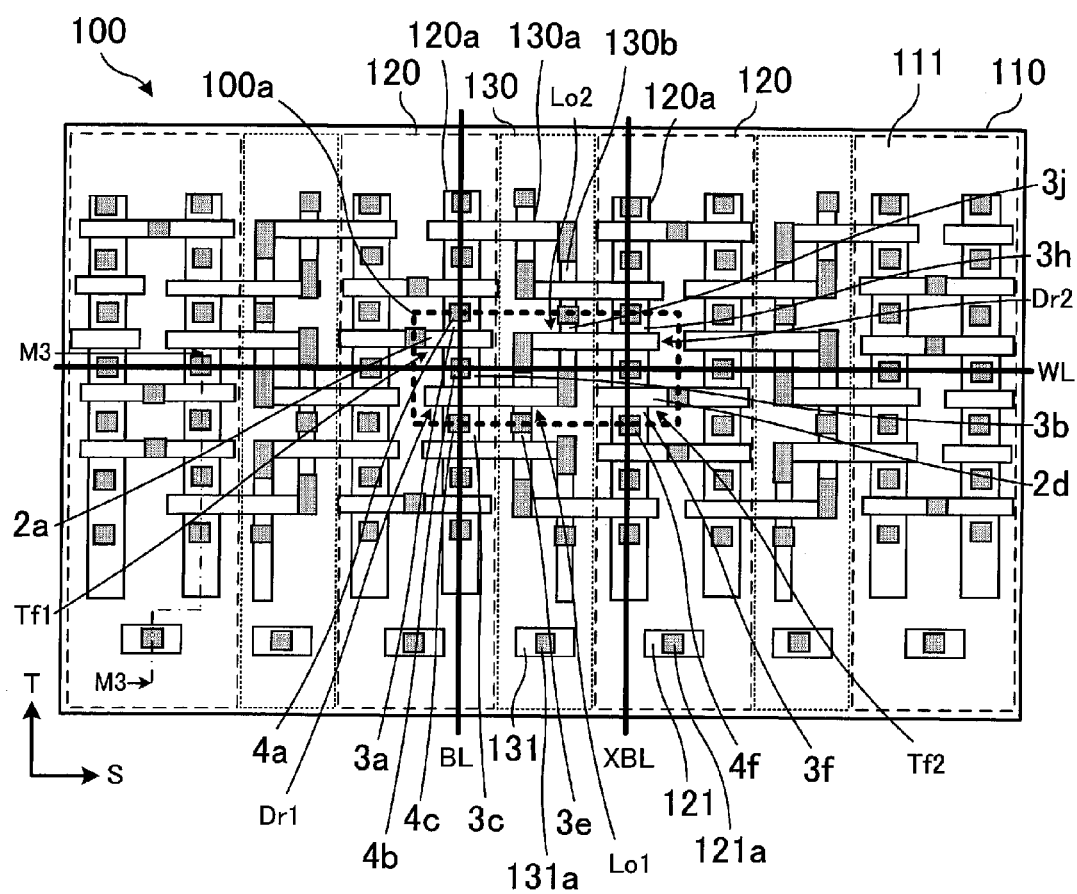
FIGS. 5A and 5B are an example of an SRAM having another structure.
Figure 5B:
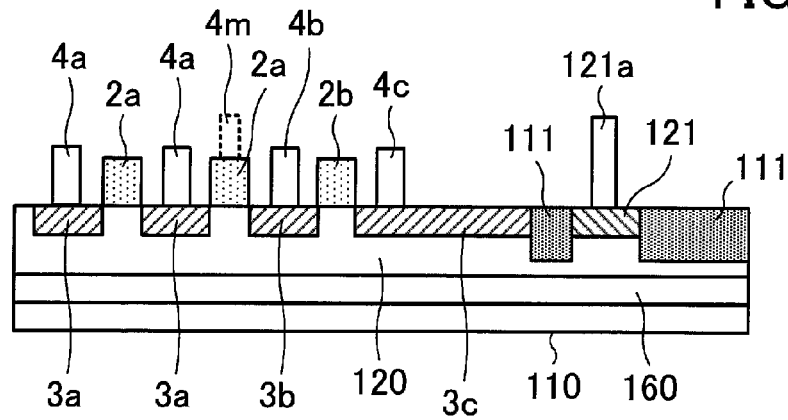
Figure 6:
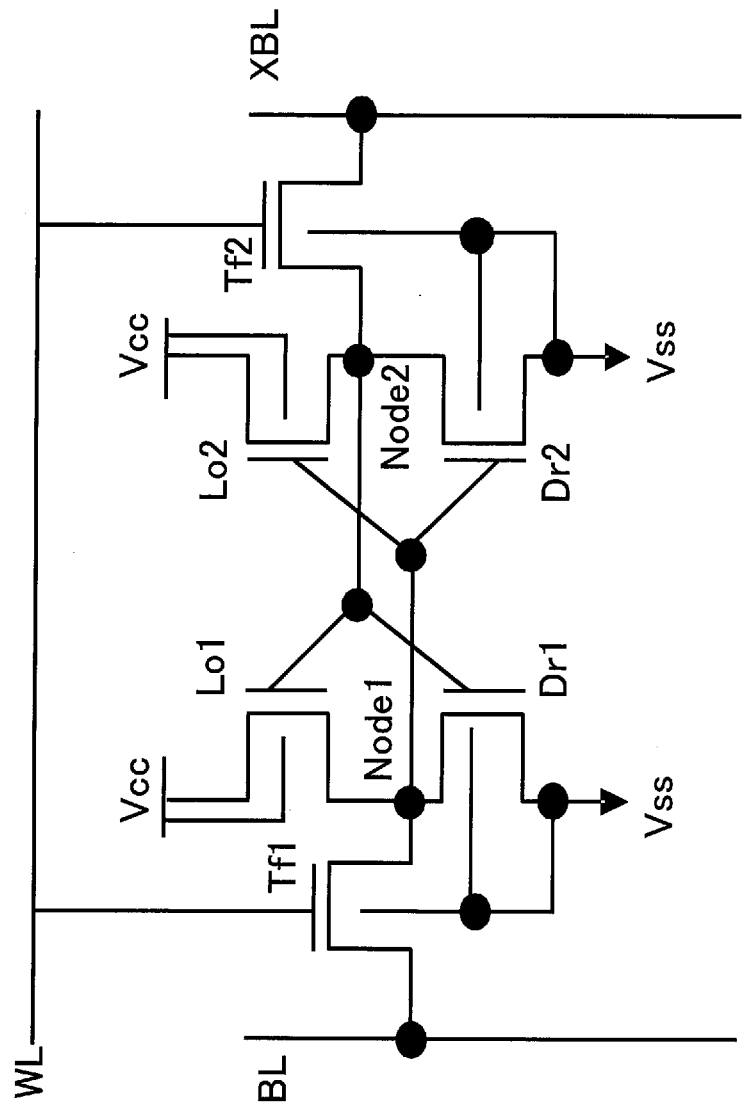
FIG. 6 is a circuit diagram of a memory cell in the SRAM having another structure.

FIGS. 5A and 5B are an example of an SRAM having another structure. FIG. 5A is a fragmentary schematic plan view of an SRAM having another structure. FIG. 5B is a schematic sectional view taken along lines M3-M3 of FIG. 5A. FIG. 6 is a circuit diagram of a memory cell in the SRAM having another structure. For convenience of explanation components in FIGS. 5A and 5B which are the same as or correspond to those included in the above SRAM 1 are marked with the same numerals.

An SRAM 100 illustrated in FIGS. 5A and 5B is formed in p-type well regions 120 and n-type well regions 130 arranged alternately in a semiconductor substrate 110. An n-type well region (deep n-type well region) 160 is formed at a depth greater than that of the p-type well regions 120 and the n-type well regions 130.

A memory cell 100a of the SRAM 100 includes a transfer transistor Tf1 and a driver transistor Dr1 formed in an active region 120a of a p-type well region 120. In addition, the memory cell 100a includes a load transistor Lo1 formed in an active region 130a of a n-type well region 130 adjacent to the p-type well region 120 and a load transistor Lo2 formed in an active region 130b of the n-type well region 130. Furthermore, the memory cell 100a includes a transfer transistor Tf2 and a driver transistor Dr2 formed in an active region 120a of another p-type well region 120 adjacent to the n-type well region 130.

Such memory cells 100a are arranged in a second direction T so that two adjacent memory cells 100a will be symmetrical with respect to a boundary between them. Such memory cells 100a are also arranged in a first direction S so that two adjacent memory cells 100a will be symmetrical with respect to a boundary between them. Memory cells 100a adjacent to each other in the first direction S are formed by sharing a p-type well region 120. Furthermore, gate electrodes 2a of transfer transistors Tf1 of memory cells 100a adjacent to each other in the first direction S are electrically connected over an isolation layer 111 over a p-type well region 120. Similarly, gate electrodes 2d of transfer transistors Tf2 are electrically connected over an isolation layer 111 over a p-type well region 120. The gate electrodes 2a and the gate electrodes 2d of the memory cells 100a adjacent to each other in the first direction S are then electrically connected to a common word line WL which extends in the first direction S. In FIG. 5B, a contact electrode 4m which electrically connects the gate electrode 2a and the word line WL is illustrated by a dotted line.

With memory cells 100a adjacent to each other in the second direction T, transfer transistors Tf1 share an n-type region 3a and transfer transistors Tf2 share an n-type region 3f. With the memory cells 100a adjacent to each other in the second direction T, driver transistors Dr1 share an n-type region 3c and driver transistors Dr2 share an n-type region 3h. With the memory cells 100a adjacent to each other in the second direction T, load transistors Lo1 share a p-type region 3e and load transistors Lo2 share a p-type region 3j.

The shared n-type region 3a is electrically connected via a contact electrode 4a to a bit line BL which extends in the second direction T, and the shared n-type region 3f is electrically connected via a contact electrode 4f to a bit line XBL which extends in the second direction T. The shared n-type region 3c and the shared n-type region 3h are electrically connected to a ground potential line Vss and the shared p-type region 3e and the shared p-type region 3j are electrically connected to a power supply potential line Vcc.

A p-type tap region 121 is formed in each p-type well region 120 of the SRAM 100 and an n-type tap region 131 is formed in each n-type well region 130 of the SRAM 100. A contact electrode 121a and a contact electrode 131a are connected to each p-type well region 120 and each n-type well region 130 respectively. Potential of each p-type well region 120 and each n-type well region 130 is drawn out by the use of a p-type tap region 121 and an n-type tap region 131 respectively.

By adopting the above structure, a circuit illustrated in FIG. 6 is realized in each memory cell 100a of the SRAM 100.

With the SRAM 100, memory cells 100a arranged in the first direction S share the word line WL and memory cells 100a arranged in the second direction T share the bit line BL and the bit line XBL. Accordingly, the word line WL extends in the first direction S and the bit line BL and the bit line XBL extend in the second direction T. In addition, with the SRAM 100 the gate electrode 2a of the transfer transistor Tf1 electrically connected to the word line WL and the p-type well region 120 in which the transfer transistor Tf1 is formed are not short-circuited. Similarly, the gate electrode 2d of the transfer transistor Tf2 electrically connected to the word line WL and the p-type well region 120 in which the transfer transistor Tf2 is formed are not short-circuited.

It is assumed that power supply voltage (operating voltage) of the above SRAM 100 is decreased (decrease in voltage). For example, it is assumed that power supply voltage of the SRAM 100 is decreased from 1.2 V to 1.0 V. Furthermore, it is assumed that the structure of the SRAM 100 is not changed and that its power supply voltage is decreased. This causes a lack of an ON-state current Ion and the SRAM 100 does not operate. Accordingly, it is necessary to increase transistor gate width (active region width) W in the memory cell 100a. As a result, the area of the memory cell 100a increases.

Figure 7A:
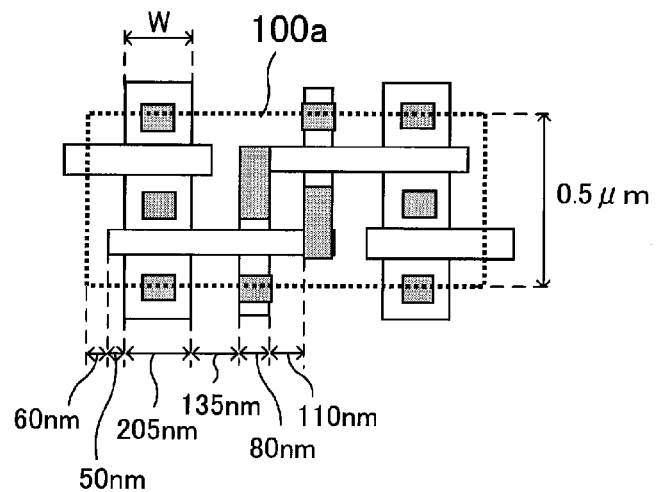
FIGS. 7A and 7B are an example of a memory cell in an SRAM.

With the 65-nanometer technology, for example, it is reported that if power supply voltage is 1.2 V, then the area of a memory cell (hereinafter referred to as a "1.2-volt cell") is 0.5 $\mu m^2$ (IEEE 2004 Symposium on VLSI Technology Digest of Technical Papers, pp. 10-11, 2004). A memory cell (hereinafter referred to as a "1.0-volt cell") for which power supply voltage is 1.0 V will be examined with this 1.2-volt cell as a base. In order to compensate for a lack of the ON-state current Ion, it will be necessary to change the active region width W in a transfer transistor and a driver transistor to 205 nm. For reference, the expected size of each portion of this 1.0-volt cell is indicated in FIG. 7A. The area of the 1.0-volt cell is estimated at about 1.17 $\mu m \times 0.5$ $\mu m = 0.585$ $\mu m^2$.

Figure 7B:
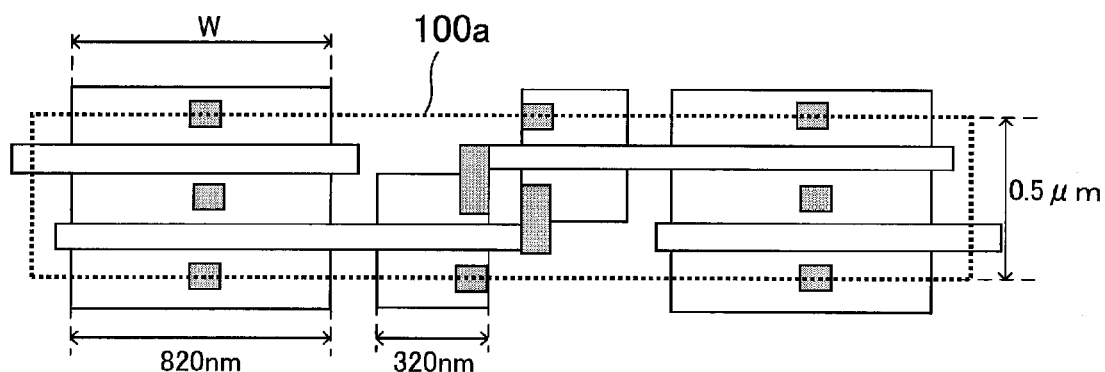

In addition, a memory cell (hereinafter referred to as a "0.5-volt cell") for which power supply voltage is 0.5 V will be examined. In order to compensate for a lack of the ON-state current Ion, it will be necessary to set the active region width W in all transistors to four times the active region width W in the 1.0-volt cell as indicated in FIGS. 7B and 8. The area of the 0.5-volt cell is estimated at about 2.88 $\mu m \times 0.5$ $\mu m = 1.44$ $\mu m^2$.

On the other hand, the DTMOS technique is known as a technique for ensuring an ON-state current Ion at a low voltage. An example of an SRAM in which the DTMOS technique is used will now be described.

Figure 9:
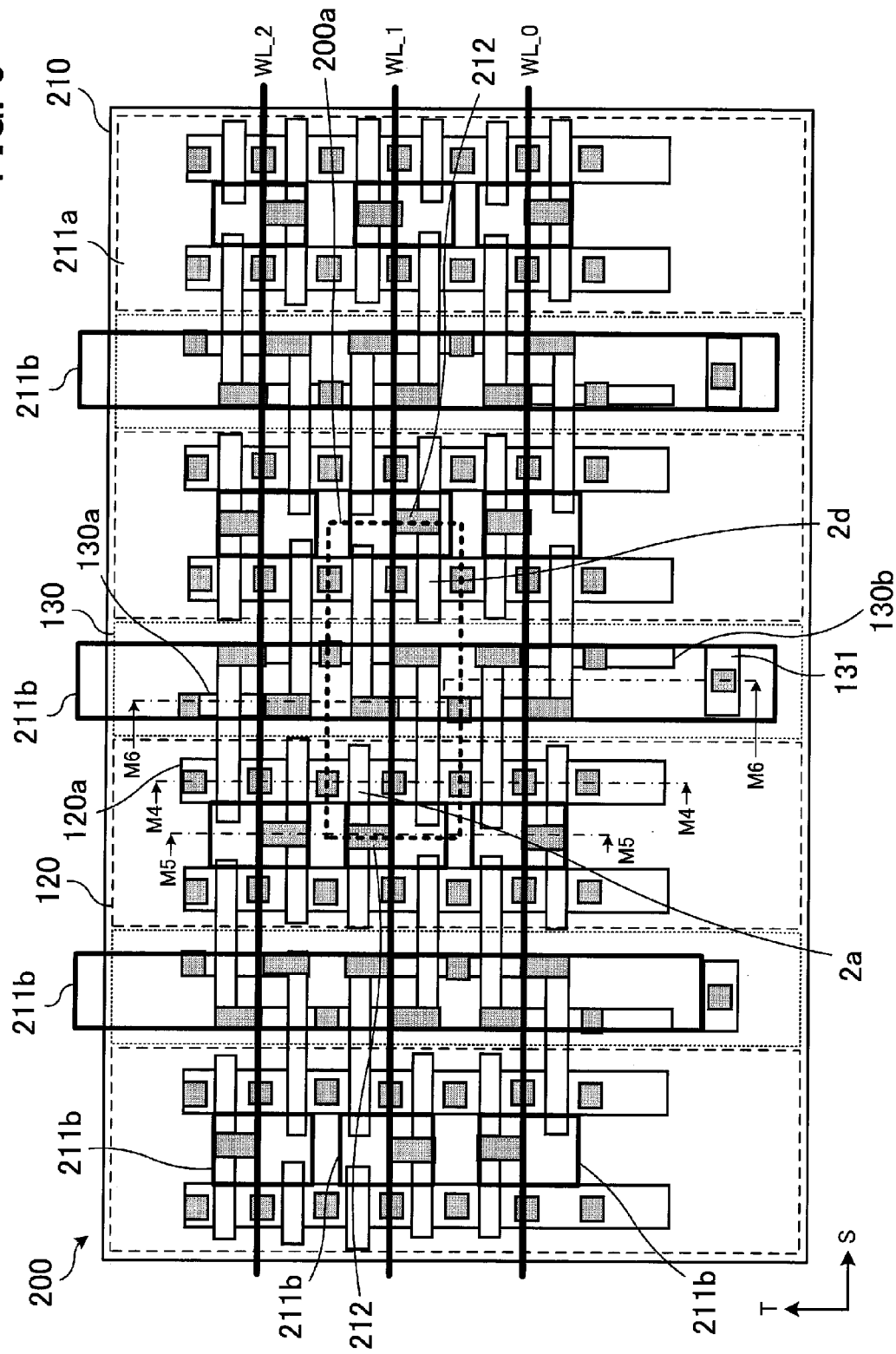
FIG. 9 is an example of an SRAM in which the DTMOS technique is used (part 1)
Figure 10A:
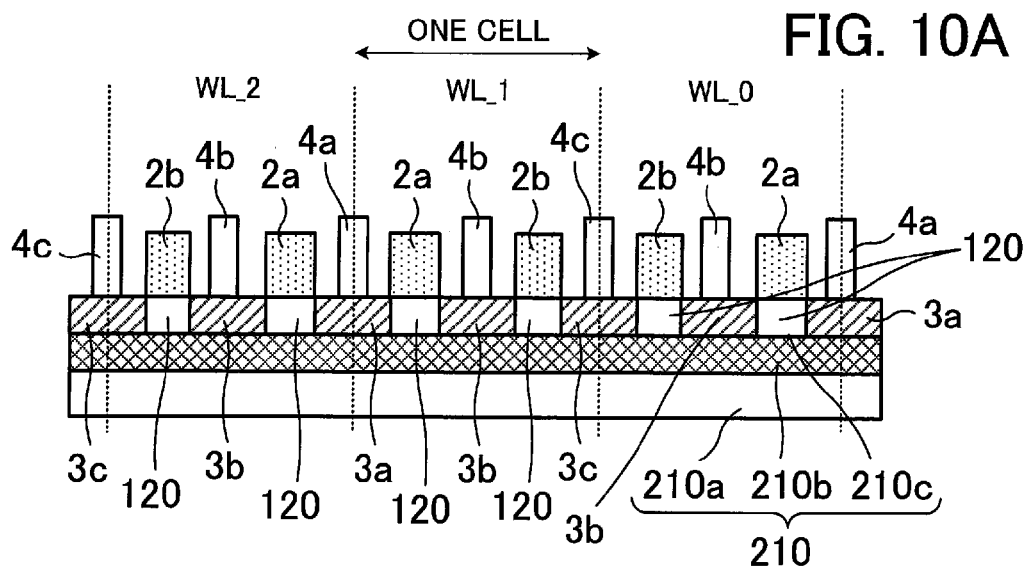
FIGS. 10A, 10B, and 10C are an example of an SRAM in which the DTMOS technique is used (part 2)
Figure 10B:
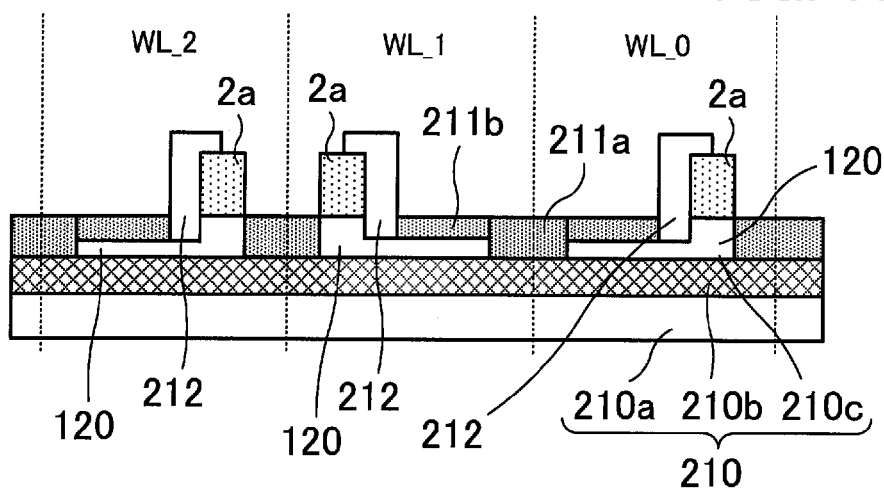
Figure 10C:
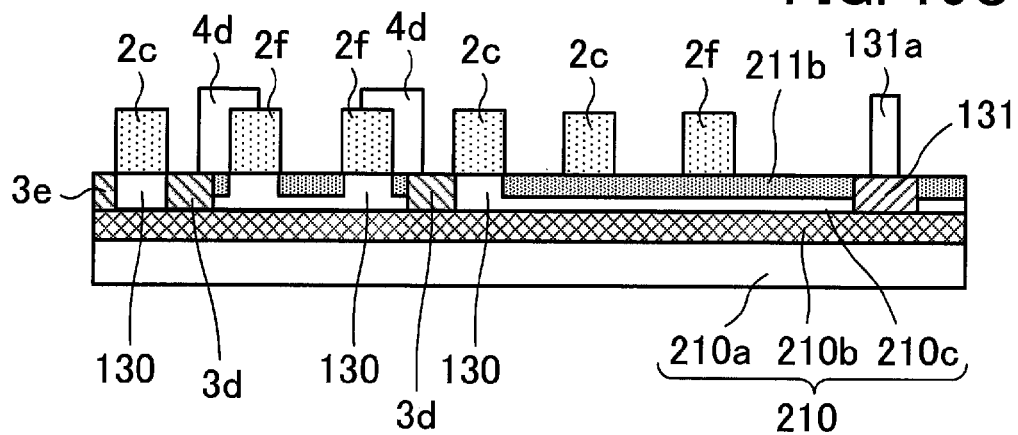

FIG. 9 and FIGS. 10A, 10B, and 10C are an example of an SRAM in which the DTMOS technique is used. FIG. 9 is a fragmentary schematic plan view of an example of an SRAM in which the DTMOS technique is used. FIG. 10A is a fragmentary schematic sectional view taken along lines M4-M4 of FIG. 9. FIG. 10B is a fragmentary schematic sectional view taken along lines M5-M5 of FIG. 9. FIG. 10C is a fragmentary schematic sectional view taken along lines M6-M6 of FIG. 9. For convenience of explanation components in FIG. 9 and FIGS. 10A, 10B, and 10C which are the same as or correspond to those included in the above SRAMs 1 and 100 are marked with the same numerals.

With an SRAM 200 including a plurality of memory cells 200a, an SOI substrate 210 having a laminated structure of a semiconductor substrate 210a, a BOX layer 210b, and a semiconductor layer 210c is used. In addition, a full trench (FT) 211a reaching the BOX layer 210b and a partial trench (PT) 211b which is shallower than the FT 211a are used as isolation layers. Furthermore, with the SRAM 200 a penetration contact electrode 212 by which a gate electrode 2a of a transfer transistor Tf1 and a p-type well region 120 in which the transfer transistor Tf1 and a driver transistor Dr1 are formed are short-circuited is used. Moreover, a penetration contact electrode 212 by which a gate electrode 2d of a transfer transistor Tf2 and a p-type well region 120 in which the transfer transistor Tf2 and a driver transistor Dr2 are formed are short-circuited is used.

FIG. 10A schematically illustrates a section along an active region 120a of the p-type well region 120. FIG. 10B schematically illustrates a section along the isolation layers (FT 211a and PT 211b) in the p-type well region 120. The penetration contact electrodes 212 are connected in part to the gate electrode 2a and the gate electrode 2d, penetrate the PTs 211b formed with the semiconductor layer 210c left between the PTs 211b and the BOX layer 210b, and reach the p-type well regions 120. A word line WL which extends in a first direction S is electrically connected to these penetration contact electrodes 212. The gate electrode 2a and the p-type well region 120 under it are short-circuited. The gate electrode 2d and the p-type well region 120 under it are short-circuited.

With the SRAM 200 a p-type well region 120 short-circuited by one word line (WL1, for example) and penetration contact electrodes 212 are electrically isolated from a p-type well region 120 short-circuited by another word line (WL 0 or WL 2, for example) and penetration contact electrodes 212. With the SRAM 200 the electrical isolation of a p-type well region 120 is performed by the BOX layer 210b of the SOI substrate 210 and an FT 211a.

As a result, a DTMOS structure in which the gate electrode 2a (word line) of the transfer transistor Tf1 and the p-type well region 120 in which the transfer transistor Tf1 and the driver transistor Dr1 are formed are short-circuited is obtained in each memory cell 200a. Similarly, a DTMOS structure in which the gate electrode 2d (word line) of the transfer transistor Tf2 and the p-type well region 120 in which the transfer transistor Tf2 and the driver transistor Dr2 are formed are short-circuited is obtained.

A load transistor Lo1 or a load transistor Lo2 formed in an n-type well region 130 does not have a DTMOS structure. In order to draw out potential of the n-type well region 130, an n-type tap region 131 over which a contact electrode 131a is formed is formed as illustrated in FIG. 10C. With the SRAM 200 the SOI substrate 210 is used, so potential of the n-type well region 130 is drawn out by the semiconductor layer 210c between the PT 211b and the BOX layer 210b.

As stated above, with the SRAM 200 a DTMOS structure is formed by the use of a penetration contact electrode 212, the SOI substrate 210, a PT 211b, and the like. By doing so, the same circuit that is realized in the above SRAM 1 and that is indicated in FIG. 4 is realized.

With the SRAM 200 a penetration contact electrode 212, the SOI substrate 210, and a PT 211b are used. However, the use of a penetration contact electrode 212, the SOI substrate 210, and a PT 211b leads to a complex production process and high production costs compared with, for example, the above SRAM 100. In order to realize the circuit indicated in FIG. 4 on the basis of the same concept that is embodied in the above SRAM 100 and the same technique that is used in the above SRAM 100 without using a penetration contact electrode 212, the SOI substrate 210, or a PT 211b, an SRAM illustrated in, for example, FIG. 11 and FIGS. 12A and 12B is possible.

Figure 11:
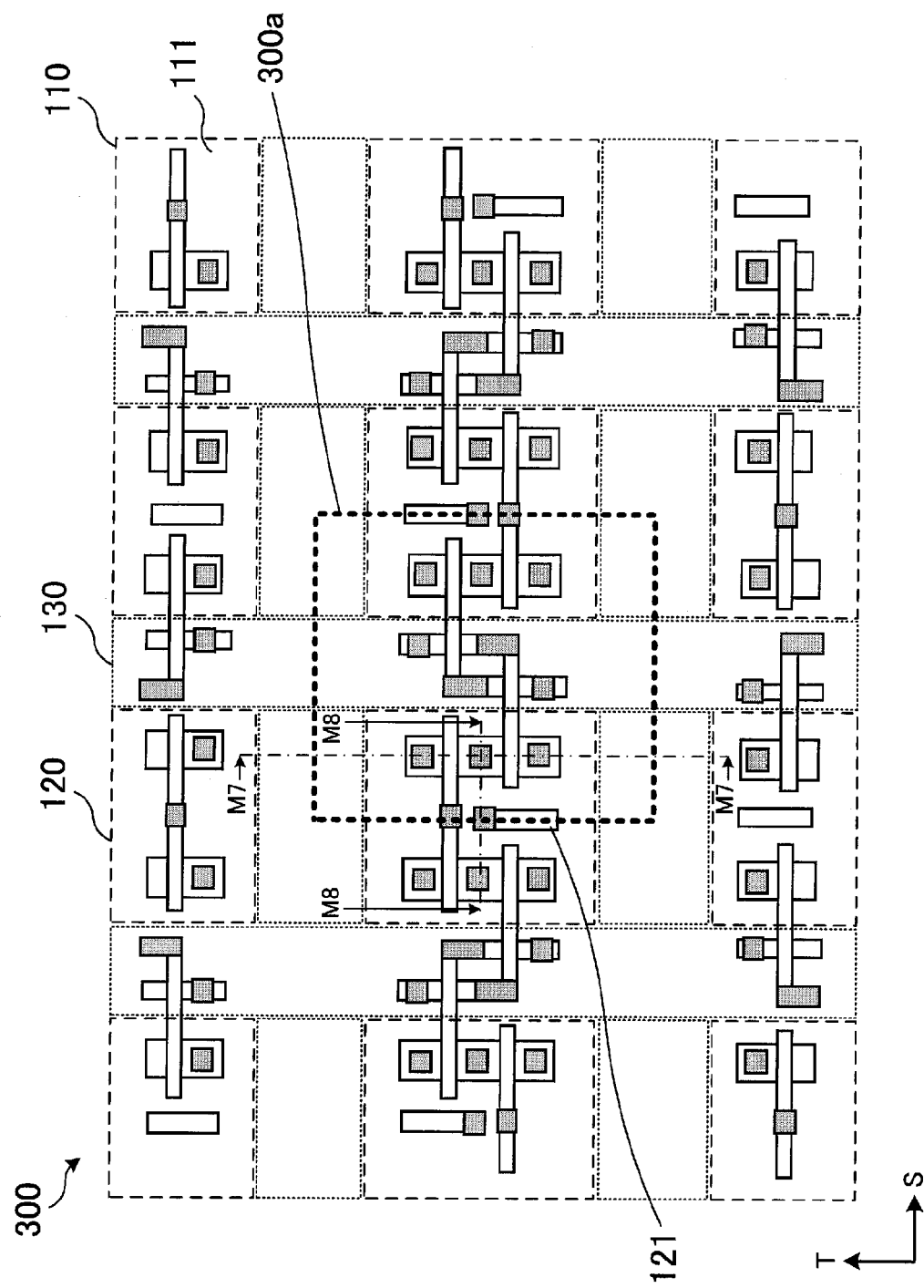
FIG. 11 is an example of an SRAM having still another structure (part 1)
Figure 12A:
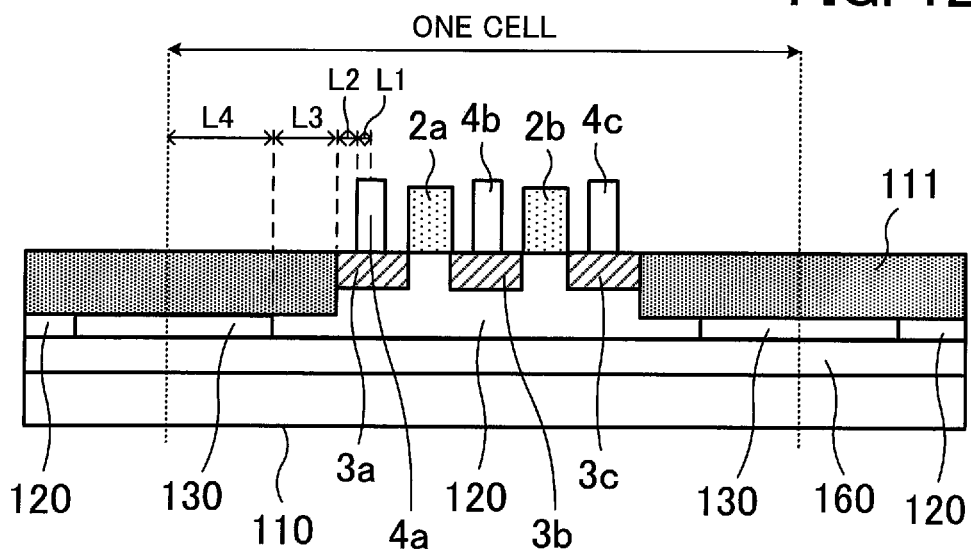
FIGS. 12A and 12B are an example of an SRAM having still another structure (part 2)
Figure 12B:
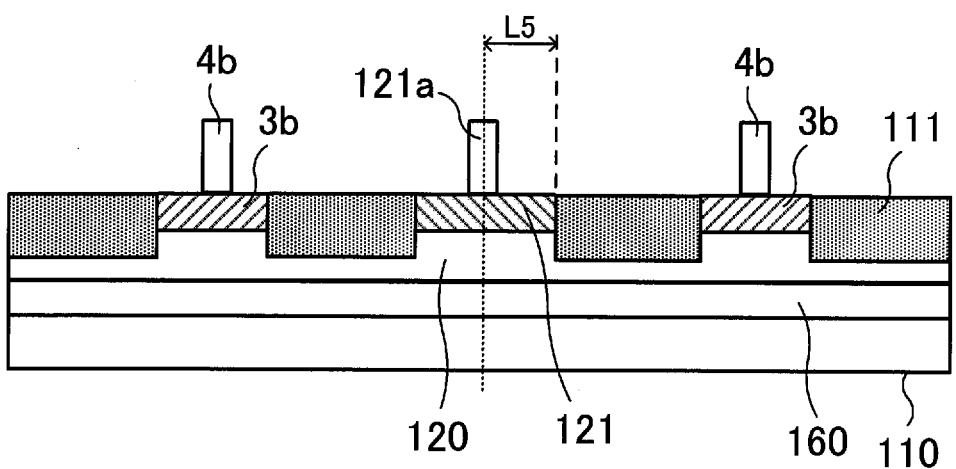

FIG. 11 and FIGS. 12A and 12B are an example of an SRAM having still another structure. FIG. 11 is a fragmentary schematic plan view of an example of an SRAM having still another structure. FIG. 12A is a fragmentary schematic sectional view taken along lines M7-M7 of FIG. 11. FIG. 12B is a fragmentary schematic sectional view taken along lines M8-M8 of FIG. 11. For convenience of explanation components in FIG. 11 and FIGS. 12A and 12B which are the same as or correspond to those included in the above SRAMs 1 and 100 are marked with the same numerals.

A word line extends in a first direction S and a bit line extends in a second direction T. An SRAM 300 includes a plurality of memory cells 300a. With the SRAM 300 an SOI substrate is not used. Accordingly, as illustrated in FIG. 12A, a p-type well region 120 short-circuited with one word line is electrically isolated from a p-type well region 120 short-circuited with another word line by an isolation layer 111, an n-type well region 130, and an n-type well region 160. A p-type tap region 121 is formed in each p-type well region 120. A p-type well region 120 and a word line are short-circuited by electrically connecting a p-type tap region 121 and the word line via a contact electrode 121a. By adopting the above structure, the circuit indicated in FIG. 4 is realized.

With the SRAM 300 having the above structure, however, a portion of a p-type well region 120 in which one of two memory cells 300a adjacent to each other in the second direction T is formed is electrically isolated from a portion of the p-type well regions 120 in which the other is formed. This leads to an increase in the area of a memory cell 300a. That is to say, in the example of FIG. 12A memory cells 300a adjacent to each other in the second direction T cannot share an n-type region 3a. As a result, the size of the memory cell 300a increases on one side by half (L1) of the length of a contact electrode 4a and the length (L2) of the n-type region 3a from the contact electrode 4a to the isolation layer 111. Furthermore, the size of the memory cell 300a increases by the length (L3) of the isolation layer 111 over the p-type well region 120 and the length (L4) of the isolation layer 111 over the n-type well region 130. These increases in the length by L1, L2, L3, and L4 take place on both sides of the memory cell 300a. In addition, as illustrated in FIG. 12B, the p-type tap region 121 is added to the p-type well region 120, so an increase in the length by L5 takes place on one side in the first direction S.

Furthermore, with the above SRAM 300 the continuity of an active region 120a is interrupted between memory cells 300a adjacent to each other in the second direction T. Source-drain width is narrow (at the portion the length of which is L2). This may cause deterioration in driving capability. Deterioration in the driving capability of an nMOS leads to a reduction in lead current.

With the SRAM 300 the above increases in the length by L1, L2, L3, L4, and L5 are as follows. For example, the total of L1, L2, L3, and L4 will be 0.49 μm (0.98 μm on both sides) and L5 will be 0.055 μm (0.11 μm on both sides). On the other hand, if a memory cell 100a in the SRAM 100 is a 1.0-volt cell as illustrated in FIG. 7A, then the area of the memory cell 100a is estimated at about 1.17 μm×0.5 μm=0.585 μm². If a memory cell 100a in the SRAM 100 is a 0.5-volt cell as illustrated in FIG. 7B, then the area of the memory cell 100a is estimated at about 2.88 μm×0.5 μm=1.44 μm². The area of a memory cell 300a in the SRAM 300 is estimated at about (1.17 μm+0.11 μm)×(0.5 μm+0.98 μm)=1.8944 μm² with L1, L2, L3, L4, and L5 taken into consideration. Compared with a case where a memory cell 300a of the SRAM 300 is adopted, the adoption of a 0.5-volt cell can make an increase in the area of a memory cell small. According to these calculation results, an increase in the area of a memory cell 300a of the SRAM 300 is comparatively large.

With the SRAM 1 according to the above first embodiment, on the other hand, the circuit indicated in FIG. 4 can be realized. In this case, a penetration contact electrode, an SOI substrate, or a PT is not used. Furthermore, an increase in the area of a memory cell can be controlled and operating voltage can be decreased (decrease in voltage).

With the SRAM 1, as illustrated in FIGS. 1, 2, and 3A, the gate electrode 2a of the transfer transistor Tf1 in each memory cell 1a arranged in the second direction T is electrically connected via the contact electrode 4m to the word line WL1 which extends in the second direction T. The word line WL1 is electrically connected to the p-type tap region 21 of the p-type well region 20 in which the transfer transistor Tf1 and the driver transistor Dr1 are formed. As a result, the gate electrode 2a of the transfer transistor Tf1 (word line WL1) and the p-type well region 20 in which the transfer transistor Tf1 and the driver transistor Dr1 are formed are short-circuited in each memory cell 1a arranged in the second direction T (DTMOS).

Similarly, with the SRAM 1 the gate electrode 2d of the transfer transistor Tf2 in each memory cell 1a arranged in the second direction T is electrically connected via the contact electrode 4n to the word line WL2. The word line WL2 is electrically connected to the p-type tap region 41 of the p-type well region 40 in which the transfer transistor Tf2 and the driver transistor Dr2 are formed. As a result, the gate electrode 2d of the transfer transistor Tf2 (word line WL2) and the p-type well region 40 in which the transfer transistor Tf2 and the driver transistor Dr2 are formed are short-circuited in each memory cell 1a arranged in the second direction T (DTMOS).

The adoption of the above DTMOS structure makes it possible to decrease operating voltage and ensure an ON-state current Ion.

With the SRAM 1 memory cells 1a adjacent to each other in the second direction T cannot share the n-type region 3a electrically connected via the contact electrode 4a to the bit line BL which extends in the first direction S. Accordingly, an n-type region 3a is formed in each of memory cells 1a adjacent to each other in the second direction T. These n-type regions 3a are electrically isolated from each other by the p-type active region 20a under the dummy gate electrode 2 formed between the memory cells 1a adjacent to each other in the second direction T. By using the dummy gate electrode 2, the continuity of the p-type active region 20a is preserved and the n-type regions 3a in the memory cells 1a adjacent to each other in the second direction T are electrically isolated from each other.

Similarly, with the SRAM 1 memory cells 1a adjacent to each other in the second direction T cannot share the n-type region 3f electrically connected via the contact electrode 4f to the bit line XBL which extends in the first direction S. Accordingly, an n-type region 3f is formed in each of memory cells 1a adjacent to each other in the second direction T. These n-type regions 3f are electrically isolated from each other by the p-type active region 40a under the dummy gate electrode 2 formed between the memory cells 1a adjacent to each other in the second direction T. By using the dummy gate electrode 2, the continuity of the p-type active region 40a is preserved and the n-type regions 3f in the memory cells 1a adjacent to each other in the second direction T are electrically isolated from each other.

By forming the dummy gate electrode 2 at the boundary Ba between the memory cells 1a adjacent to each other in the second direction T, the length in the second direction T of the memory cell 1a increases by, for example, 0.12 μm on one side (by 0.24 μm on both sides) compared with the 1.0-volt cell (FIG. 7A).

Furthermore, with the SRAM 1 p-type well regions 20 or p-type well regions 40 in memory cells 1a adjacent to each other in the first direction S are electrically isolated from each other by the isolation layer 11, the n-type well region 50, and the n-type well region 60. By forming the n-type well region 50, the length in the first direction S of the memory cell 1a increases by, for example, 0.235 μm on one side (by 0.47 μm on both sides) compared with the 1.0-volt cell.

In addition, with the SRAM 1 transfer transistors Tf1 in memory cells 1a adjacent to each other in the first direction S cannot share a gate electrode 2a. Transfer transistors Tf2 in memory cells 1a adjacent to each other in the first direction S cannot share a gate electrode 2d. Accordingly, division is made. This division is made by the use of the width of an n-type well region 50 formed between memory cells 1a adjacent to each other in the first direction S.

For example, if the above increases in the length of the memory cell 1a of the SRAM 1 take place compared with the 1.0-volt cell, then the area of the memory cell 1a is estimated at about $(1.17\,\mu m + 0.47\,\mu m) \times (0.5\,\mu m + 0.24\,\mu m) = 1.2136\,\mu m^2$. It is possible to make the area of the memory cell 1a of the SRAM 1 smaller than that of the 0.5-volt cell ($1.44\,\mu m^2$) indicated in FIG. 7B.

As has been described, with the SRAM 1 according to the first embodiment a penetration contact electrode, an SOI substrate, or a PT is not used. The adoption of the SRAM 1 according to the first embodiment makes it possible to control an increase in the area of a memory cell and realize a low operating voltage (0.5 V, for example).

The SRAM 1 having the above structure can be fabricated by, for example, the following method. An example of a method for fabricating the above SRAM 1 will be described with reference to FIGS. 13 through 23.

Figure 13A:
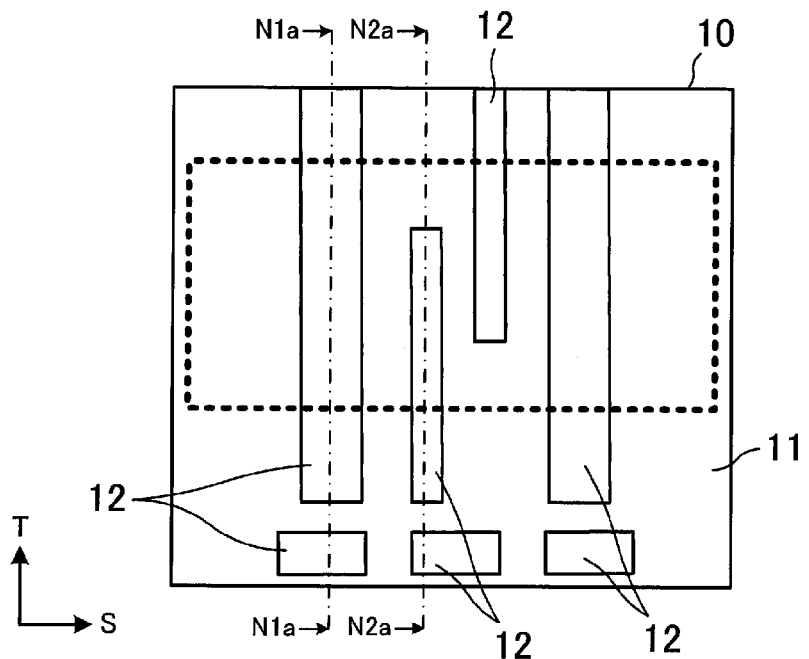
FIGS. 13A, 13B, and 13C are views for describing an example of an isolation layer and sacrificial oxide layer formation step in the first embodiment.
Figure 13B:
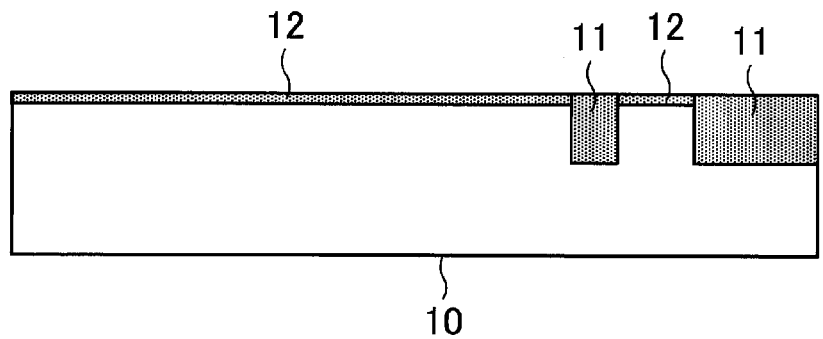
Figure 13C:
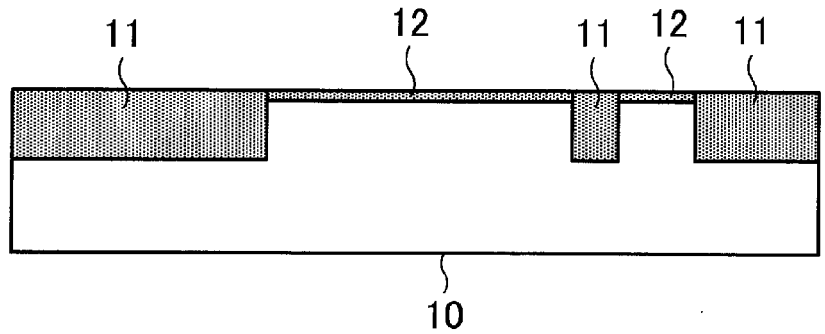

FIGS. 13A, 13B, and 13C are views for describing an example of an isolation layer and sacrificial oxide layer formation step in the first embodiment. FIG. 13A is a fragmentary schematic plan view of an example of an isolation layer and sacrificial oxide layer formation step in the first embodiment. FIG. 13B is a fragmentary schematic sectional view taken along lines N1a-N1a of FIG. 13A. FIG. 13C is a fragmentary schematic sectional view taken along lines N2a-N2a of FIG. 13A.

As illustrated in FIGS. 13A, 13B, and 13C, first the isolation layer 11 and a sacrificial oxide layer 12 are formed in the p-type semiconductor substrate 10. The isolation layer 11 is formed by, for example, an STI (Shallow Trench Isolation) method to a depth of 300 nm from the surface of the p-type semiconductor substrate 10. By forming the isolation layer 11, active regions in which nMOSes and pMOSes of the SRAM 1 are formed and tap regions are defined. The sacrificial oxide layer 12 is formed by, for example, a thermal oxidation method in a surface of the p-type semiconductor substrate 10 defined by the isolation layer 11.

In this step, the sacrificial oxide layer 12 may be formed in the surface of the p-type semiconductor substrate 10 after the formation of the isolation layer 11 in the p-type semiconductor substrate 10. Alternatively, the isolation layer 11 may be formed after the formation of the sacrificial oxide layer 12 in the surface of the p-type semiconductor substrate 10.

Figure 14A:
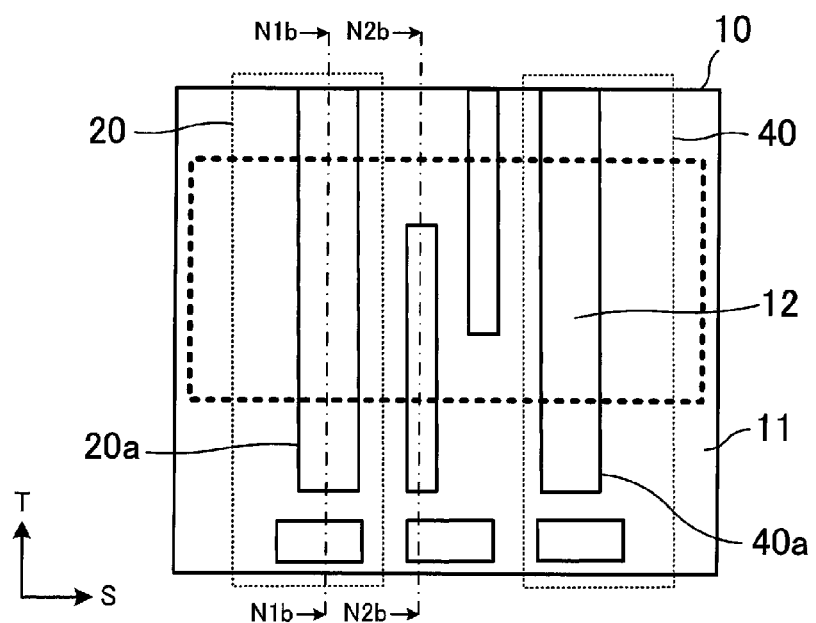
FIGS. 14A, 14B, and 14C are views for describing an example of a p-type well region formation step in the first embodiment.
Figure 14B:
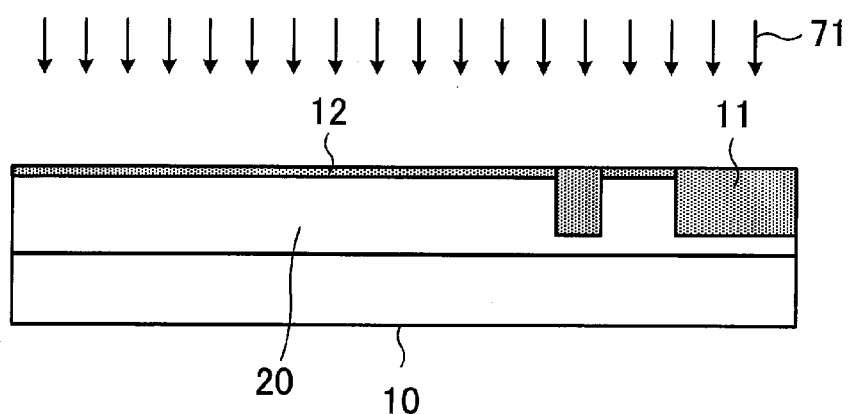
Figure 14C:
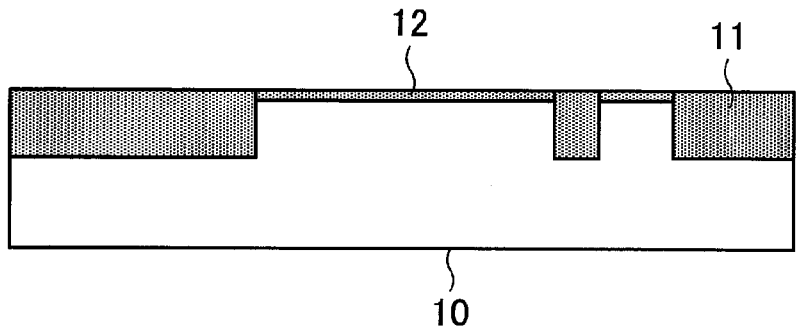

FIGS. 14A, 14B, and 14C are views for describing an example of a p-type well region formation step in the first embodiment. FIG. 14A is a fragmentary schematic plan view of an example of a p-type well region formation step in the first embodiment. FIG. 14B is a fragmentary schematic sectional view taken along lines N1b-N1b of FIG. 14A. FIG. 14C is a fragmentary schematic sectional view taken along lines N2b-N2b of FIG. 14A.

After the formation of the isolation layer 11 and the sacrificial oxide layer 12, as illustrated in FIGS. 14A, 14B, and 14C, the p-type well region 20 and the p-type well region 40 are formed. The p-type well region 20 and the p-type well region 40 are formed by introducing p-type impurities, such as boron, 71 into regions in which the nMOSes (transfer transistors and the driver transistors) are to be formed and nMOS tap regions by the use of a photolithography technique and an ion implantation technique (FIGS. 14A and 14B). The p-type impurities 71 are introduced through the sacrificial oxide layer 12 into the semiconductor substrate 10 and are then diffused and activated by anneal performed in this step or a later step.

The p-type active region 20a, the p-type active region 40a, and the p-type tap regions 21 and 41 described later are formed in the regions in the semiconductor substrate 10 which are defined by the isolation layer 11 and into which the p-type impurities 71 are introduced.

After the ion implantation of the p-type impurities 71, ion implantation for adjusting threshold voltage of the nMOSes (what is called channel implantation) may also be performed. The ion implantation of the p-type impurities 71 may also be utilized for nMOS channel implantation.

Figure 15A:
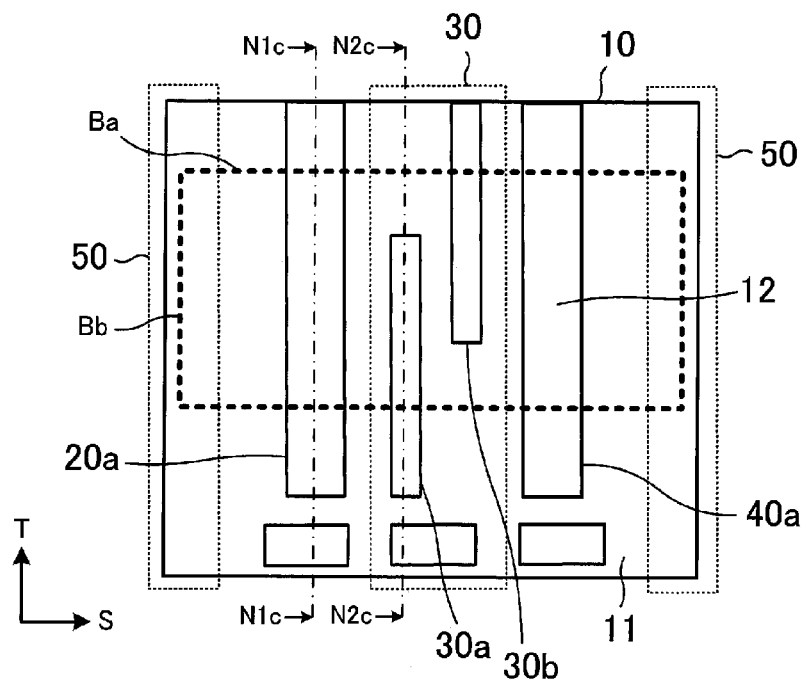
FIGS. 15A, 15B, and 15C are views for describing an example of an n-type well region formation step in the first embodiment.
Figure 15B:
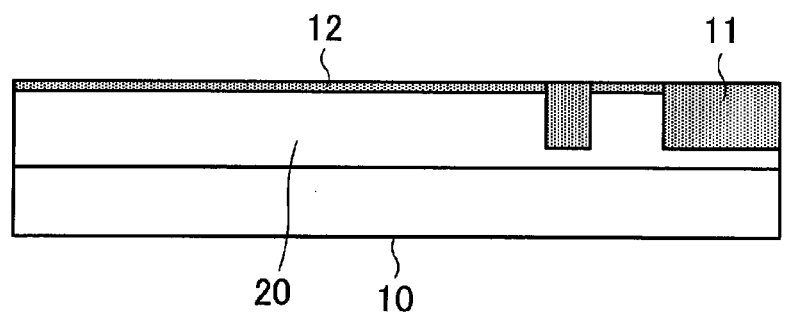
Figure 15C:
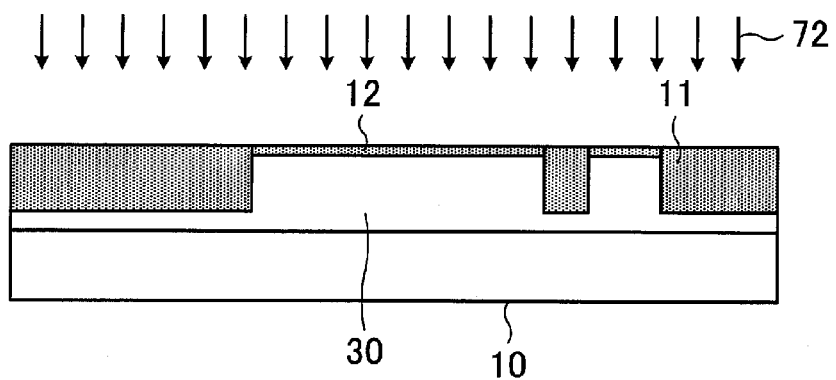

FIGS. 15A, 15B, and 15C are views for describing an example of an n-type well region formation step in the first embodiment. FIG. 15A is a fragmentary schematic plan view of an example of an n-type well region formation step in the first embodiment. FIG. 15B is a fragmentary schematic sectional view taken along lines N1c-N1c of FIG. 15A. FIG. 15C is a fragmentary schematic sectional view taken along lines N2c-N2c of FIG. 15A.

After the formation of the p-type well region 20 and the p-type well region 40, as illustrated in FIGS. 15A, 15B, and 15C, the n-type well region 30 and the n-type well region 50 are formed. The n-type well region 30 is formed by introducing n-type impurities, such as phosphorus or arsenic, 72 into a region in which the pMOSes (load transistors) are to be formed and a pMOS tap region by the use of the photolithography technique and the ion implantation technique (FIGS. 15A and 15C). The n-type well region 50 is formed by introducing the n-type impurities 72 into a region including the boundary Bb between memory cells 1a adjacent to each other in the first direction S (FIGS. 15A and 15C). The n-type impurities 72 are introduced through the sacrificial oxide layer 12 into the semiconductor substrate 10 and are then diffused and activated by anneal performed in this step or a later step.

The n-type active region 30a, the n-type active region 30b, and the n-type tap region 31 described later are formed in the regions in the semiconductor substrate 10 which are defined by the isolation layer 11 and into which the n-type impurities 72 are introduced.

After the ion implantation of the n-type impurities 72, ion implantation for adjusting threshold voltage of the pMOSes (what is called channel implantation) may also be performed. The ion implantation of the n-type impurities 72 may also be utilized for pMOS channel implantation.

Figure 16A:
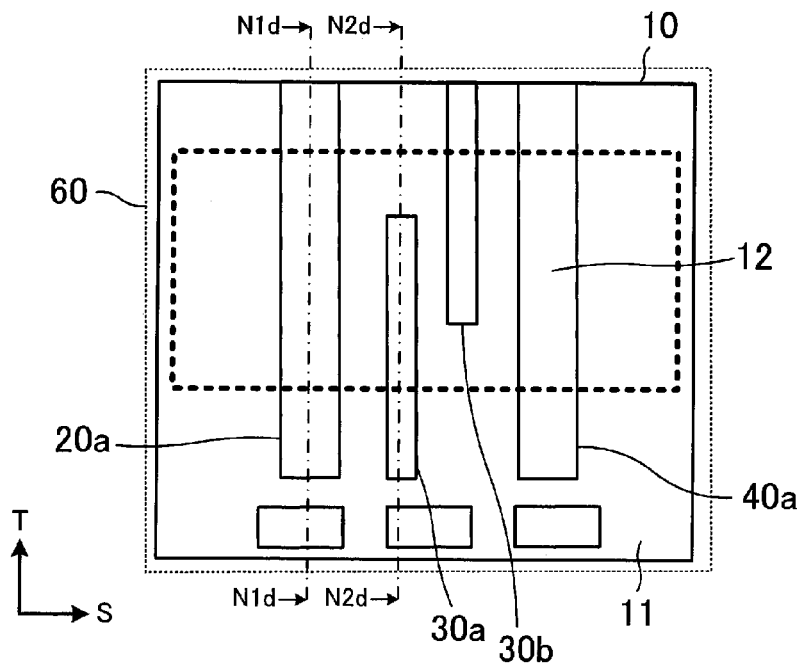
FIGS. 16A, 16B, and 16C are views for describing an example of a deep n-type well region formation step in the first embodiment.
Figure 16B:
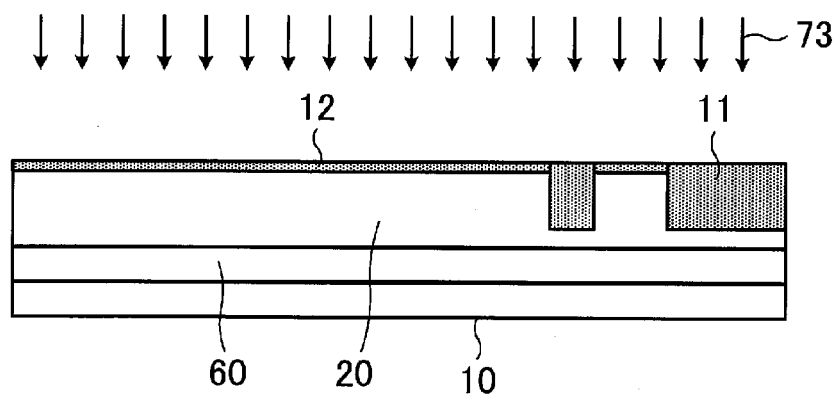
Figure 16C:
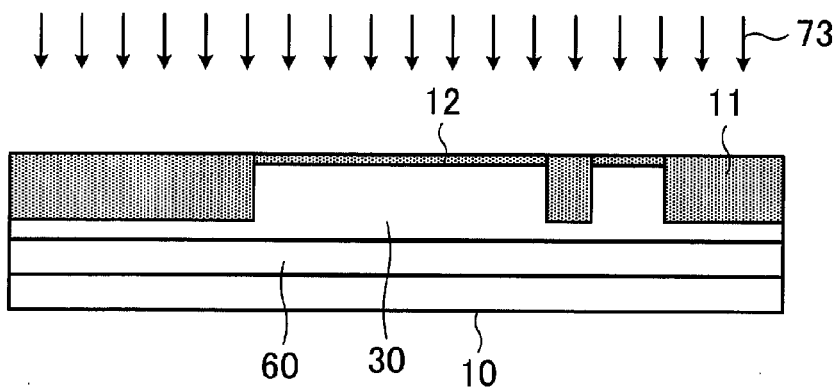

FIGS. 16A, 16B, and 16C are views for describing an example of a deep n-type well region formation step in the first embodiment. FIG. 16A is a fragmentary schematic plan view of an example of a deep n-type well region formation step in the first embodiment. FIG. 16B is a fragmentary schematic sectional view taken along lines N1d-N1d of FIG. 16A. FIG. 16C is a fragmentary schematic sectional view taken along lines N2d-N2d of FIG. 16A.

After the formation of the n-type well region 30 and the n-type well region 50, as illustrated in FIGS. 16A, 16B, and 16C, the n-type well region (deep n-type well region) 60 is formed. The n-type well region 60 is formed by introducing n-type impurities, such as phosphorus or arsenic, 73 into a region in which the SRAM is to be formed by the use of the photolithography technique and the ion implantation technique (FIGS. 16A, 16B, and 16C). The n-type impurities 73 are introduced through the sacrificial oxide layer 12 into a region which is deeper than the p-type well region 20, the p-type well region 40, the n-type well region 30, and the n-type well region 50 formed in advance in the semiconductor substrate 10. After that, the introduced n-type impurities 73 are diffused and activated by anneal performed in this step or a later step.

Figure 17A:
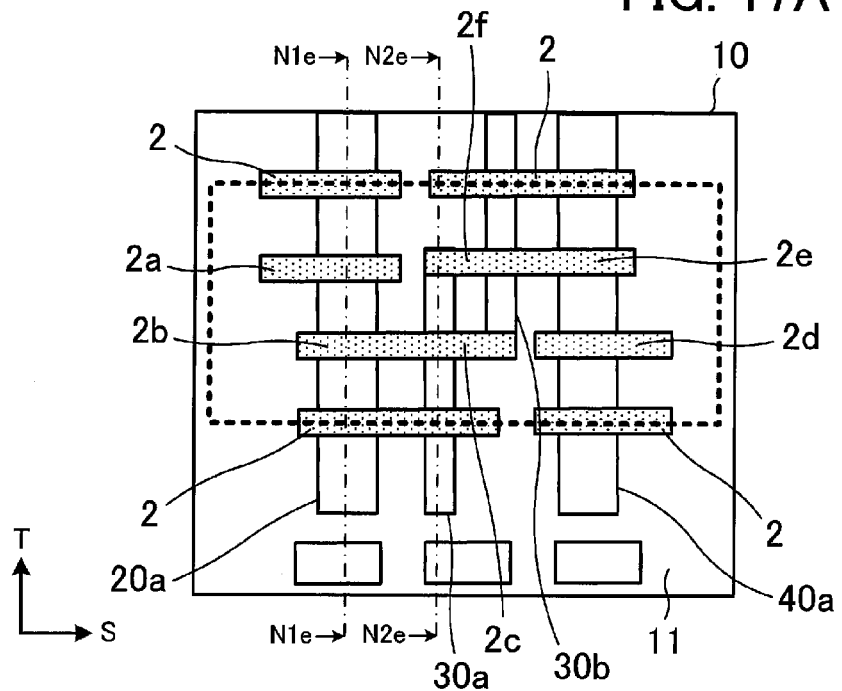
FIGS. 17A, 17B, and 17C are views for describing an example of a gate oxide film and gate electrode formation step in the first embodiment.
Figure 17B:
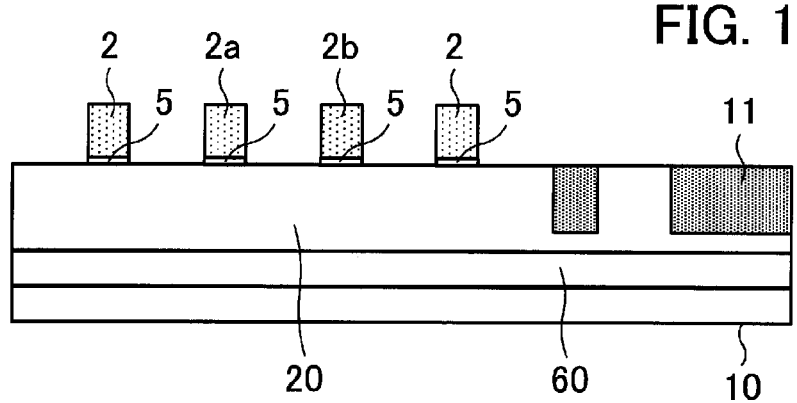
Figure 17C:
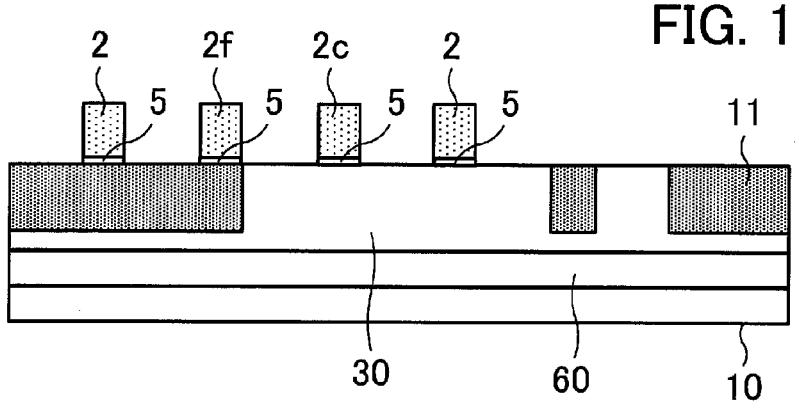

FIGS. 17A, 17B, and 17C are views for describing an example of a gate oxide film and gate electrode formation step in the first embodiment. FIG. 17A is a fragmentary schematic plan view of an example of a gate oxide film and gate electrode formation step in the first embodiment. FIG. 17B is a fragmentary schematic sectional view taken along lines N1e-N1e of FIG. 17A. FIG. 17C is a fragmentary schematic sectional view taken along lines N2e-N2e of FIG. 17A.

After the formation of the n-type well region 60, as illustrated in FIGS. 17A, 17B, and 17C, a gate oxide film 5, the gate electrodes 2a through 2f, and the dummy gate electrodes 2 are formed. For example, the gate oxide film 5, the gate electrodes 2a through 2f, and the dummy gate electrodes 2 are formed in the following way. After the sacrificial oxide layer 12 is removed, an oxide film is formed over the semiconductor substrate 10. Polycrystalline silicon is formed over the oxide film and the photolithography technique and an etching technique are used. The gate oxide film 5, the gate electrodes 2a through 2f, and the dummy gate electrodes 2 are formed so that their height from the surface of the semiconductor substrate 10 will be, for example, 100 nm.

Figure 18A:
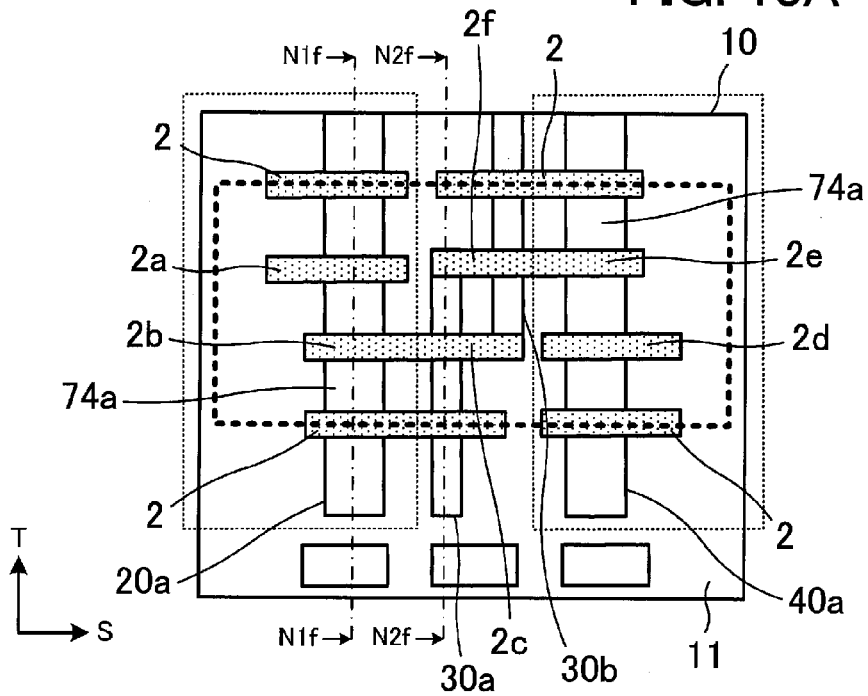
FIGS. 18A, 18B, and 18C are views for describing an example of an n-type extension region and p-type halo region formation step in the first embodiment.
Figure 18B:
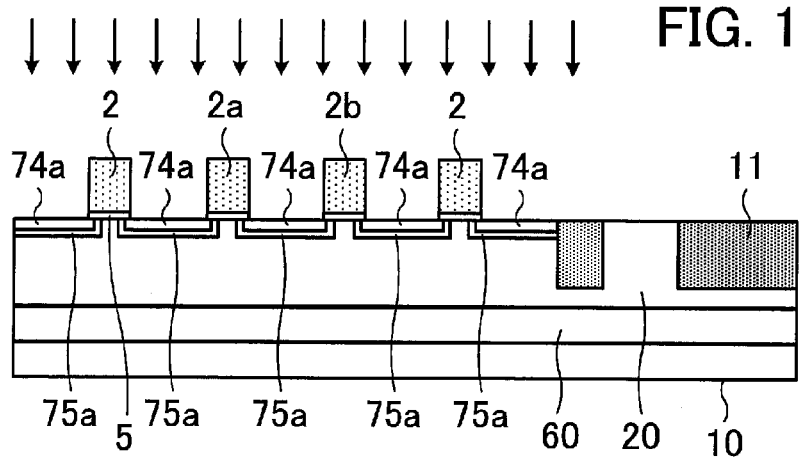
Figure 18C:
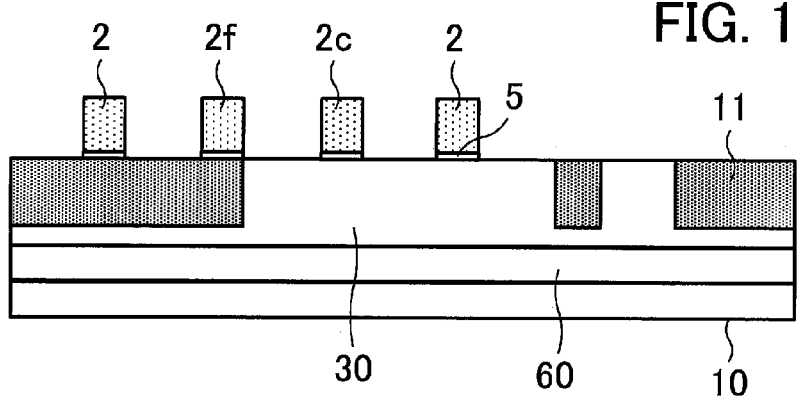

FIGS. 18A, 18B, and 18C are views for describing an example of an n-type extension region and p-type halo region formation step in the first embodiment. FIG. 18A is a fragmentary schematic plan view of an example of an n-type extension region and p-type halo region formation step in the first embodiment. FIG. 18B is a fragmentary schematic sectional view taken along lines N1f-N1f of FIG. 18A. FIG. 18C is a fragmentary schematic sectional view taken along lines N2f-N2f of FIG. 18A.

After the formation of the gate oxide film 5, the gate electrodes 2a through 2f, and the dummy gate electrodes 2, as illustrated in FIGS. 18A, 18B, and 18C, n-type extension regions 74a and p-type halo regions 75a are formed. The n-type extension regions 74a and the p-type halo regions 75a are formed by the use of the photolithography technique and the ion implantation technique. The n-type extension regions 74a are formed on both sides of the gate electrodes 2a, 2b, 2d, and 2e of the nMOSes and dummy gate electrodes 2 in the regions (active region 20a and the active region 40a) of the semiconductor substrate 10 in which the nMOSes are to be formed (FIGS. 18A and 18B). The p-type halo regions 75a are formed in regions deeper than the n-type extension regions 74a so that they will surround the n-type extension regions 74a (FIG. 18B). Impurities introduced into the n-type extension regions 74a and the p-type halo regions 75a are diffused and activated by anneal performed in this step or a later step.

Figure 19A:
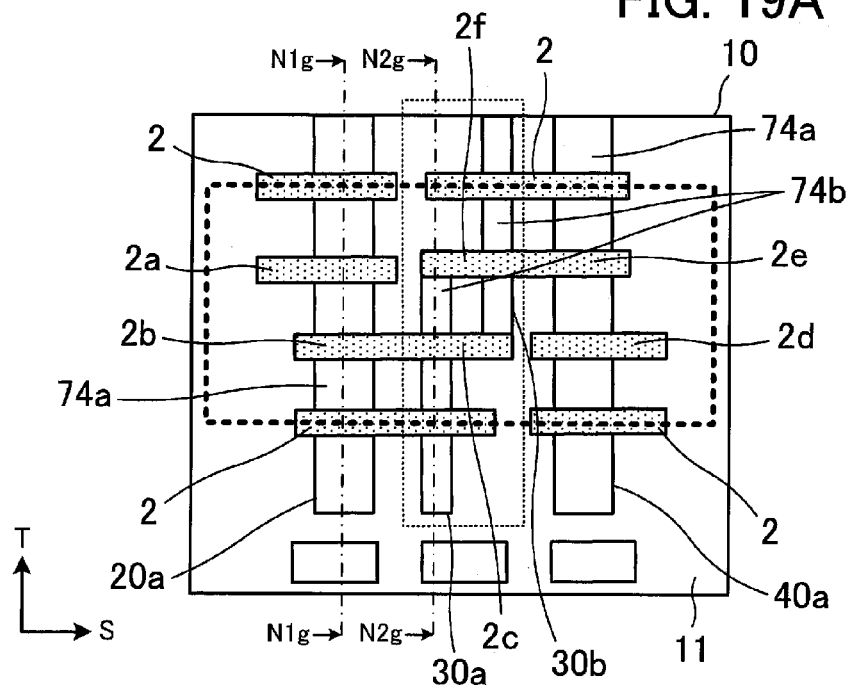
FIGS. 19A, 19B, and 19C are views for describing an example of a p-type extension region and n-type halo region formation step in the first embodiment.
Figure 19B:
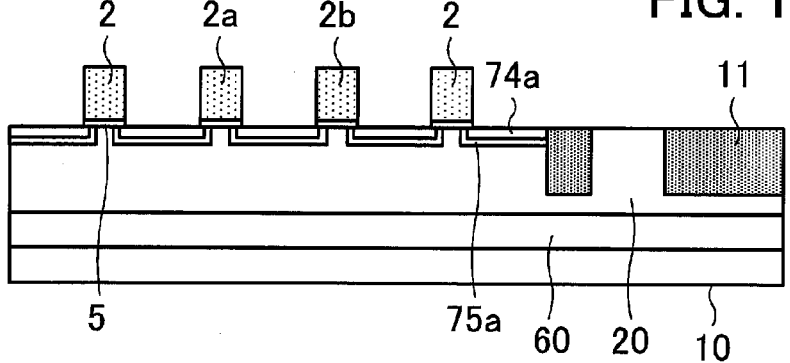
Figure 19C:
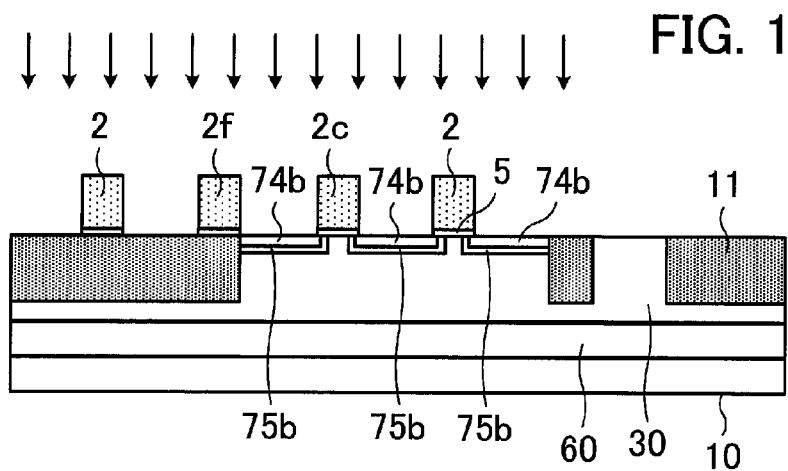

FIGS. 19A, 19B, and 19C are views for describing an example of a p-type extension region and n-type halo region formation step in the first embodiment. FIG. 19A is a fragmentary schematic plan view of an example of a p-type extension region and n-type halo region formation step in the first embodiment. FIG. 19B is a fragmentary schematic sectional view taken along lines N1g-N1g of FIG. 19A. FIG. 19C is a fragmentary schematic sectional view taken along lines N2g-N2g of FIG. 19A.

As illustrated in FIGS. 19A, 19B, and 19C, p-type extension regions 74b and n-type halo regions 75b are formed. This is the same with FIGS. 18A, 18B, and 18C. The p-type extension regions 74b and the n-type halo regions 75b are formed by the use of the photolithography technique and the ion implantation technique. The p-type extension regions 74b are formed on both sides of the gate electrodes 2c and 2f of the pMOSes and a dummy gate electrode 2 in the regions (active region 30a and the active region 30b) of the semiconductor substrate 10 in which the pMOSes are to be formed (FIGS. 19A and 19C). The n-type halo regions 75b are formed in regions deeper than the p-type extension regions 74b so that they will surround the p-type extension regions 74b (FIG. 19C). Impurities introduced into the p-type extension regions 74b and the n-type halo regions 75b are diffused and activated by anneal performed in this step or a later step.

Figure 20A:
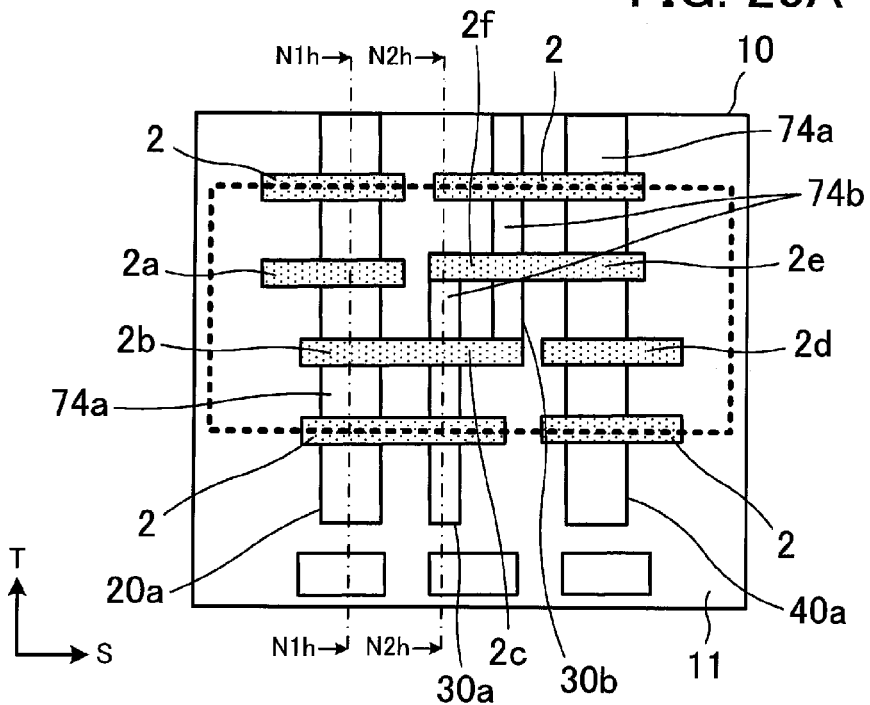
FIGS. 20A, 20B, and 20C are views for describing an example of a sidewall spacer formation step in the first embodiment.
Figure 20B:
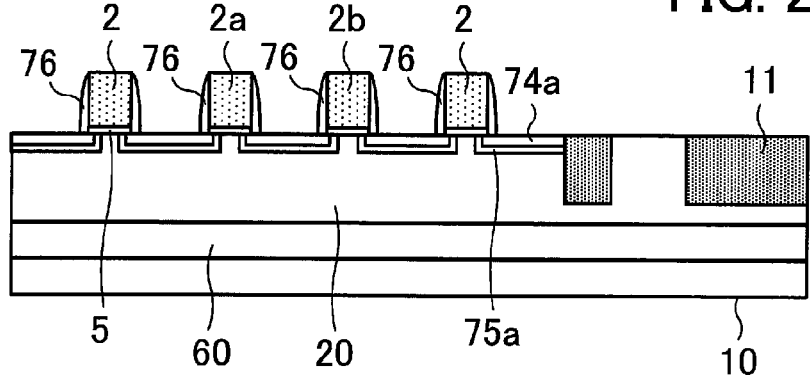
Figure 20C:
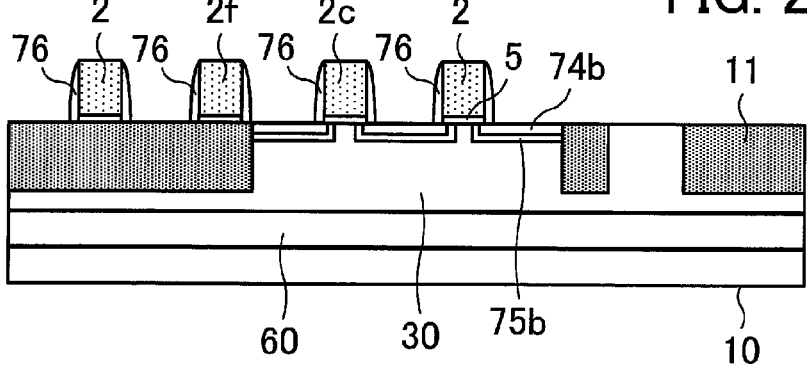

FIGS. 20A, 20B, and 20C are views for describing an example of a sidewall spacer formation step in the first embodiment. FIG. 20A is a fragmentary schematic plan view of an example of a sidewall spacer formation step in the first embodiment. FIG. 20B is a fragmentary schematic sectional view taken along lines N1h-N1h of FIG. 20A. FIG. 20C is a fragmentary schematic sectional view taken along lines N2h-N2h of FIG. 20A.

After the formation of the n-type extension regions 74a, the p-type extension regions 74b, and the like, as illustrated in FIGS. 20B and 20C, sidewall spacers 76 are formed on sidewalls of the gate electrodes 2a through 2f and the dummy gate electrodes 2 (not illustrated in FIG. 20A). The sidewall spacers 76 are formed by forming one or more insulating layers over the region of the semiconductor substrate 10 (or the isolation layer 11) in which the SRAM 1 is to be formed and etching back them.

Figure 21A:
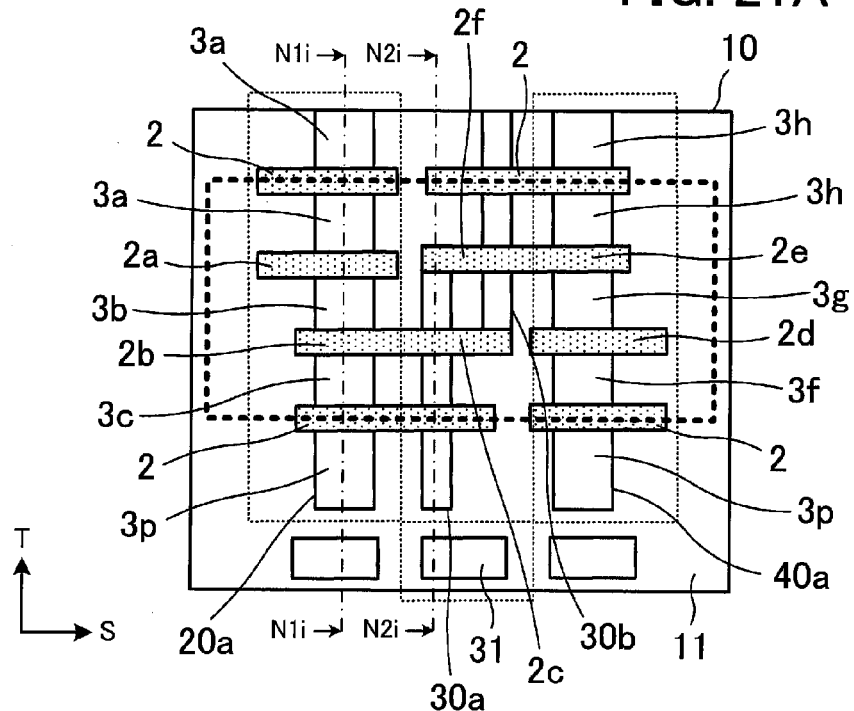
FIGS. 21A, 21B, and 21C are views for describing an example of an nMOS source-drain region formation step in the first embodiment.
Figure 21B:
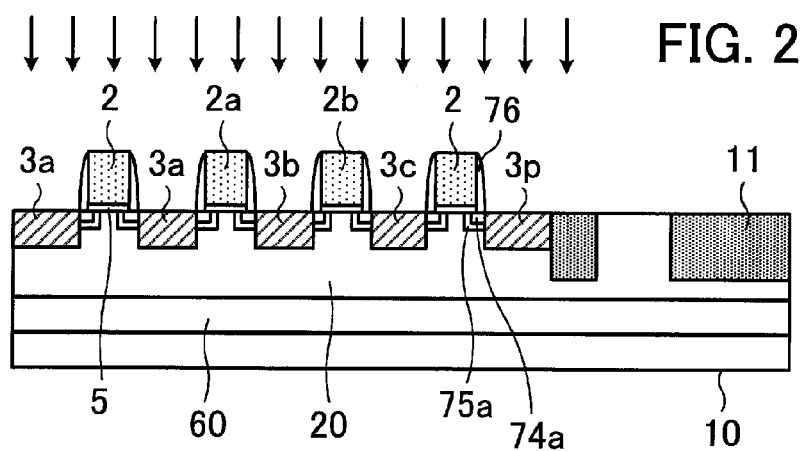
Figure 21C:
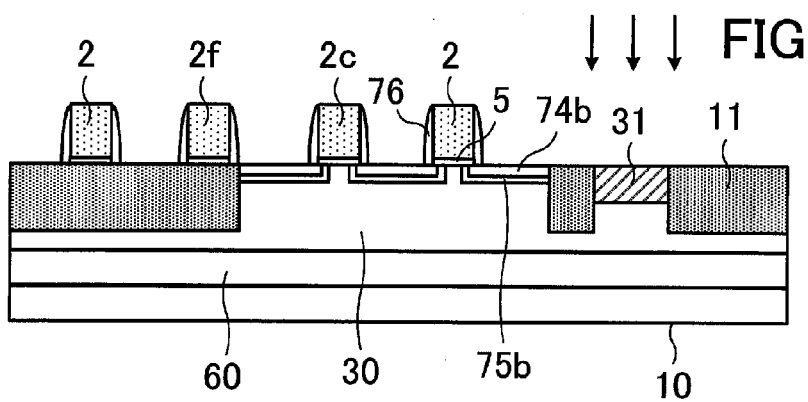

FIGS. 21A, 21B, and 21C are views for describing an example of an nMOS source-drain region formation step in the first embodiment. FIG. 21A is a fragmentary schematic plan view of an example of an nMOS source-drain region formation step in the first embodiment. FIG. 21B is a fragmentary schematic sectional view taken along lines N1i-N1i of FIG. 21A. FIG. 21C is a fragmentary schematic sectional view taken along lines N2i-N2i of FIG. 21A.

After the formation of the sidewall spacers 76, as illustrated in FIGS. 21A, 21B, and 21C, the n-type regions 3a, 3b, 3c, 3f, 3g, 3h, and 3p used as source-drain regions of the nMOSes and the n-type tap region 31 of the pMOSes are formed. The n-type regions 3a, 3b, 3c, 3f, 3g, 3h, and 3p and the n-type tap region 31 are formed by the use of the photolithography technique and the ion implantation technique. The n-type regions 3a, 3b, 3c, 3f, 3g, 3h, and 3p are formed in the regions (active region 20a and the active region 40a) of the semiconductor substrate 10 in which the nMOSes are to be formed with the gate electrodes 2a, 2b, 2d, and 2e of the nMOSes and dummy gate electrodes 2 as a mask (FIGS. 21A and 21B). Impurities introduced at the time of forming the n-type regions 3a, 3b, 3c, 3f, 3g, 3h, and 3p are also introduced into a region of the semiconductor substrate 10 in which the n-type tap region 31 is to be formed. By doing so, the n-type tap region 31, together with the n-type regions 3a, 3b, 3c, 3f, 3g, 3h, and 3p, is formed (FIGS. 21A and 21C).

Figure 22A:
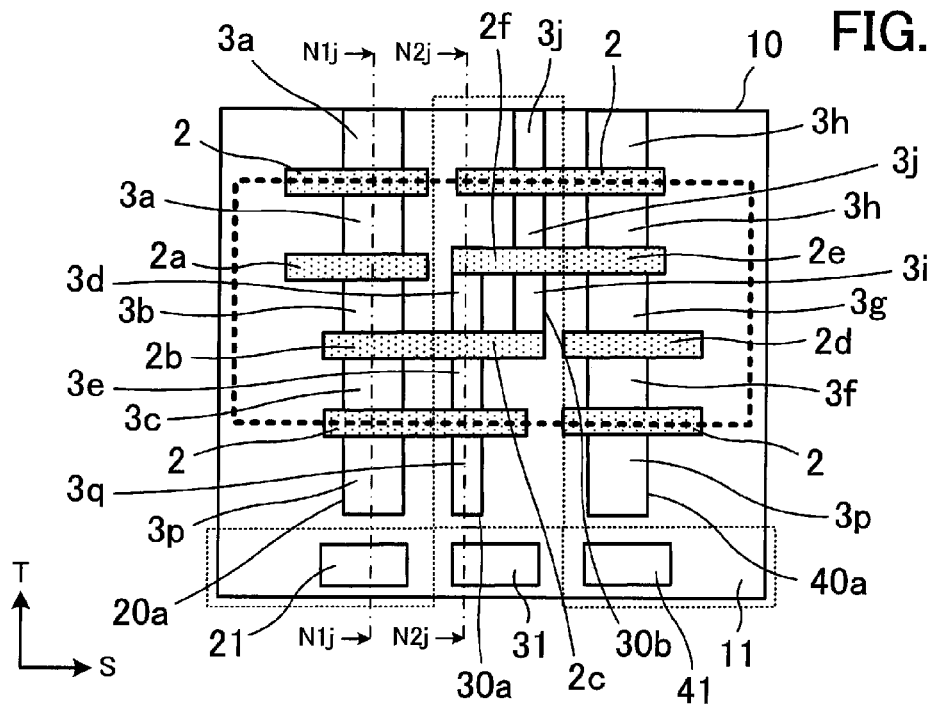
FIGS. 22A, 22B, and 22C are views for describing an example of a pMOS source-drain region formation step in the first embodiment.
Figure 22B:
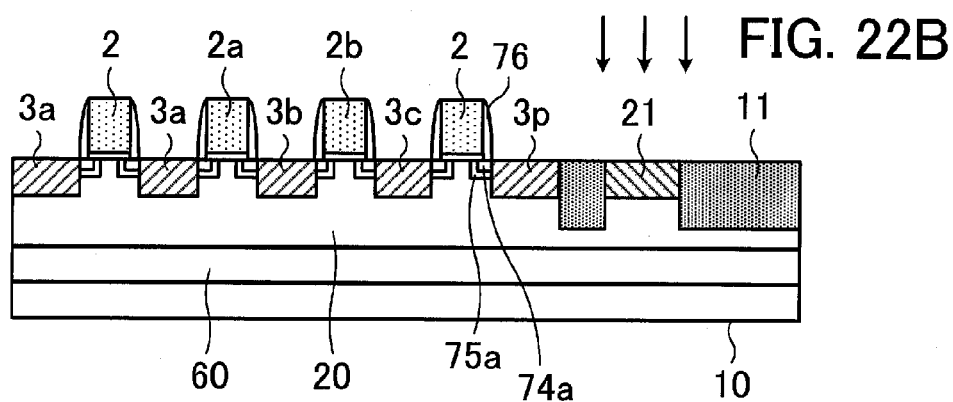
Figure 22C:
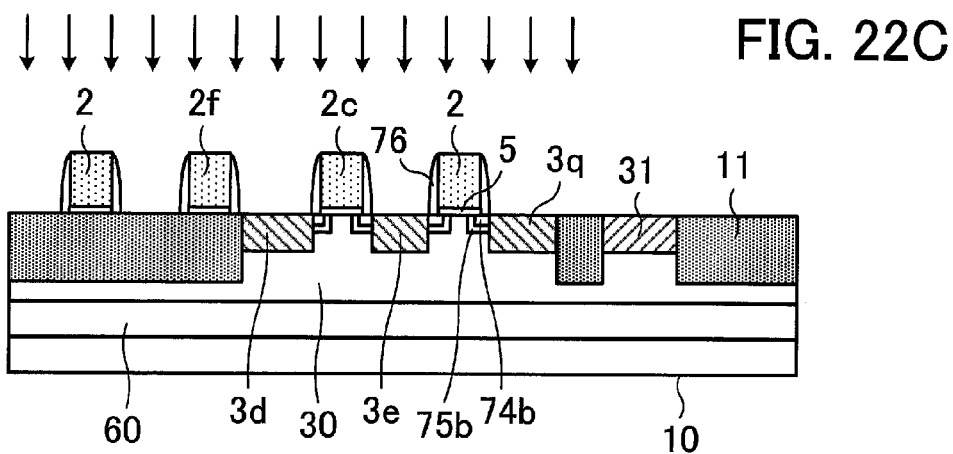

FIGS. 22A, 22B, and 22C are views for describing an example of a pMOS source-drain region formation step in the first embodiment. FIG. 22A is a fragmentary schematic plan view of an example of a pMOS source-drain region formation step in the first embodiment. FIG. 22B is a fragmentary schematic sectional view taken along lines N1j-N1j of FIG. 22A. FIG. 22C is a fragmentary schematic sectional view taken along lines N2j-N2j of FIG. 22A.

As illustrated in FIGS. 22A, 22B, and 22C, the p-type regions 3d, 3e, 3i, 3j, and 3q used as source-drain regions of the pMOSes and the p-type tap regions 21 and 41 of the nMOSes are formed. This is the same with FIGS. 21A, 21B, and 21C. The p-type regions 3d, 3e, 3i, 3j, and 3q and the p-type tap regions 21 and 41 are formed by the use of the photolithography technique and the ion implantation technique. The p-type regions 3d, 3e, 3i, 3j, and 3q are formed in the regions (active region 30a and the active region 30b) of the semiconductor substrate 10 in which the pMOSes are to be formed with the gate electrodes 2c and 2f of the pMOSes and dummy gate electrodes 2 as a mask (FIGS. 22A and 22C). Impurities introduced at the time of forming the p-type regions 3d, 3e, 3i, 3j, and 3q are also introduced into regions of the semiconductor substrate 10 in which the p-type tap regions 21 and 41 are to be formed. By doing so, the p-type tap regions 21 and 41, together with the p-type regions 3d, 3e, 3i, 3j, and 3q, are formed (FIGS. 22A and 22B).

Figure 23A:
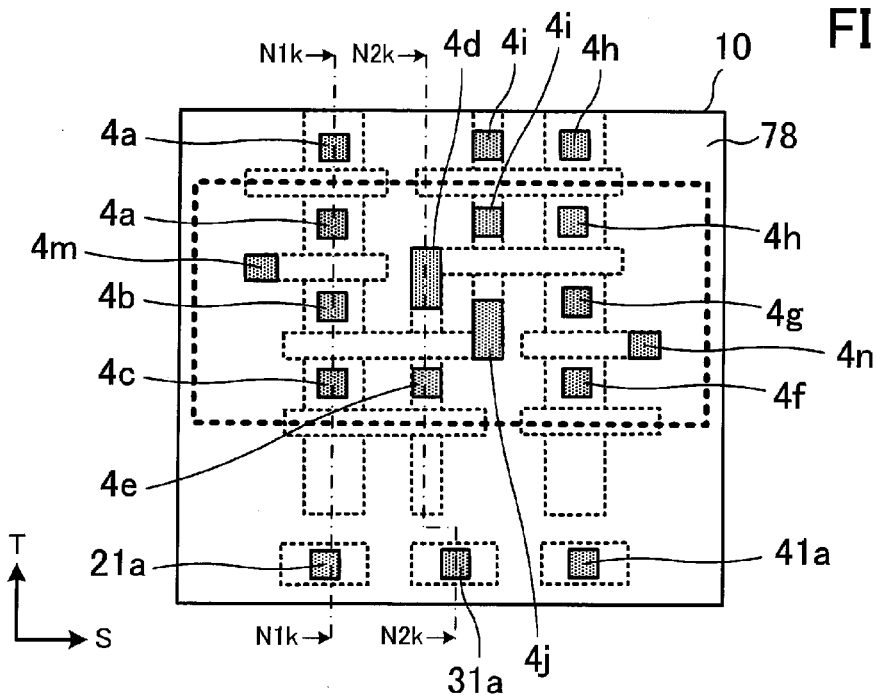
FIGS. 23A, 23B, and 23C are views for describing an example of a contact electrode formation step in the first embodiment.
Figure 23B:
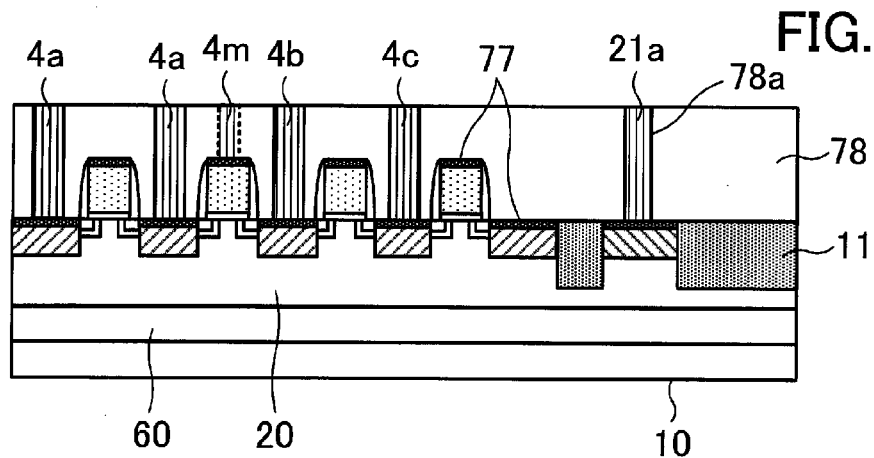
Figure 23C:
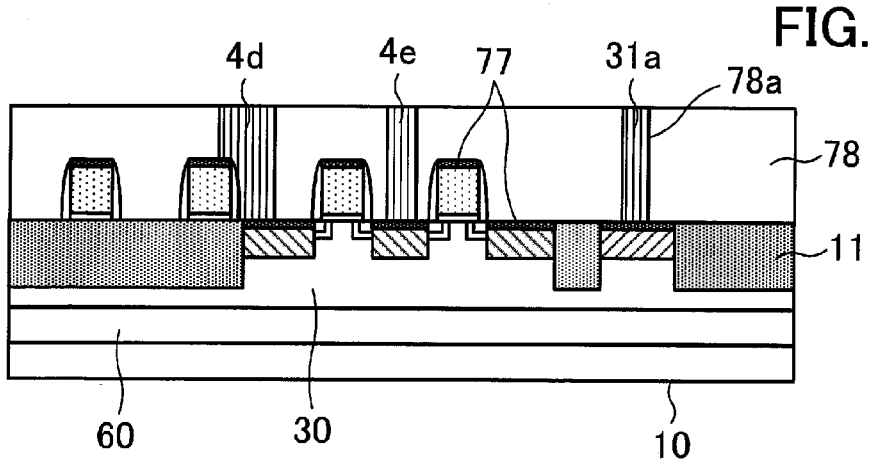

FIGS. 23A, 23B, and 23C are views for describing an example of a contact electrode formation step in the first embodiment. FIG. 23A is a fragmentary schematic plan view of an example of a contact electrode formation step in the first embodiment. FIG. 23B is a fragmentary schematic sectional view taken along lines N1k-N1k of FIG. 23A. FIG. 23C is a fragmentary schematic sectional view taken along lines N2k-N2k of FIG. 23A.

After the above step of FIGS. 22A, 22B, and 22C is performed, the contact electrodes 4a through 4j, 4m, 4n, 31a, 21a, and 41a are formed as illustrated in FIGS. 23A, 23B, and 23C.

Before the contact electrodes 4a through 4j, 4m, 4n, 31a, 21a, and 41a are formed, first a salicide layer 77 is formed in the n-type regions 3a, 3b, 3c, 3f, 3g, and 3h, the p-type regions 3d, 3e, 3i, and 3j, the n-type tap region 31, and the p-type tap regions 21 and 41 described in the above steps of FIGS. 21A, 21B, and 21C and FIGS. 22A, 22B, and 22C. After that, an interlayer dielectric 78 is formed and contact holes 78a are formed in areas (n-type regions 3a, 3b, 3c, 3f, 3g, and 3h, the p-type regions 3d, 3e, 3i, and 3j, the n-type tap region 31, and the p-type tap regions 21 and 41) of the interlayer dielectric 78 in which the contact electrodes 4a through 4j, 4m, 4n, 31a, 21a, and 41a are to be formed. A conductive material, such as tungsten or copper, is then buried in the contact holes 78a to form the contact electrodes 4a through 4j, 4m, 4n, 31a, 21a, and 41a.

After that, a wiring layer including determined conductive portions (wirings, vias, or wirings and vias) is formed over a structure formed by the steps illustrated in FIGS. 13A, 13B, and 13C through FIGS. 23A, 23B, and 23C. Furthermore, a wiring layer including the word lines WL1 and WL2 which extend in the second direction T and a wiring layer including the bit lines BL and XBL which extend in the first direction S are formed.

The above SRAM 1 can be fabricated in the above way.

A second embodiment will now be described.

Figure 24:
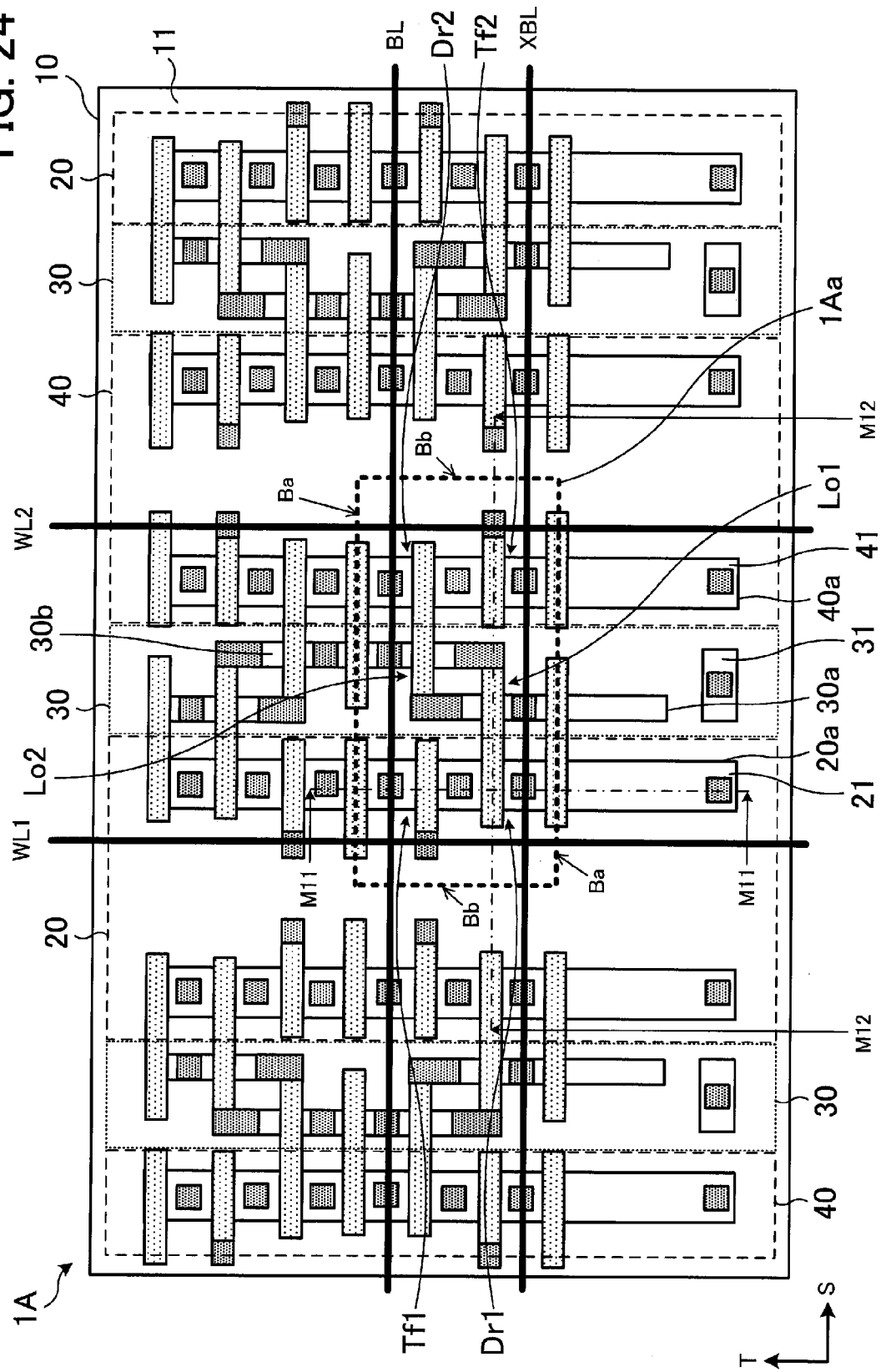
FIG. 24 is an example of an SRAM according to a second embodiment (part 1)
Figure 25A:
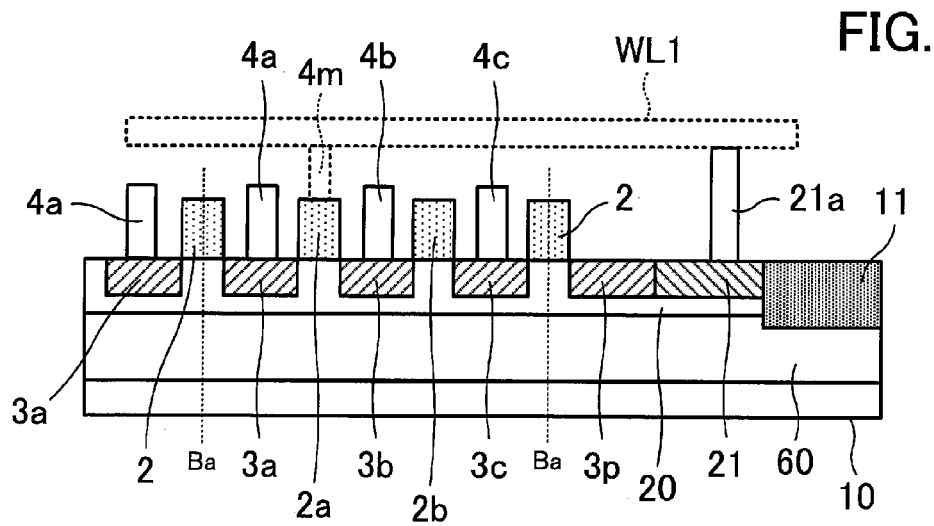
FIGS. 25A and 25B are an example of an SRAM according to a second embodiment (part 2)
Figure 25B:
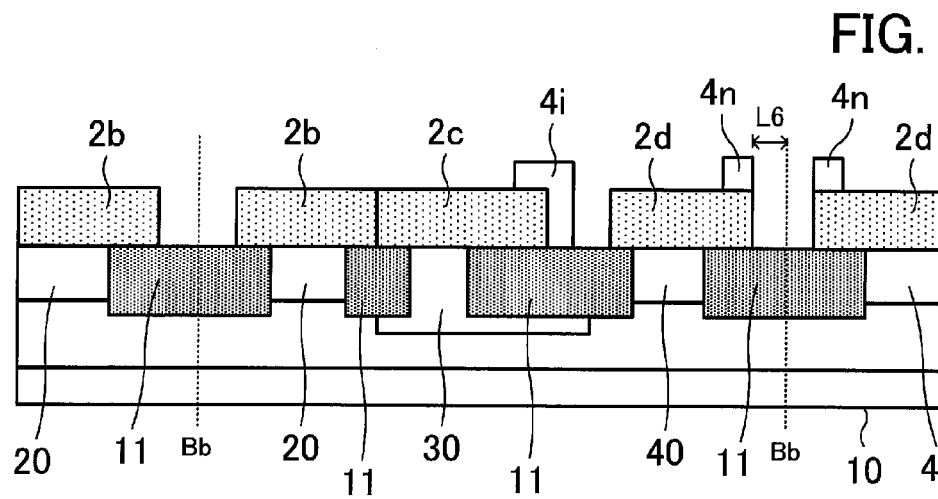

FIG. 24 and FIGS. 25A and 25B are an example of an SRAM according to a second embodiment. FIG. 24 is a fragmentary schematic plan view of an example of an SRAM according to a second embodiment. FIG. 25A is a fragmentary schematic sectional view taken along lines Mi1-M11 of FIG. 24. FIG. 25B is a fragmentary schematic sectional view taken along lines M12-M12 of FIG. 24. For convenience of explanation components which are the same as or correspond to those included in the above SRAM 1 are marked with the same numerals.

With an SRAM 1A illustrated in FIG. 24 and FIGS. 25A and 25B, the n-type well region 50 included in the above SRAM 1 is not used. With the SRAM 1A portions of a p-type well region 20 or portions of a p-type well regions 40 in which memory cells 1Aa adjacent to each other in a first direction S are formed are electrically isolated from each other by an isolation layer 11 and an n-type well region (deep n-type well region) 60. In this respect the SRAM 1A and the above SRAM 1 differ.

With the SRAM 1A, as illustrated in FIG. 25B, a boundary between the p-type well region 20 and the n-type well region 60 is shallower than a lower end of the isolation layer 11. As a result, portions of the p-type well region 20 in the memory cells 1Aa adjacent to each other in the first direction S are electrically isolated from each other. Similarly, a boundary between the p-type well region 40 and the n-type well region 60 is shallower than the lower end of the isolation layer 11. As a result, portions of the p-type well region 40 in the memory cells 1Aa adjacent to each other in the first direction S are electrically isolated from each other.

As stated above, with the SRAM 1A the boundary between the p-type well region 20 and the n-type well region 60 or the boundary between the p-type well region and the n-type well region 60 is shallower than the lower end of the isolation layer 11. Accordingly, as illustrated in FIG. 25A, an active region 20a and a p-type tap region 21 are connected by butting contact in a direction in which the p-type well region 20 extends, that is to say, in a second direction T and not isolated from each other by the isolation layer 11. In this respect the SRAM 1A and the above SRAM 1 differ. By adopting this structure, potential of the p-type well region 20 is drawn out by the use of the p-type tap region 21. Similarly, an active region 40a and a p-type tap region 41 are connected by butting contact in a direction in which the p-type well region 40 extends, that is to say, in the second direction T. Potential of the p-type well region 40 is drawn out by the use of the p-type tap region 41.

As stated above, with the SRAM 1A portions of a p-type well region 20 or portions of a p-type well region 40 in memory cells 1Aa adjacent to each other in the first direction S are electrically isolated from each other by the isolation layer 11 and the n-type well region 60. Accordingly, the width of the isolation layer 11 can be narrowed to a minimum interval which is needed from the viewpoint of design and production between active regions 20a or active regions 40a in which memory cells 1Aa adjacent to each other in the first direction S are formed. With the SRAM 1A, however, gate electrodes 2a in memory cells 1Aa adjacent to each other in the first direction S are isolated from each other and gate electrodes 2d in memory cells 1Aa adjacent to each other in the first direction S are isolated from each other. This is the same with the above SRAM 1. Accordingly, a minimum interval which is needed from the viewpoint of design and production between the gate electrodes 2a and between the gate electrodes 2d is ensured.

In order to ensure a determined interval between the gate electrodes 2a and between the gate electrodes 2d, the length in the first direction S of the memory cell 1Aa is increased by L6 (half of the interval between the gate electrodes 2a or the gate electrodes 2d) on one side. If L6 is, for example, 0.12 μm (0.24 μm on both sides), then the area of the memory cell 1Aa of the SRAM 1A is estimated at about (1.17 μm+0.24 μm)× (0.5 μm+0.24 μm)=1.0434 μm². It is possible to make the area of the memory cell 1Aa of the SRAM 1A smaller than that of the 0.5-volt cell (1.44 μm²) indicated in FIG. 7.

With the SRAM 1A according to the second embodiment a penetration contact electrode, an SOI substrate, or a PT is not used. The adoption of the SRAM 1A according to the second embodiment makes it possible to control an increase in the area of a memory cell and realize a low operating voltage.

The SRAM 1A having the above structure can be fabricated by, for example, the following method. An example of a method for fabricating the above SRAM 1A will be described with reference to FIGS. 26 through 36.

Figure 26A:
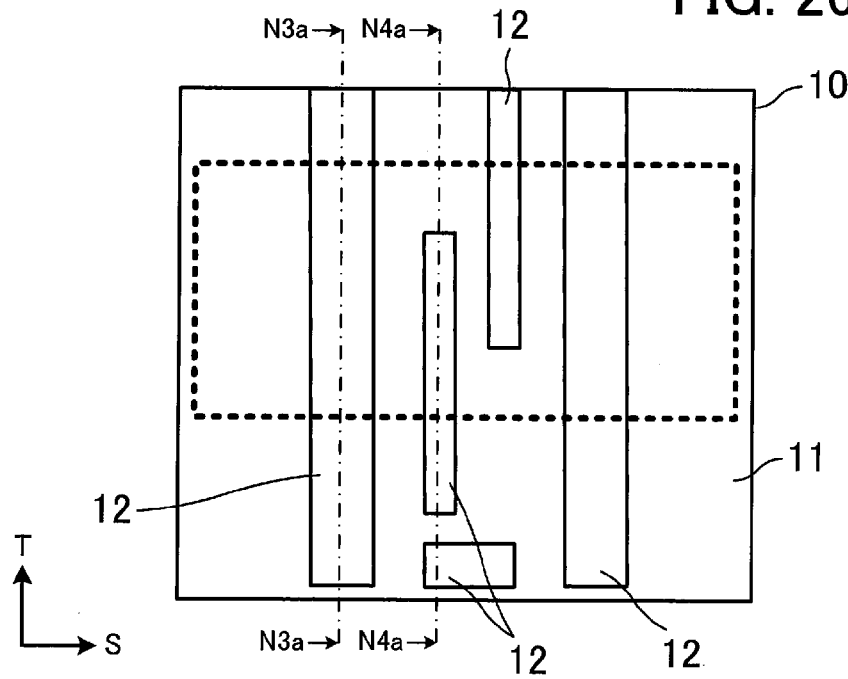
FIGS. 26A, 26B, and 26C are views for describing an example of an isolation layer and sacrificial oxide layer formation step in the second embodiment.
Figure 26B:
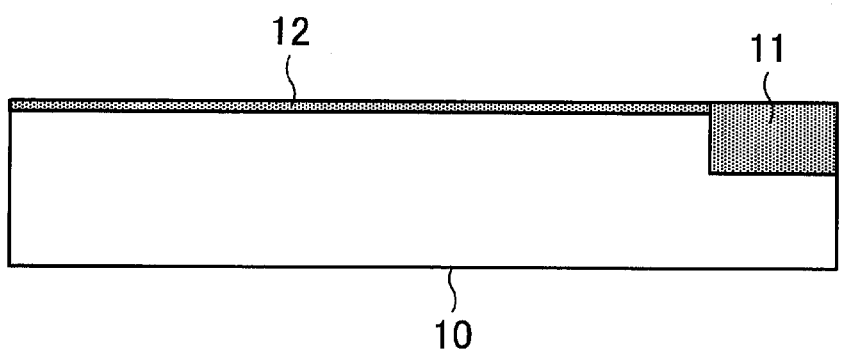
Figure 26C:
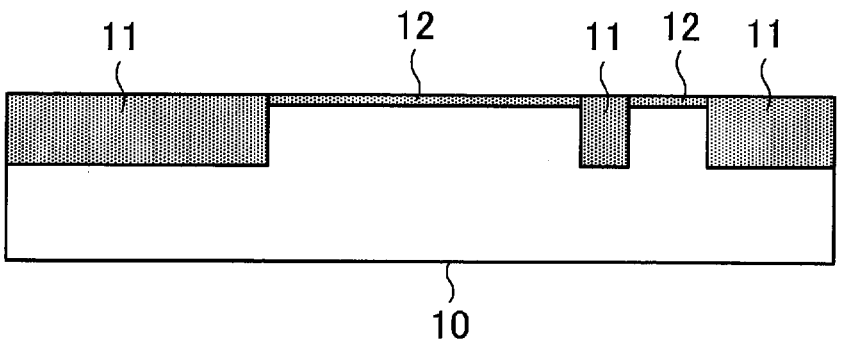

FIGS. 26A, 26B, and 26C are views for describing an example of an isolation layer and sacrificial oxide layer formation step in the second embodiment. FIG. 26A is a fragmentary schematic plan view of an example of an isolation layer and sacrificial oxide layer formation step in the second embodiment. FIG. 26B is a fragmentary schematic sectional view taken along lines N3a-N3a of FIG. 26A. FIG. 26C is a fragmentary schematic sectional view taken along lines N4a-N4a of FIG. 26A.

As illustrated in FIGS. 26A, 26B, and 26C, the isolation layer 11 and a sacrificial oxide layer 12 are formed in a p-type semiconductor substrate 10 by the use of, for example, the STI method and the thermal oxidation method respectively. By forming the isolation layer 11, active regions in which nMOSes and pMOSes of the SRAM 1A are formed and a pMOS tap region are defined.

Figure 27A:
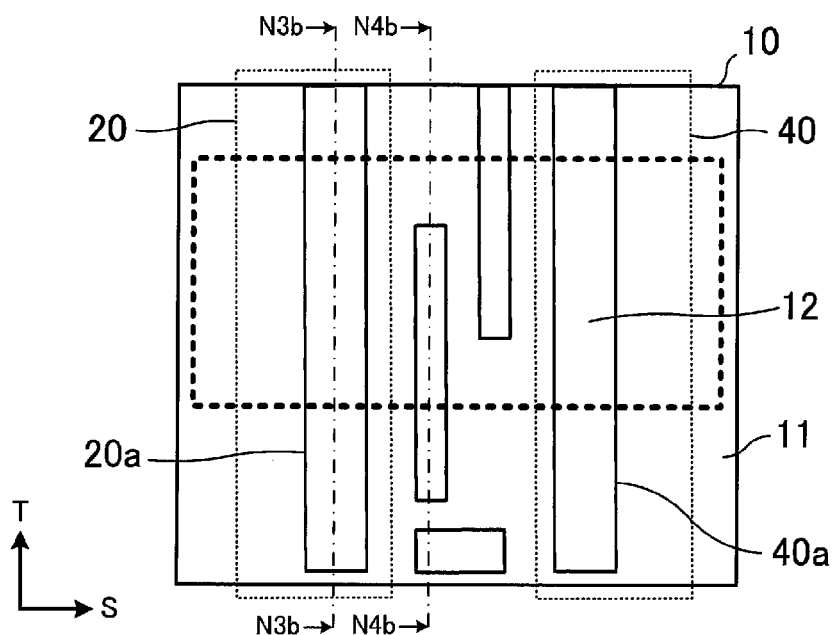
FIGS. 27A, 27B, and 27C are views for describing an example of a p-type well region formation step in the second embodiment.
Figure 27B:
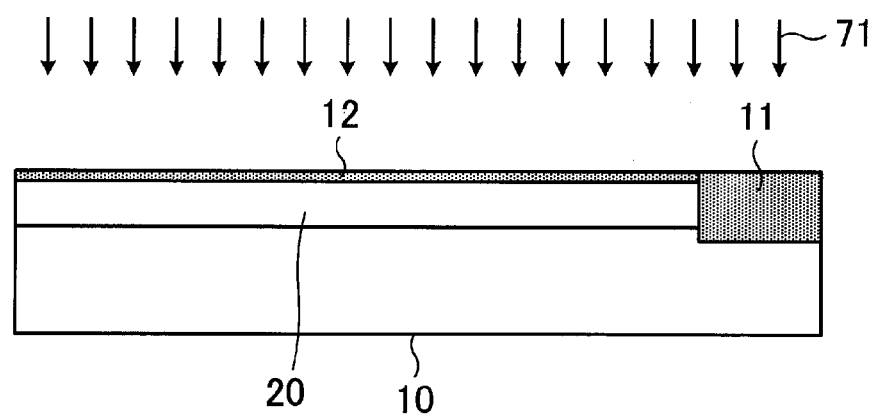
Figure 27C:
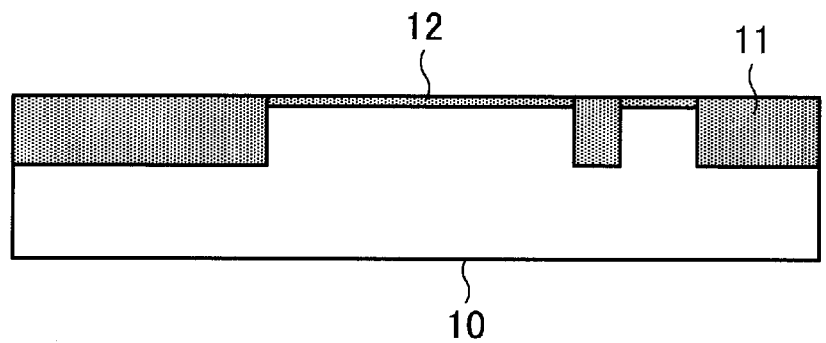

FIGS. 27A, 27B, and 27C are views for describing an example of a p-type well region formation step in the second embodiment. FIG. 27A is a fragmentary schematic plan view of an example of a p-type well region formation step in the second embodiment. FIG. 27B is a fragmentary schematic sectional view taken along lines N3b-N3b of FIG. 27A. FIG. 27C is a fragmentary schematic sectional view taken along lines N4b-N4b of FIG. 27A.

After the formation of the isolation layer 11 and the sacrificial oxide layer 12, as illustrated in FIGS. 27A, 27B, and 27C, the p-type well region 20 and the p-type well region 40 are formed. The p-type well region 20 and the p-type well region 40 are formed by introducing p-type impurities 71 into regions in which the nMOSes (transfer transistors and the driver transistors) are to be formed and nMOS tap regions. In this case, the p-type well region 20 and the p-type well region 40 are shallower than the isolation layer 11 (FIGS. 27A and 27B). The p-type impurities 71 are introduced through the sacrificial oxide layer 12 into the semiconductor substrate 10 and are then diffused and activated by anneal performed in this step or a later step.

The p-type active region 20a, the p-type active region 40a, and the p-type tap regions 21 and 41 described later are formed in the regions in the semiconductor substrate 10 which are defined by the isolation layer 11 and into which the p-type impurities 71 are introduced.

After the ion implantation of the p-type impurities 71, ion implantation for adjusting threshold voltage of the nMOSes (what is called channel implantation) may also be performed. The ion implantation of the p-type impurities 71 may also be utilized for nMOS channel implantation.

Figure 28A:
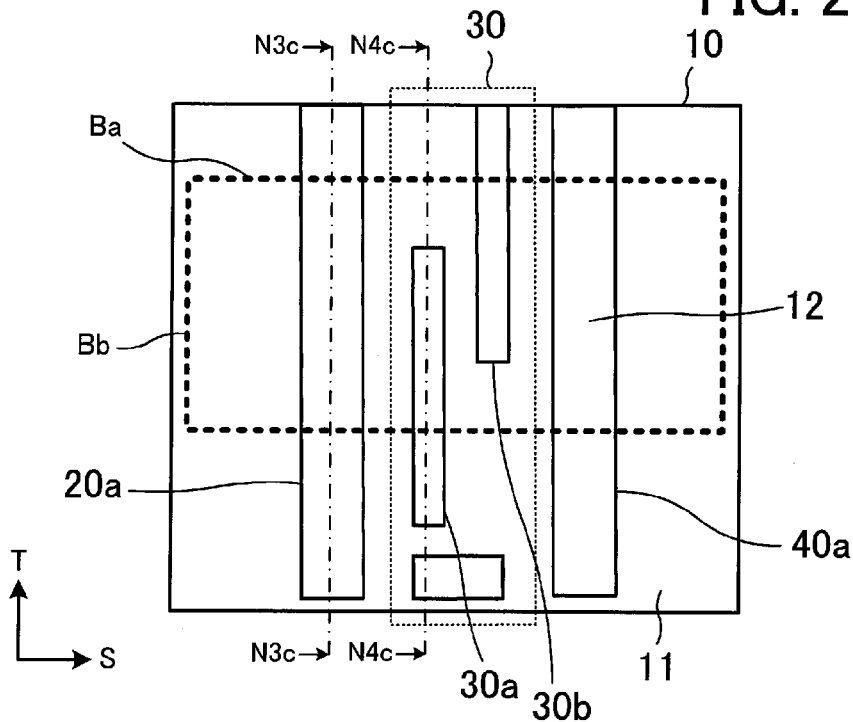
FIGS. 28A, 28B, and 28C are views for describing an example of an n-type well region formation step in the second embodiment.
Figure 28B:
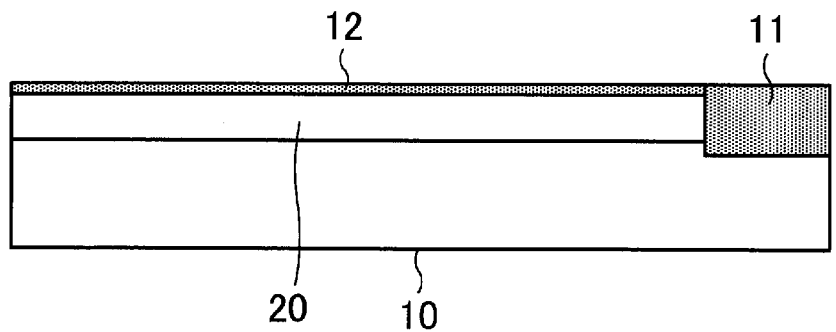
Figure 28C:
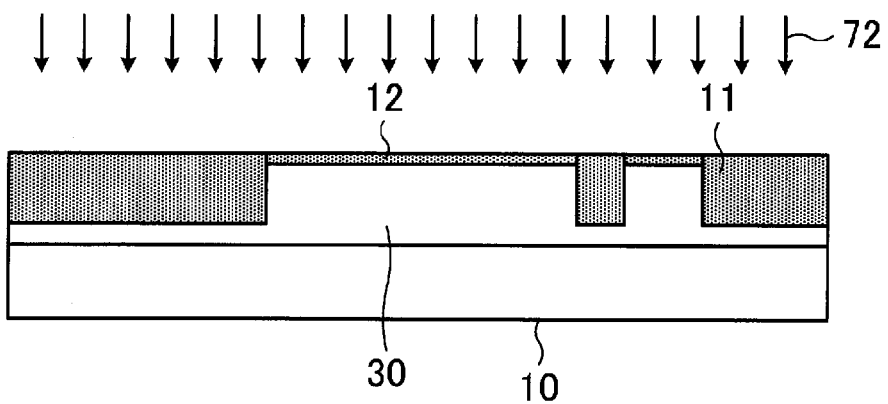

FIGS. 28A, 28B, and 28C are views for describing an example of an n-type well region formation step in the second embodiment. FIG. 28A is a fragmentary schematic plan view of an example of an n-type well region formation step in the second embodiment. FIG. 28B is a fragmentary schematic sectional view taken along lines N3c-N3c of FIG. 28A. FIG. 28C is a fragmentary schematic sectional view taken along lines N4c-N4c of FIG. 28A.

After the formation of the p-type well region 20 and the p-type well region 40, as illustrated in FIGS. 28A, 28B, and 28C, the n-type well region 30 is formed. The n-type well region 30 is formed by introducing n-type impurities 72 into a region in which the pMOSes (load transistors) are to be formed and a pMOS tap region (FIGS. 28A and 28C). The n-type impurities 72 are introduced through the sacrificial oxide layer 12 into the semiconductor substrate 10 and are then diffused and activated by anneal performed in this step or a later step.

An n-type active region 30a, an n-type active region 30b, and an n-type tap region 31 described later are formed in the regions in the semiconductor substrate 10 which are defined by the isolation layer 11 and into which the n-type impurities 72 are introduced.

After the ion implantation of the n-type impurities 72, ion implantation for adjusting threshold voltage of the pMOSes (what is called channel implantation) may also be performed. The ion implantation of the n-type impurities 72 may also be utilized for pMOS channel implantation.

Figure 29A:
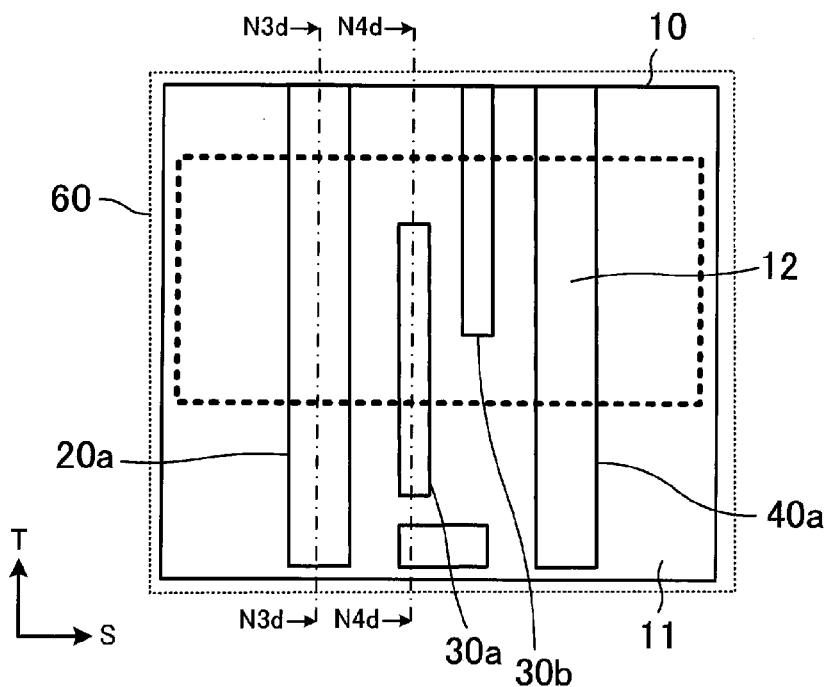
FIGS. 29A, 29B, and 29C are views for describing an example of a deep n-type well region formation step in the second embodiment.
Figure 29B:
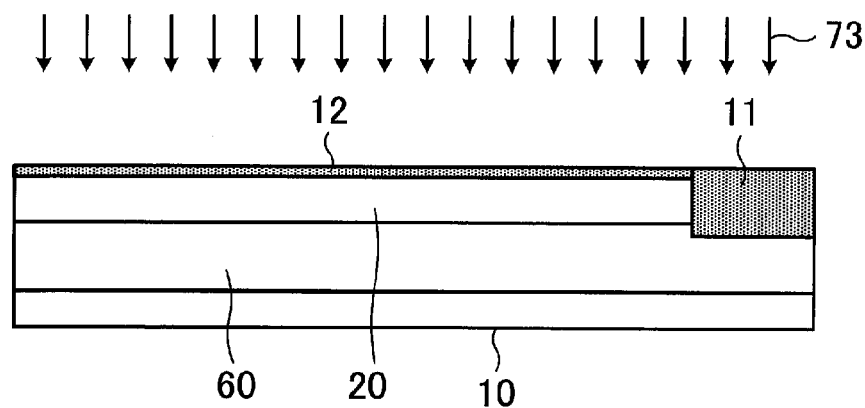
Figure 29C:
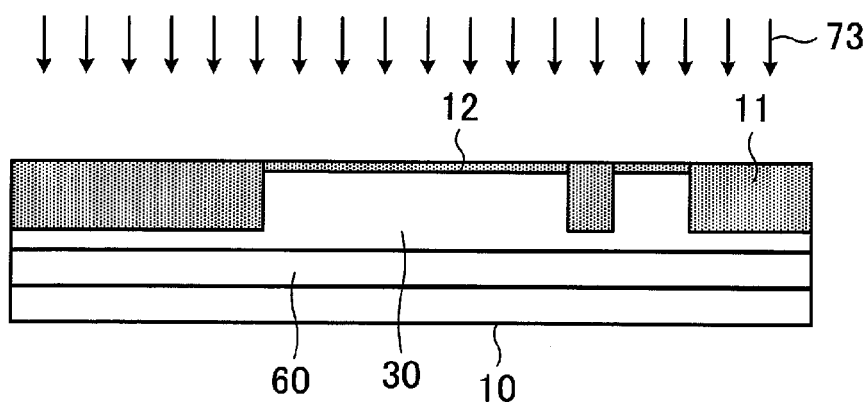

FIGS. 29A, 29B, and 29C are views for describing an example of a deep n-type well region formation step in the second embodiment. FIG. 29A is a fragmentary schematic plan view of an example of a deep n-type well region formation step in the second embodiment. FIG. 29B is a fragmentary schematic sectional view taken along lines N3d-N3d of FIG. 29A. FIG. 29C is a fragmentary schematic sectional view taken along lines N4d-N4d of FIG. 29A.

After the formation of the n-type well region 30, as illustrated in FIGS. 29A, 29B, and 29C, the n-type well region (deep n-type well region) 60 is formed. The n-type well region 60 is formed by introducing n-type impurities 73 into a region in which the SRAM 1A is to be formed (FIGS. 29A, 29B, and 29C). The n-type impurities 73 are introduced through the sacrificial oxide layer 12 into a region in the semiconductor substrate 10 which is deeper than the p-type well region 20, the p-type well region 40, and the n-type well region 30. After that, the introduced n-type impurities 73 are diffused and activated by anneal performed in this step or a later step.

The formed p-type well region 20 and p-type well region 40 are shallower than the lower end of the isolation layer 11 (FIGS. 27A, 27B, and 27C), so the boundary between the p-type well region 20 and the n-type well region 60 and the boundary between the p-type well region 40 and the n-type well region 60 are shallower than the lower end of the isolation layer 11.

Figure 30A:
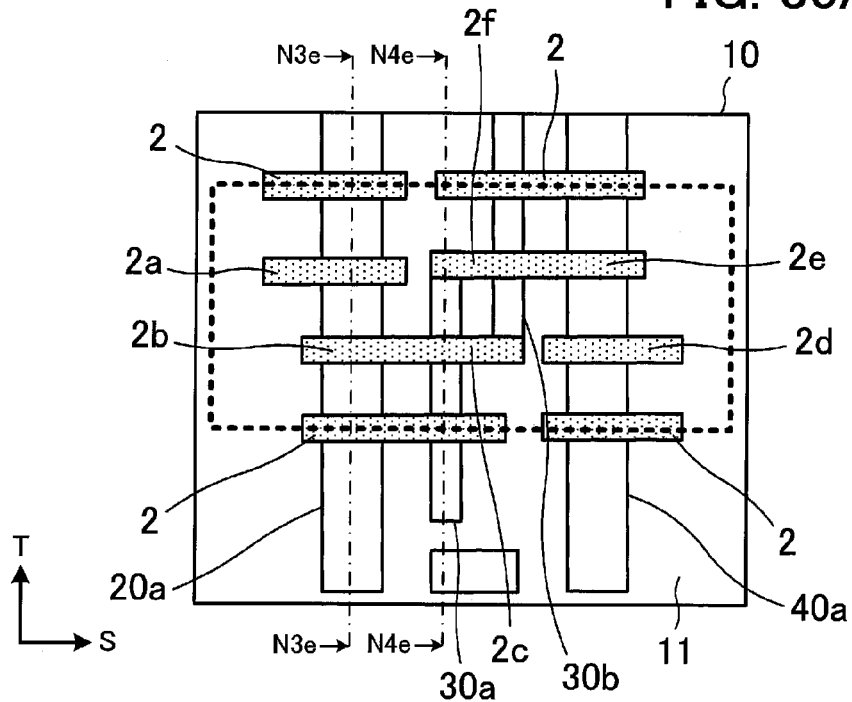
FIGS. 30A, 30B, and 30C are views for describing an example of a gate oxide film and gate electrode formation step in the second embodiment.
Figure 30B:
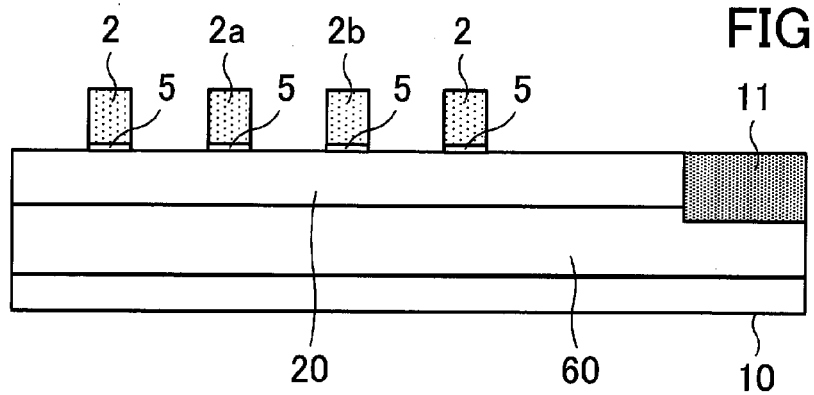
Figure 30C:
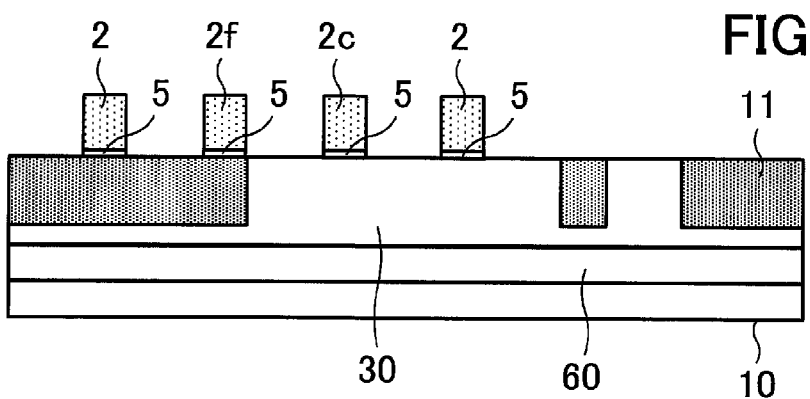

FIGS. 30A, 30B, and 30C are views for describing an example of a gate oxide film and gate electrode formation step in the second embodiment. FIG. 30A is a fragmentary schematic plan view of an example of a gate oxide film and gate electrode formation step in the second embodiment. FIG. 30B is a fragmentary schematic sectional view taken along lines N3e-N3e of FIG. 30A. FIG. 30C is a fragmentary schematic sectional view taken along lines N4e-N4e of FIG. 30A.

After the formation of the n-type well region 60, as illustrated in FIGS. 30A, 30B, and 30C, a gate oxide film 5, the gate electrodes 2a and 2d, gate electrodes 2b, 2c, 2e, and 2f, and dummy gate electrodes 2 are formed.

Figure 31A:
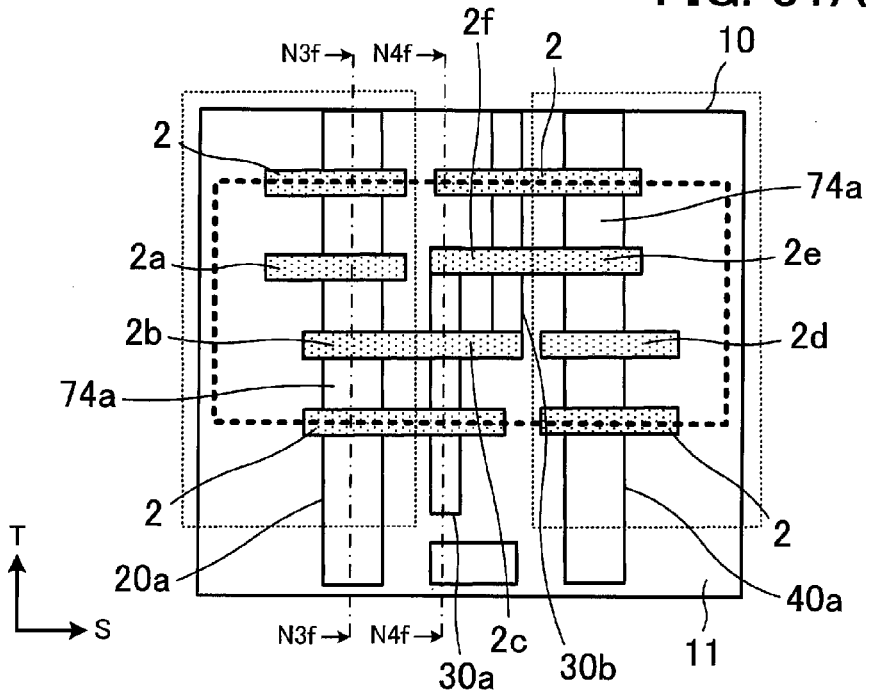
FIGS. 31A, 31B, and 31C are views for describing an example of an n-type extension region and p-type halo region formation step in the second embodiment.
Figure 31B:
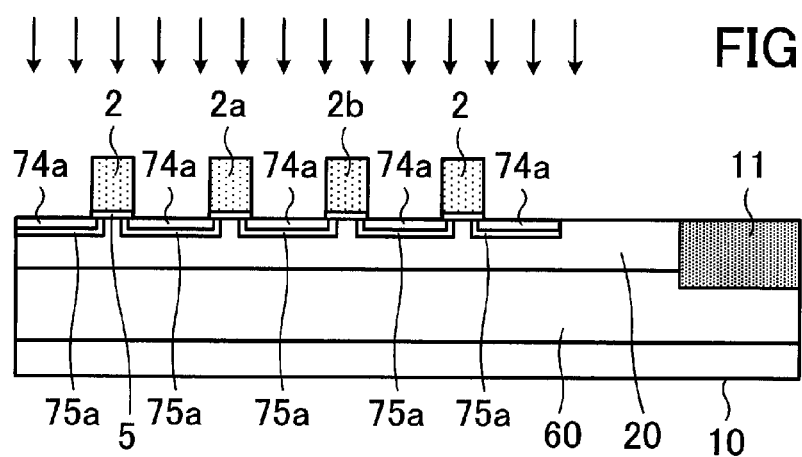
Figure 31C:
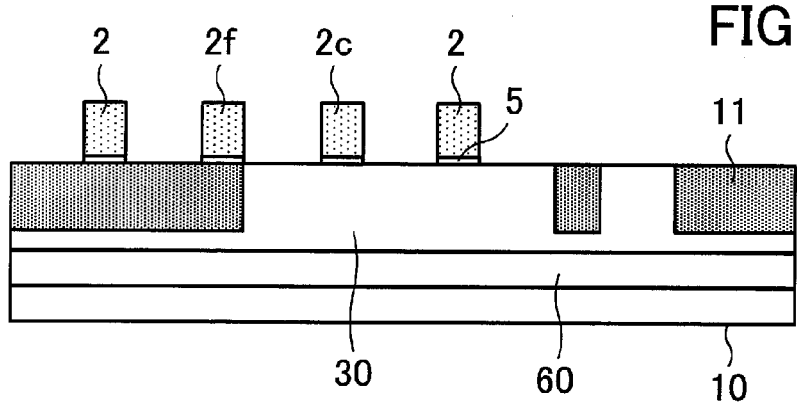

FIGS. 31A, 31B, and 31C are views for describing an example of an n-type extension region and p-type halo region formation step in the second embodiment.

FIG. 31A is a fragmentary schematic plan view of an example of an n-type extension region and p-type halo region formation step in the second embodiment. FIG. 31B is a fragmentary schematic sectional view taken along lines N3f-N3f of FIG. 31A. FIG. 31C is a fragmentary schematic sectional view taken along lines N4f-N4f of FIG. 31A.

After the formation of the gate oxide film 5, the gate electrodes 2a through 2f, and the dummy gate electrodes 2, as illustrated in FIGS. 31A, 31B, and 31C, n-type extension regions 74a and p-type halo regions 75a are formed. The n-type extension regions 74a are formed on both sides of the gate electrodes 2a, 2b, 2d, and 2e of the nMOSes and dummy gate electrodes 2 (FIGS. 31A and 31B). The p-type halo regions 75a are formed in regions deeper than the n-type extension regions 74a so that they will surround the n-type extension regions 74a (FIG. 31B). Impurities introduced into the n-type extension regions 74a and the p-type halo regions 75a are diffused and activated by anneal performed in this step or a later step.

Figure 32A:
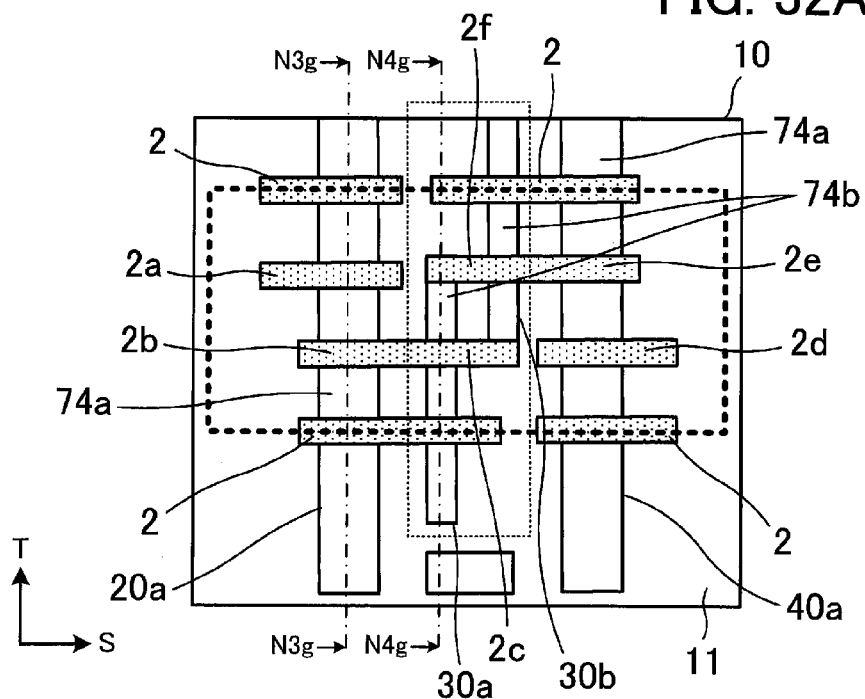
FIGS. 32A, 32B, and 32C are views for describing an example of a p-type extension region and n-type halo region formation step in the second embodiment.
Figure 32B:
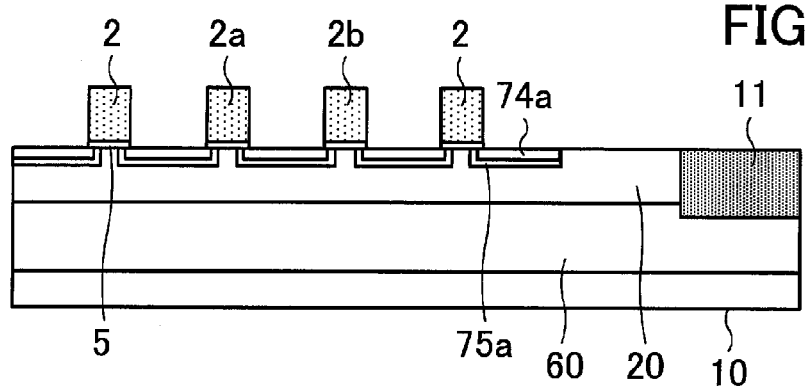
Figure 32C:
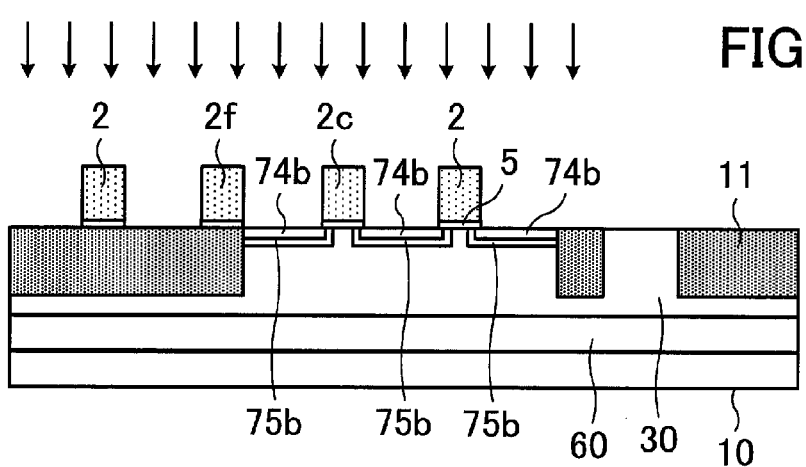

FIGS. 32A, 32B, and 32C are views for describing an example of a p-type extension region and n-type halo region formation step in the second embodiment.

FIG. 32A is a fragmentary schematic plan view of an example of a p-type extension region and n-type halo region formation step in the second embodiment. FIG. 32B is a fragmentary schematic sectional view taken along lines N3g-N3g of FIG. 32A. FIG. 32C is a fragmentary schematic sectional view taken along lines N4g-N4g of FIG. 32A.

As illustrated in FIGS. 32A, 32B, and 32C, p-type extension regions 74b and n-type halo regions 75b are formed. This is the same with FIGS. 31A, 31B, and 31C. The p-type extension regions 74b are formed on both sides of the gate electrodes 2c and 2f of the pMOSes and a dummy gate electrode 2 (FIGS. 32A and 32C). The n-type halo regions 75b are formed in regions deeper than the p-type extension regions 74b so that they will surround the p-type extension regions 74b (FIG. 32C). Impurities introduced into the p-type extension regions 74b and the n-type halo regions 75b are diffused and activated by anneal performed in this step or a later step.

Figure 33A:
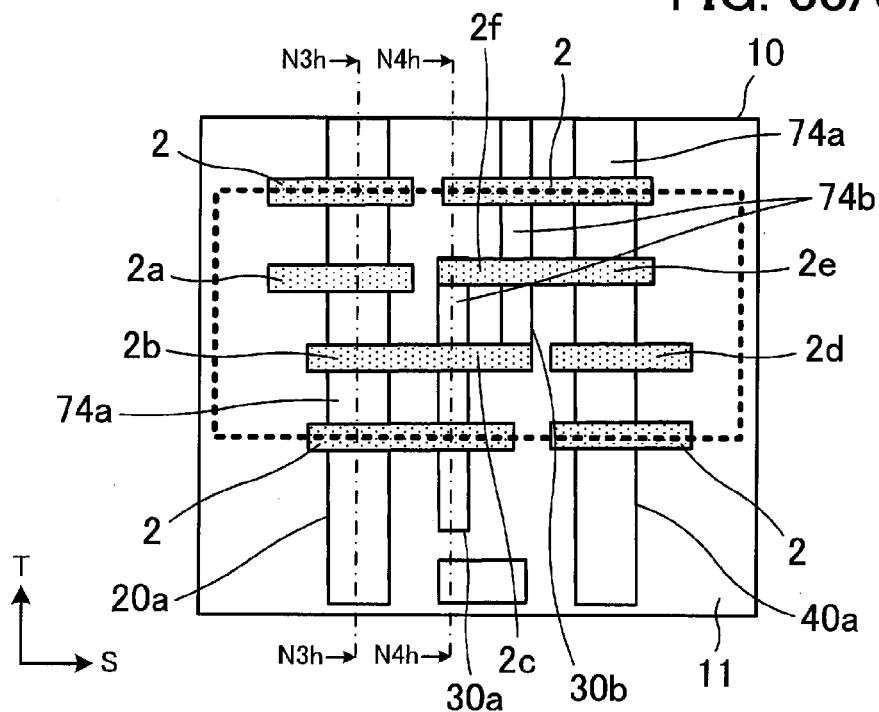
FIGS. 33A, 33B, and 33C are views for describing an example of a sidewall spacer formation step in the second embodiment.
Figure 33B:
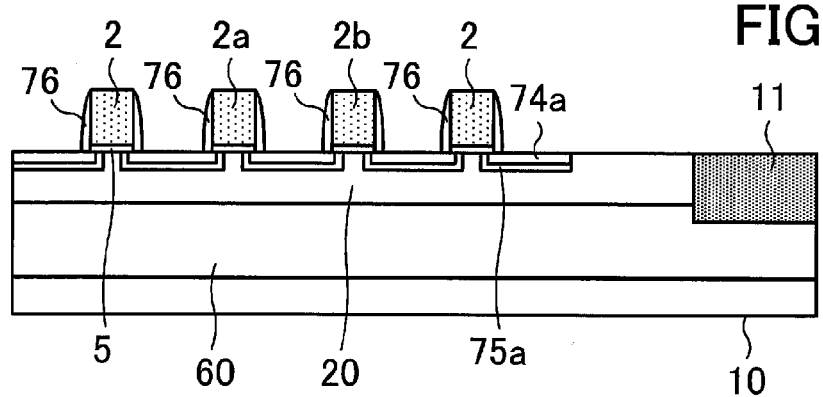
Figure 33C:
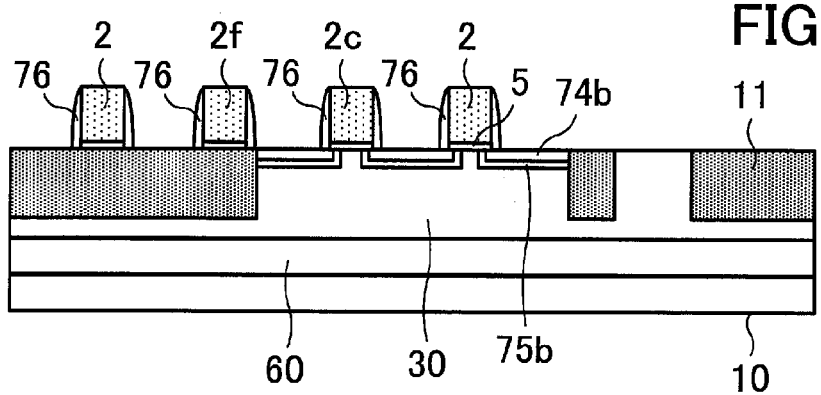

FIGS. 33A, 33B, and 33C are views for describing an example of a sidewall spacer formation step in the second embodiment. FIG. 33A is a fragmentary schematic plan view of an example of a sidewall spacer formation step in the second embodiment. FIG. 33B is a fragmentary schematic sectional view taken along lines N3h-N3h of FIG. 33A. FIG. 33C is a fragmentary schematic sectional view taken along lines N4h-N4h of FIG. 33A.

After the formation of the n-type extension regions 74a, the p-type extension regions 74b, and the like, as illustrated in FIGS. 33B and 33C, sidewall spacers 76 are formed on sidewalls of the gate electrodes 2a through 2f and the dummy gate electrodes 2 (not illustrated in FIG. 33A).

Figure 34A:
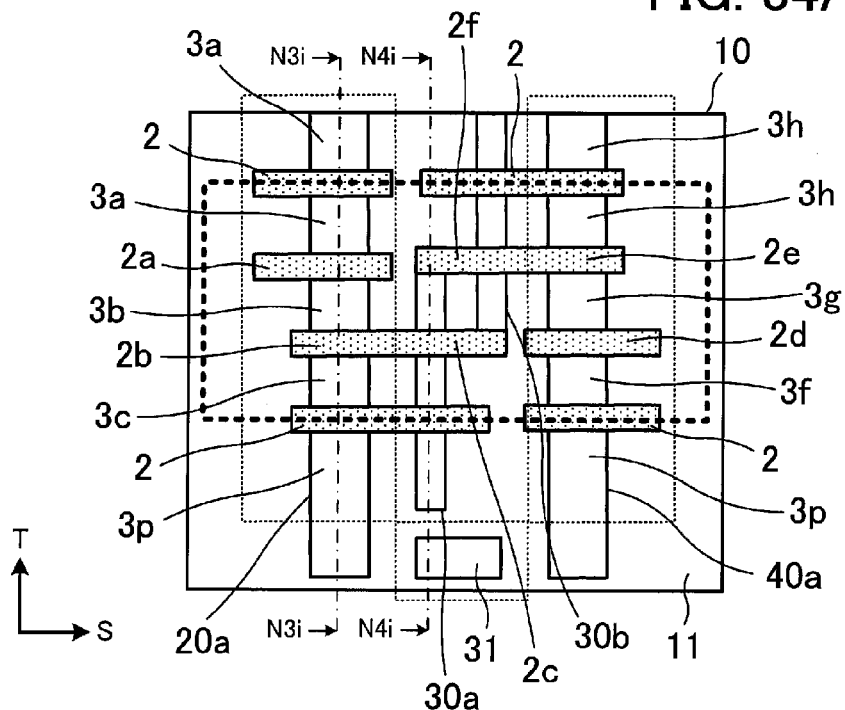
FIGS. 34A, 34B, and 34C are views for describing an example of an nMOS source-drain region formation step in the second embodiment.
Figure 34B:
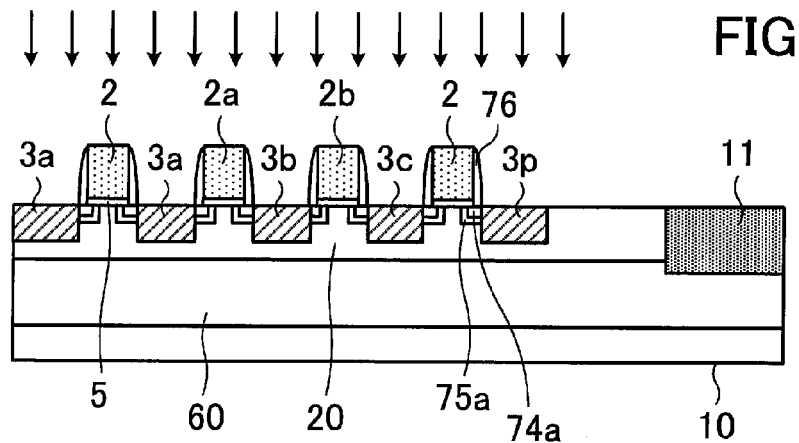
Figure 34C:
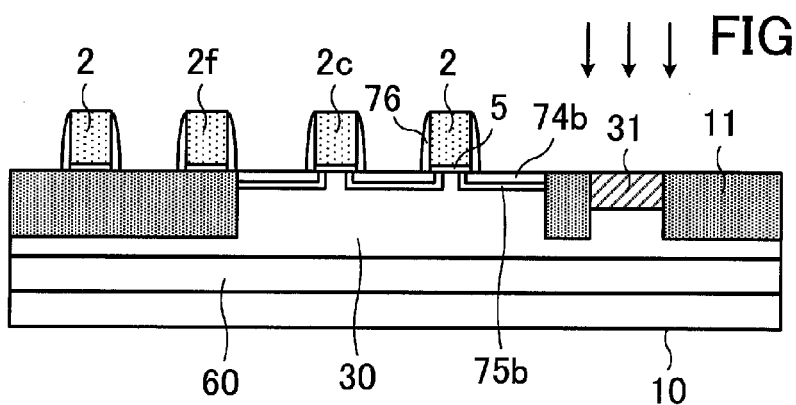

FIGS. 34A, 34B, and 34C are views for describing an example of an nMOS source-drain region formation step in the second embodiment. FIG. 34A is a fragmentary schematic plan view of an example of an nMOS source-drain region formation step in the second embodiment. FIG. 34B is a fragmentary schematic sectional view taken along lines N3i-N3i of FIG. 34A. FIG. 34C is a fragmentary schematic sectional view taken along lines N4i-N4i of FIG. 34A.

After the formation of the sidewall spacers 76, as illustrated in FIGS. 34A, 34B, and 34C, n-type regions 3a, 3b, 3c, 3f, 3g, 3h, and 3p used as source-drain regions of the nMOSes are formed (FIGS. 34A and 34B). Impurities introduced at the time of forming the n-type regions 3a, 3b, 3c, 3f, 3g, 3h, and 3p are also introduced into a region of the semiconductor substrate 10 in which the n-type tap region 31 is to be formed, and the n-type tap region 31 is formed (FIGS. 34A and 34C).

Figure 35A:
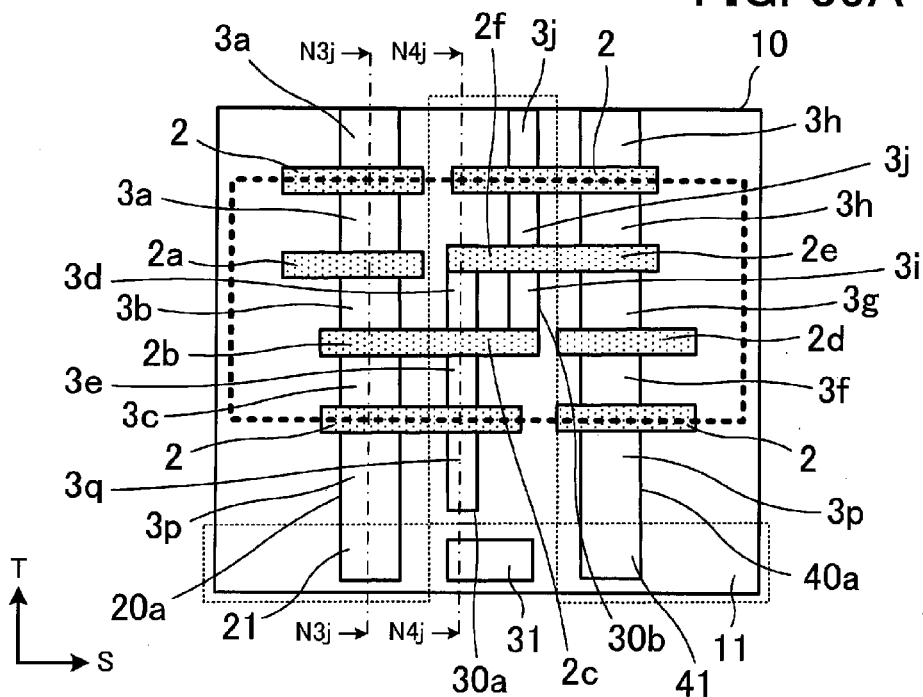
FIGS. 35A, 35B, and 35C are views for describing an example of a pMOS source-drain region formation step in the second embodiment.
Figure 35B:
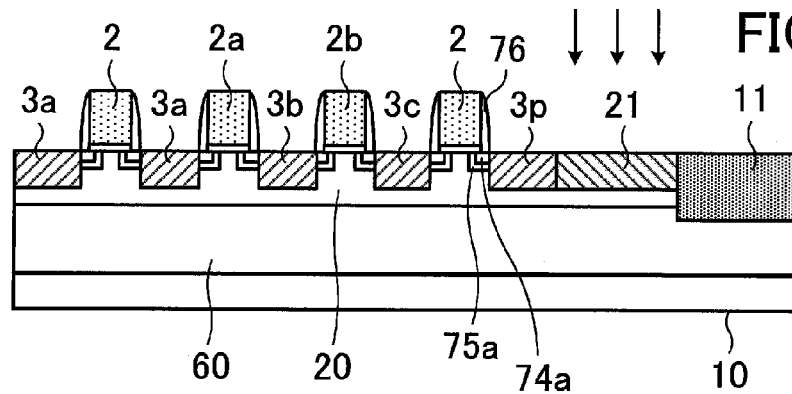
Figure 35C:
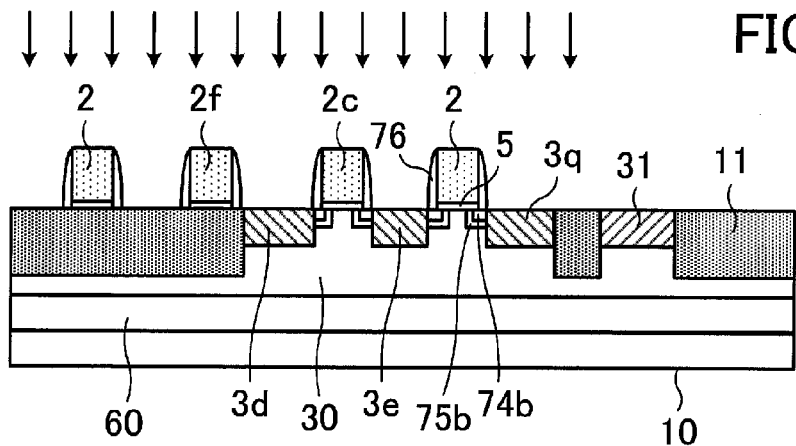

FIGS. 35A, 35B, and 35C are views for describing an example of a pMOS source-drain region formation step in the second embodiment. FIG. 35A is a fragmentary schematic plan view of an example of a pMOS source-drain region formation step in the second embodiment. FIG. 35B is a fragmentary schematic sectional view taken along lines N3j-N3j of FIG. 35A. FIG. 35C is a fragmentary schematic sectional view taken along lines N4j-N4j of FIG. 35A.

As illustrated in FIGS. 35A, 35B, and 35C, p-type regions 3d, 3e, 3i, 3j, and 3q used as source-drain regions of the pMOSes are formed (FIGS. 35A and 35C). This is the same with FIGS. 34A, 34B, and 34C. Impurities introduced at the time of forming the p-type regions 3d, 3e, 3i, 3j, and 3q are also introduced into regions of the semiconductor substrate 10 in which the p-type tap regions 21 and 41 are to be formed, and the p-type tap regions 21 and 41 are formed (FIGS. 35A and 35B). The p-type tap regions 21 and 41 formed are connected to the n-type regions 3p.

Figure 36A:
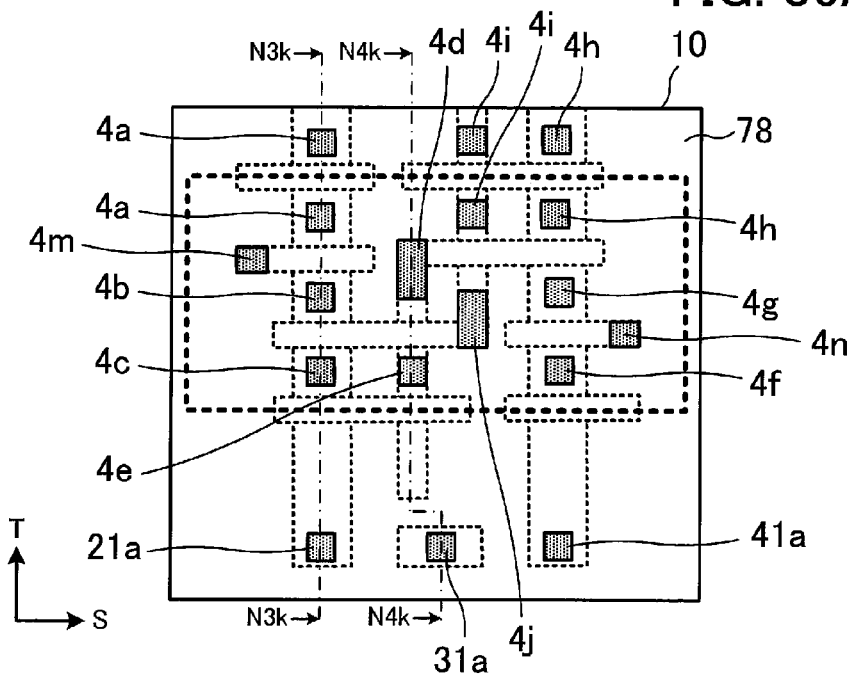
FIGS. 36A, 36B, and 36C are views for describing an example of a contact electrode formation step in the second embodiment.
Figure 36B:
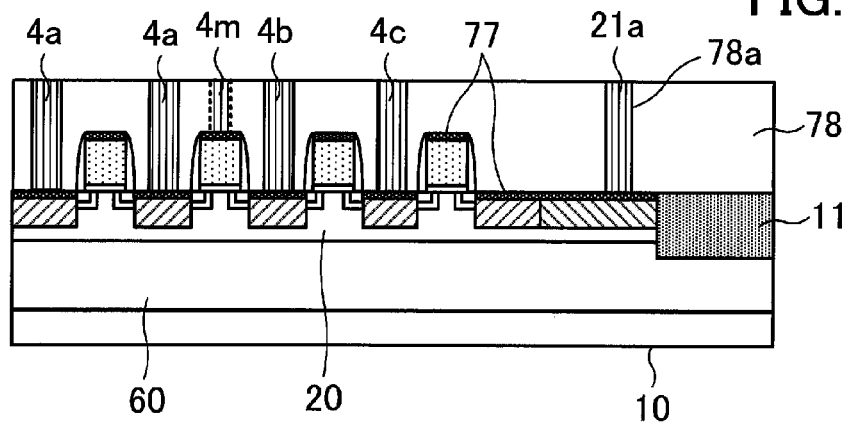
Figure 36C:
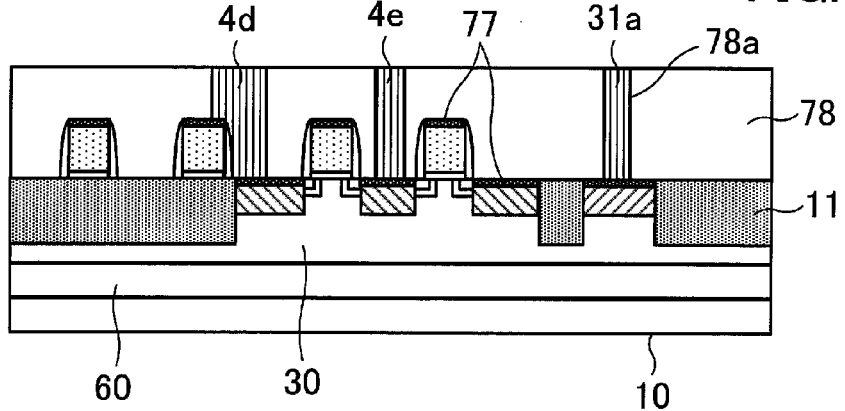

FIGS. 36A, 36B, and 36C are views for describing an example of a contact electrode formation step in the second embodiment. FIG. 36A is a fragmentary schematic plan view of an example of a contact electrode formation step in the second embodiment. FIG. 36B is a fragmentary schematic sectional view taken along lines N3k-N3k of FIG. 36A. FIG. 36C is a fragmentary schematic sectional view taken along lines N4k-N4k of FIG. 36A.

After the above step of FIGS. 35A, 35B, and 35C is performed, as illustrated in FIGS. 36A, 36B, and 36C, first a salicide layer 77 is formed in the n-type regions 3a, 3b, 3c, 3f, 3g, and 3h, the p-type regions 3d, 3e, 3i, and 3j, the n-type tap region 31, and the p-type tap regions 21 and 41. After that, an interlayer dielectric 78 is formed and contact holes 78a are formed at determined positions of the interlayer dielectric 78. A determined conductive material is then buried in the contact holes 78a to form contact electrodes 4a through 4j, 4m, 4n, 31a, 21a, and 41a.

After that, a wiring layer including determined conductive portions (wirings, vias, or wirings and vias) is formed over a structure formed by the steps illustrated in FIGS. 26A, 26B, and 26C through FIGS. 36A, 36B, and 36C. Furthermore, a wiring layer including word lines WL1 and WL2 which extend in the second direction T and a wiring layer including bit lines BL and XBL which extend in the first direction S are formed.

The above SRAM 1A can be fabricated in the above way.

A third embodiment will now be described.

First a circuit of an SRAM according to a third embodiment will be described.

Some SRAMs (6T-SRAMs) include, as stated above, a pair of transfer transistors, a pair of driver transistors, and a pair of load transistors, that is to say, a total of 6 transistors in their memory cells, and others (8T-SRAMs) include two more transistors in their memory cells (IEEE 2005 Symposium on VLSI Technology Digest of Technical Papers, pp. 128-129, 2005).

Figure 37:
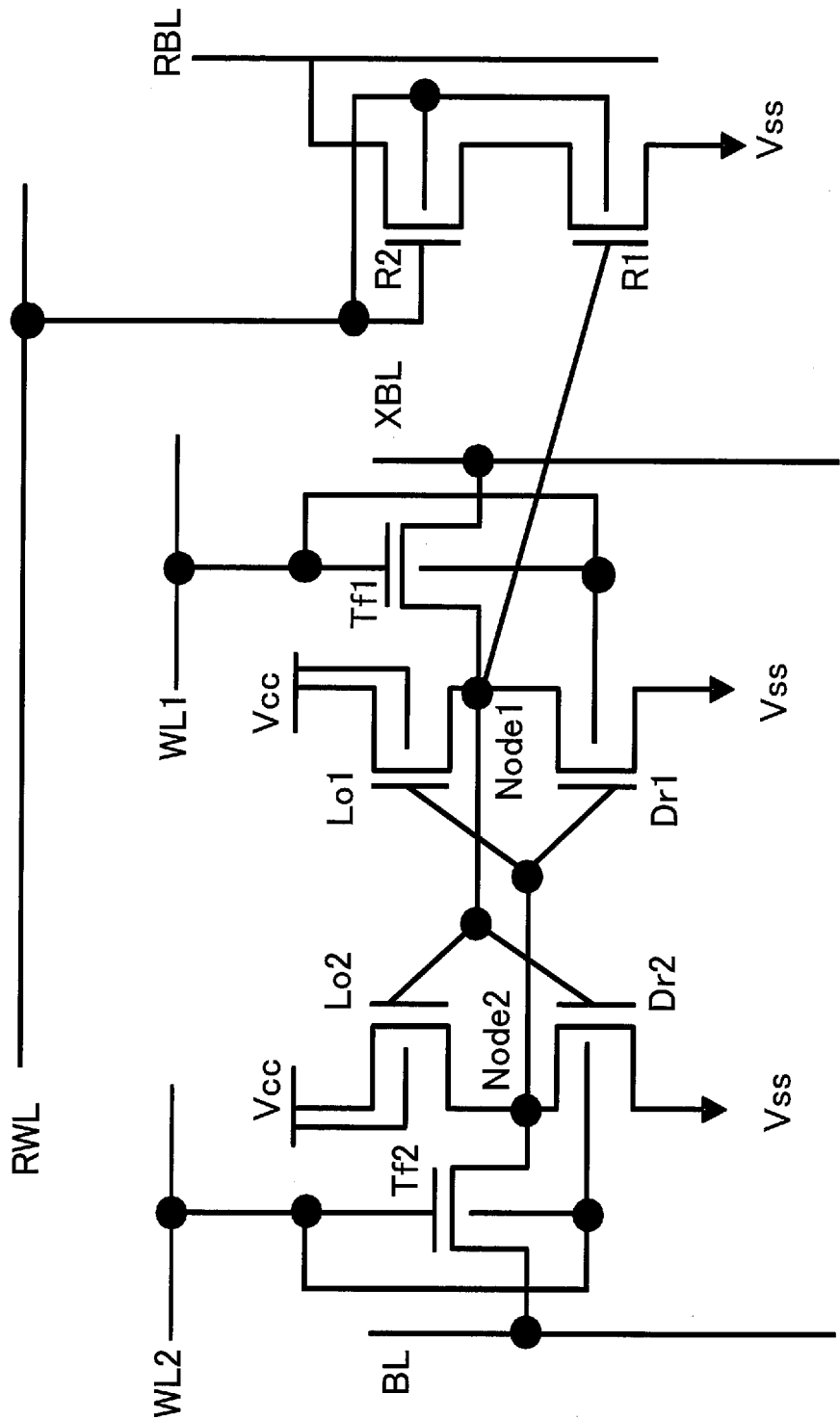
FIG. 37 is a circuit diagram of a memory cell in an SRAM according to a third embodiment.

FIG. 37 is a circuit diagram of a memory cell in an SRAM according to a third embodiment.

With an 8T-SRAM (SRAM) 1B, a 6T-SRAM section (SRAM section) 80 like that described above is used as a write section and two read transistors R1 and R2 (nMOSes), a read word line RWL, and a read bit line RBL are newly added as a read section.

The read transistor R1 and the read transistor R2 are connected in series. A source of the read transistor R1 is electrically connected to a ground potential line Vss and a drain of the read transistor R2 is electrically connected to the read bit line RBL. A gate of the read transistor R2 is electrically connected to the read word line RWL and a gate of the read transistor R1 is electrically connected to a Node 1 of the 6T-SRAM section 80.

With the SRAM 1B the read transistor R2 is turned on by the use of the read word line RWL. At this time the read bit line RBL becomes an L level if the Node 1 is at an H level. The read bit line RBL becomes an H level if the Node 1 is at an L level. Accordingly, reading can be performed.

In the SRAM 1B a p-type well region (body) in which the read transistor R1 and the read transistor R2 are formed and the read word line RWL are connected (short-circuited). By doing so, each of the read transistor R1 and the read transistor R2 has a DTMOS structure and the read transistor R1 and the read transistor R2 can operate at low voltage.

Figure 38:
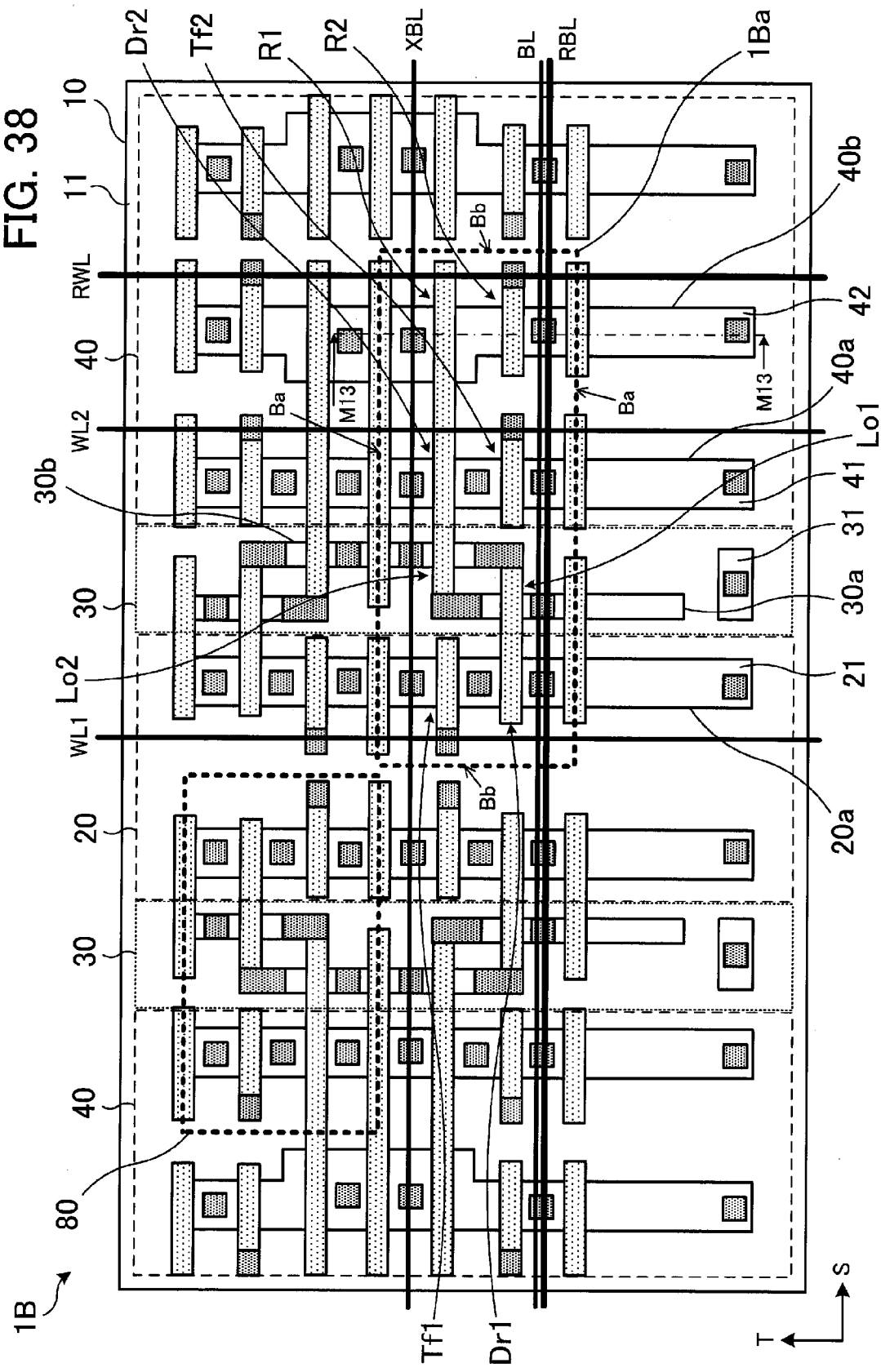
FIG. 38 is an example of the SRAM according to the third embodiment (part 1)

FIGS. 38 and 39 are an example of the SRAM according to the third embodiment. FIG. 38 is a fragmentary schematic plan view of an example of the SRAM according to the third embodiment. FIG. 39 is a fragmentary schematic sectional view taken along lines M13-M13 of FIG. 38. For convenience of explanation components which are the same as or correspond to those included in the above SRAM 1 and SRAM 1A are marked with the same numerals.

The SRAM (8T-SRAM) 1B according to the third embodiment will now be described with a case where a read section is added to the above SRAM 1A according to the second embodiment as an example.

The SRAM 1B includes a plurality of memory cells 1Ba. The structure of an SRAM section 80 used as a write section is the same as that of the memory cell 1Aa of the above SRAM 1A. The structure of the SRAM 1B according to the third embodiment will be described with reference to FIGS. 38 and 39 with emphasis laid on the structure of a region in which the read transistor R1 and the read transistor R2 are formed.

With the SRAM 1B an active region 40b is formed in a p-type well region 40. The read transistor R1 and the read transistor R2 are formed in the active region 40b. The width of a portion of the active region 40b in which the read transistor R1 is formed is greater than the width of a portion of the active region 40b in which the read transistor R2 is formed.

The read transistor R1 includes a gate electrode 2g formed over the active region 40b and an n-type region 3u and an n-type region 3v formed in the active region 40b on both sides of the gate electrode 2g. The gate electrode 2g is electrically connected to a gate electrode 2e of a driver transistor Dr2, a gate electrode 2f of a load transistor Lo2, a p-type region 3d of a load transistor Lo1, and an n-type region 3b of a transfer transistor Tr1 (driver transistor Dr1) included in the SRAM section 80. For example, the gate electrode 2g and the gate electrode 2e (and the gate electrode 2f) can be formed integrally (as one gate electrode). The n-type region 3u is electrically connected to a ground potential line Vss via a contact electrode 4u.

The read transistor R2 includes a gate electrode 2h formed over the active region 40b on the n-type region 3v side from the above gate electrode 2g and the n-type region 3v and an n-type region 3w formed in the active region 40b on both sides of the gate electrode 2h. The gate electrode 2h is electrically connected to the read word line RWL via a contact electrode 4z. The read word line RWL electrically connected to the gate electrode 2h is electrically connected via a contact electrode 42a to a p-type tap region 42 formed in the active region 40b. The n-type region 3w is electrically connected to the read bit line RBL via a contact electrode 4w.

A plurality of memory cells 1Ba each having the above structure are formed in a second direction T by the use of one combination of a p-type well region 20, an n-type well region 30, and a p-type well region 40. Memory cells 1Ba adjacent to each other in the second direction T are symmetrical with respect to a boundary Ba between them. Furthermore, a plurality of memory cells 1Ba each having the above structure are formed in a first direction S. Memory cells 1Ba adjacent to each other in the first direction S are symmetrical with respect to a boundary Bb between them.

The read word line RWL is electrically connected to gate electrodes 2h of memory cells 1Ba adjacent to each other in the second direction T, and is electrically connected to the p-type well region 40 via the contact electrode 42a and the p-type tap region 42. As a result, the gate electrode 2h (read word line RWL) of the read transistor R2 and the active region 40b in which the read transistor R1 and the read transistor R2 are formed are short-circuited. In this example, the read word line RWL extends in the second direction T.

Dummy gate electrodes 2 are formed at the boundary Ba between memory cells 1Ba adjacent to each other in the second direction T. n-type regions 3w (read bit lines RBL) or n-type regions 3u in memory cells 1Ba adjacent to each other in the second direction T are electrically isolated form each other by the p-type active region 40b under a dummy gate electrode 2. In this example, the read bit line RBL extends in the first direction S.

With the SRAM 1B in which the read section is added to the SRAM section 80, as has been described, the p-type well region 40 in which the read transistor R1 and the read transistor R2 are formed and the read word line RWL are short-circuited (DTMOS). The adoption of this DTMOS structure makes it possible to decrease operating voltage and ensure an ON-state current Ion. In addition, with the SRAM 1B the dummy gate electrodes 2 are used. As a result, the continuity of the active region 40b is preserved, the n-type regions 3w in the memory cells 1Ba adjacent to each other in the second direction T are electrically isolated from each other, and the n-type regions 3u in the memory cells 1Ba adjacent to each other in the second direction T are electrically isolated from each other.

The read transistor R1 and the read transistor R2 in the third embodiment can also be applied not only to the above SRAM 1A according to the second embodiment but also to the above SRAM 1 according to the first embodiment.

With the SRAM 1B according to the third embodiment a penetration contact electrode, an SOI substrate, or a PT is not used. The adoption of the SRAM 1B according to the third embodiment makes it possible to control an increase in the area of a memory cell and realize a low operating voltage. This is the same with the above SRAM 1 and SRAM 1A.

The SRAM 1B having the above structure can be fabricated by, for example, the following method. An example of a method for fabricating the above SRAM 1B will be described with reference to FIGS. 40 through 50.

Figure 40A:
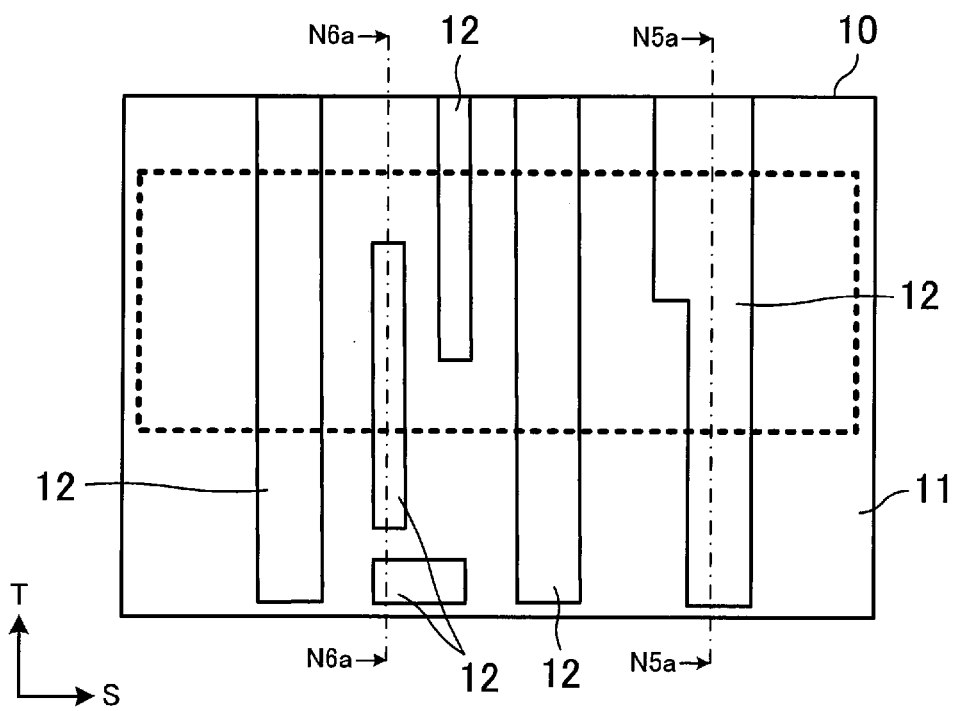
FIGS. 40A, 40B, and 40C are views for describing an example of an isolation layer and sacrificial oxide layer formation step in the third embodiment.
Figure 40B:
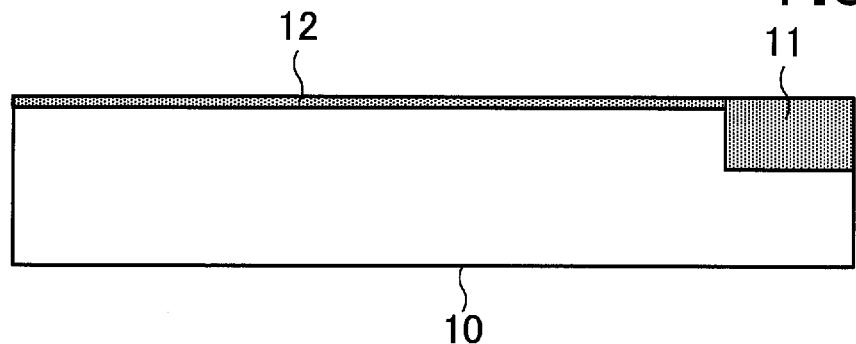
Figure 40C:
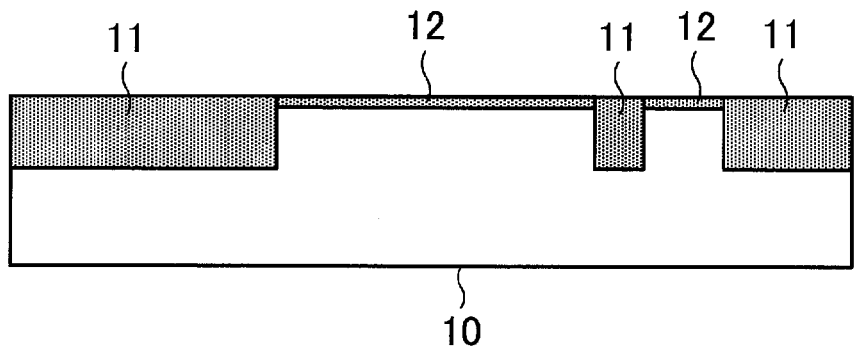

FIGS. 40A, 40B, and 40C are views for describing an example of an isolation layer and sacrificial oxide layer formation step in the third embodiment. FIG. 40A is a fragmentary schematic plan view of an example of an isolation layer and sacrificial oxide layer formation step in the third embodiment. FIG. 40B is a fragmentary schematic sectional view taken along lines N5a-N5a of FIG. 40A. FIG. 40C is a fragmentary schematic sectional view taken along lines N6a-N6a of FIG. 40A.

As illustrated in FIGS. 40A, 40B, and 40C, the isolation layer 11 and a sacrificial oxide layer 12 are formed in a p-type semiconductor substrate 10 by the use of, for example, the STI method and the thermal oxidation method respectively. By forming the isolation layer 11, active regions in which nMOSes and pMOSes of the SRAM 1B are formed and a pMOS tap region are defined.

Figure 41A:
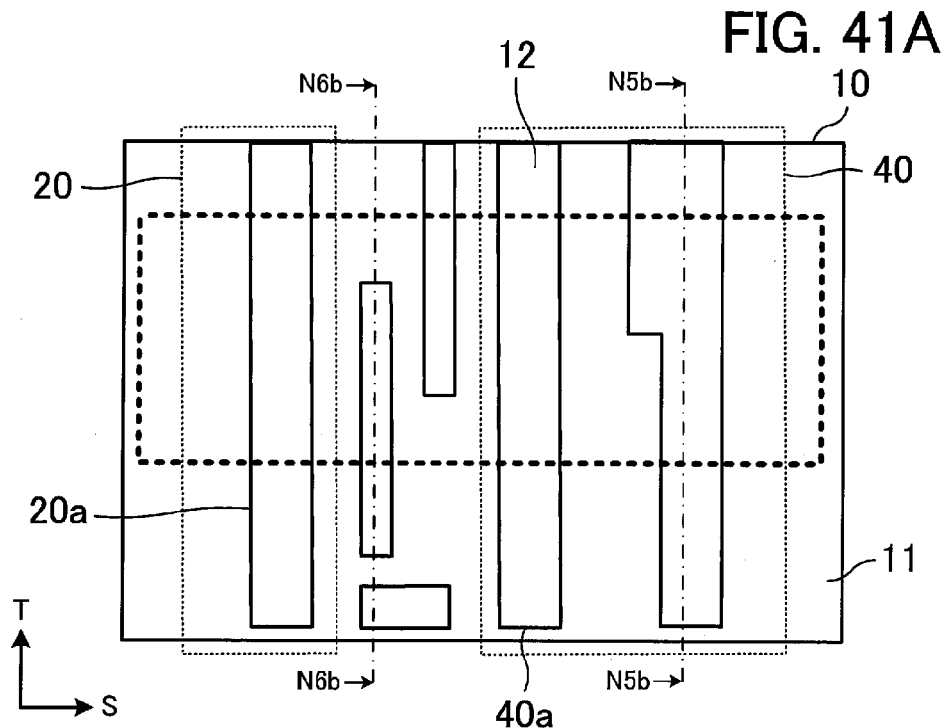
FIGS. 41A, 41B, and 41C are views for describing an example of a p-type well region formation step in the third embodiment.
Figure 41B:
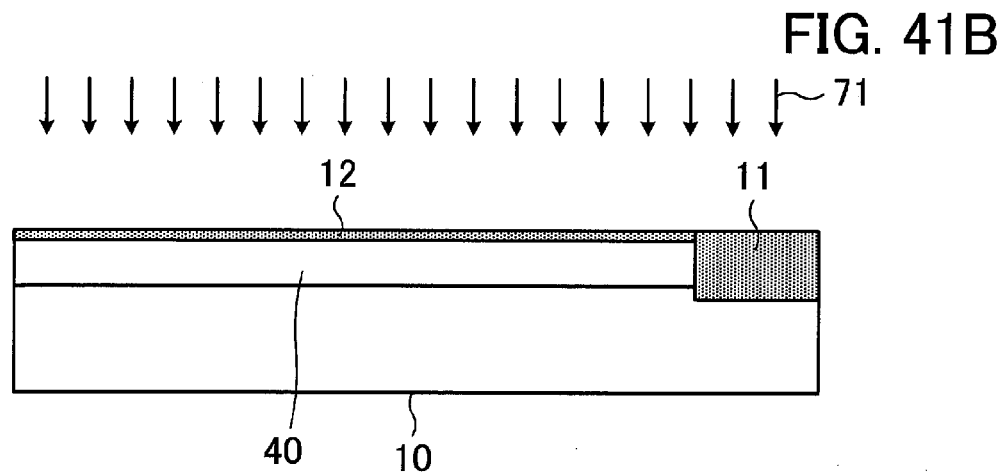
Figure 41C:
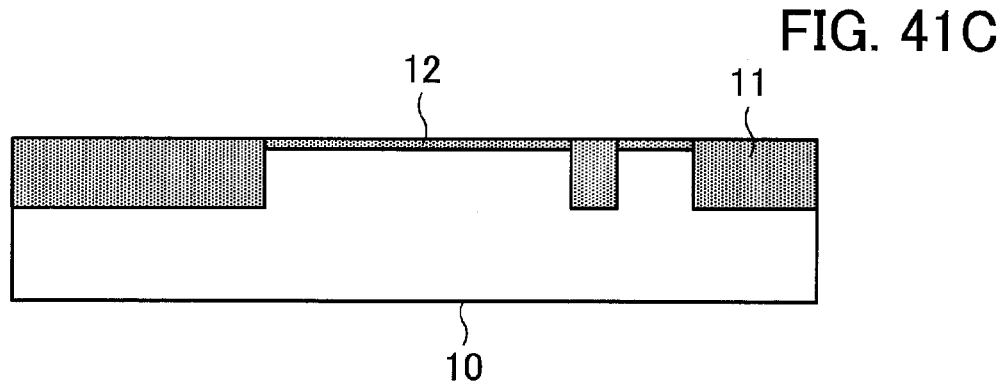

FIGS. 41A, 41B, and 41C are views for describing an example of a p-type well region formation step in the third embodiment. FIG. 41A is a fragmentary schematic plan view of an example of a p-type well region formation step in the third embodiment. FIG. 41B is a fragmentary schematic sectional view taken along lines N5b-N5b of FIG. 41A. FIG. 41C is a fragmentary schematic sectional view taken along lines N6b-N6b of FIG. 41A.

After the formation of the isolation layer 11 and the sacrificial oxide layer 12, as illustrated in FIGS. 41A, 41B, and 41C, the p-type well region 20 and the p-type well region 40 are formed. The p-type well region 20 and the p-type well region 40 are formed by introducing p-type impurities 71 into regions in which the nMOSes (transfer transistors, the driver transistors, and the read transistors) are to be formed and nMOS tap regions. In this case, the p-type well region 20 and the p-type well region 40 are shallower than the isolation layer 11 (FIGS. 41A and 41B). The p-type impurities 71 are introduced through the sacrificial oxide layer 12 into the semiconductor substrate 10 and are then diffused and activated by anneal performed in this step or a later step.

The p-type active region 20a, the p-type active region 40a, the p-type active region 40b, and the p-type tap regions 21, 41, and 42 described later are formed in the regions in the semiconductor substrate 10 which are defined by the isolation layer 11 and into which the p-type impurities 71 are introduced.

After the ion implantation of the p-type impurities 71, ion implantation for adjusting threshold voltage of the nMOSes (what is called channel implantation) may also be performed. The ion implantation of the p-type impurities 71 may also be utilized for nMOS channel implantation.

Figure 42A:
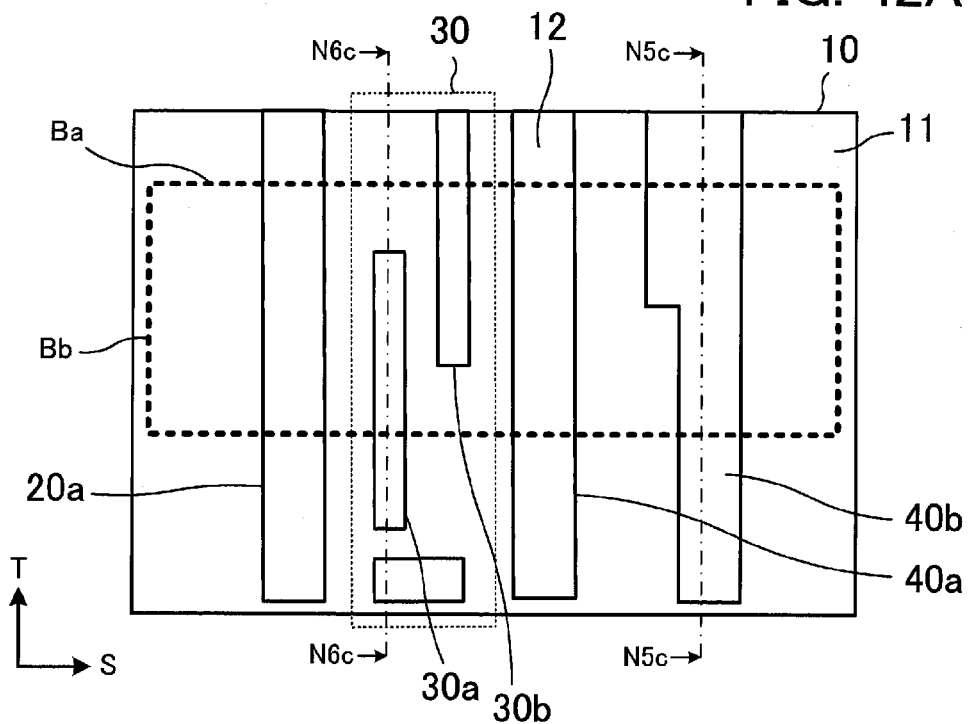
FIGS. 42A, 42B, and 42C are views for describing an example of an n-type well region formation step in the third embodiment.
Figure 42B:
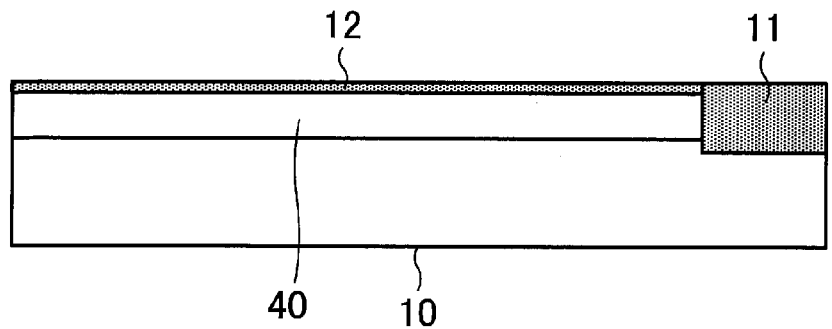
Figure 42C:
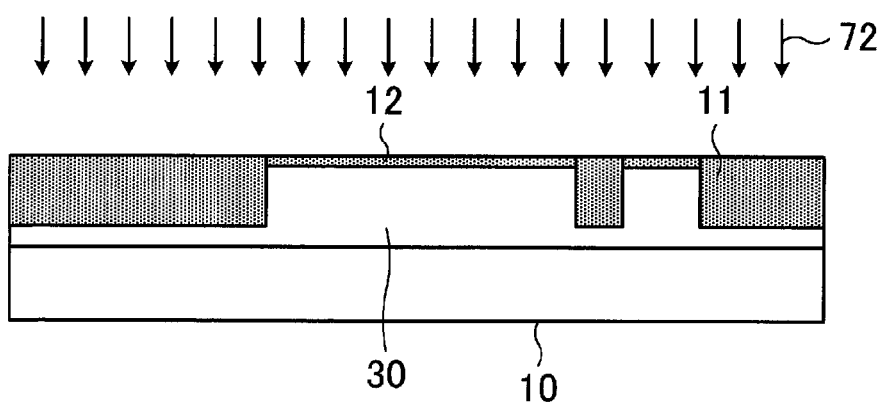

FIGS. 42A, 42B, and 42C are views for describing an example of an n-type well region formation step in the third embodiment. FIG. 42A is a fragmentary schematic plan view of an example of an n-type well region formation step in the third embodiment. FIG. 42B is a fragmentary schematic sectional view taken along lines N5c-N5c of FIG. 42A. FIG. 42C is a fragmentary schematic sectional view taken along lines N6c-N6c of FIG. 42A.

After the formation of the p-type well region 20 and the p-type well region 40, as illustrated in FIGS. 42A, 42B, and 42C, the n-type well region 30 is formed. The n-type well region 30 is formed by introducing n-type impurities 72 into a region in which the pMOSes (load transistors) are to be formed and a pMOS tap region (FIGS. 42A and 42C). The n-type impurities 72 are introduced through the sacrificial oxide layer 12 into the semiconductor substrate 10 and are then diffused and activated by anneal performed in this step or a later step.

An n-type active region 30a, an n-type active region 30b, and an n-type tap region 31 described later are formed in the regions in the semiconductor substrate 10 which are defined by the isolation layer 11 and into which the n-type impurities 72 are introduced.

After the ion implantation of the n-type impurities 72, ion implantation for adjusting threshold voltage of the pMOSes (what is called channel implantation) may also be performed. The ion implantation of the n-type impurities 72 may also be utilized for pMOS channel implantation.

Figure 43A:
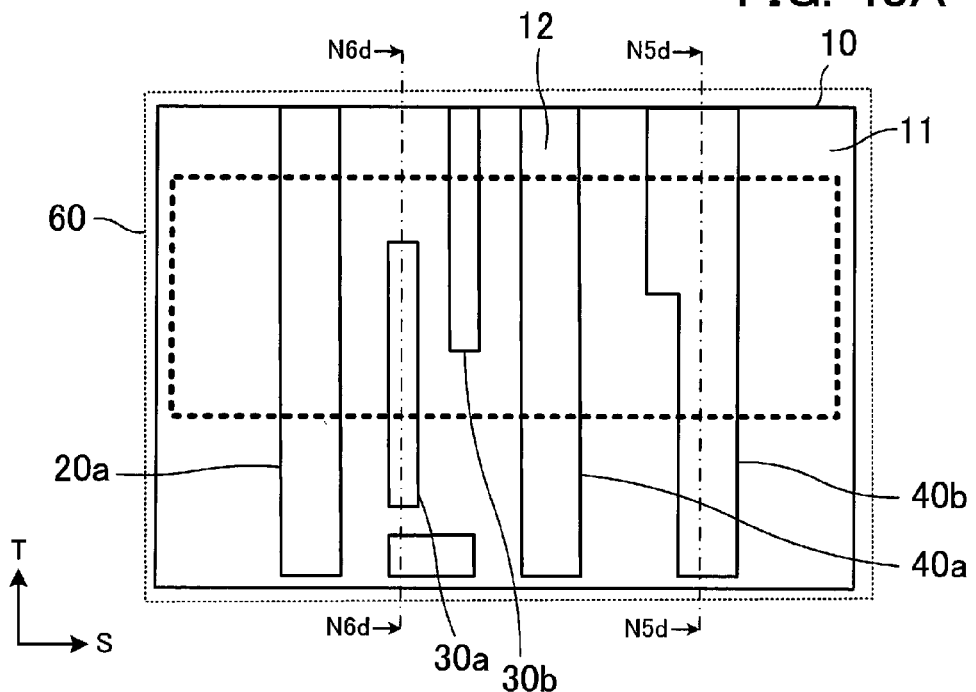
FIGS. 43A, 43B, and 43C are views for describing an example of a deep n-type well region formation step in the third embodiment.
Figure 43B:
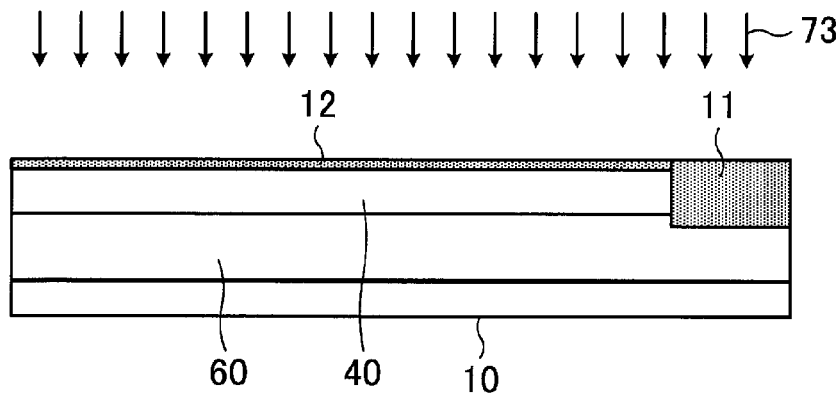
Figure 43C:
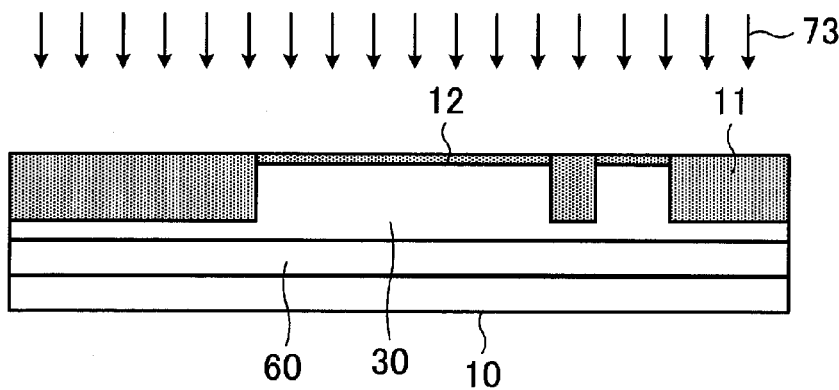

FIGS. 43A, 43B, and 43C are views for describing an example of a deep n-type well region formation step in the third embodiment. FIG. 43A is a fragmentary schematic plan view of an example of a deep n-type well region formation step in the third embodiment. FIG. 43B is a fragmentary schematic sectional view taken along lines N5d-N5d of FIG. 43A. FIG. 43C is a fragmentary schematic sectional view taken along lines N6d-N6d of FIG. 43A.

After the formation of the n-type well region 30, as illustrated in FIGS. 43A, 43B, and 43C, an n-type well region (deep n-type well region) 60 is formed. The n-type well region 60 is formed by introducing n-type impurities 73 into a region in which the SRAM 1B is to be formed (FIGS. 43A, 43B, and 43C). The n-type impurities 73 are introduced through the sacrificial oxide layer 12 into a region in the semiconductor substrate 10 which is deeper than the p-type well region 20, the p-type well region 40, and the n-type well region 30. After that, the introduced n-type impurities 73 are diffused and activated by anneal performed in this step or a later step.

The formed p-type well region 20 and p-type well region 40 are shallower than the lower end of the isolation layer 11 (FIGS. 41A, 41B, and 41C), so the boundary between the p-type well region 20 and the n-type well region 60 and the boundary between the p-type well region 40 and the n-type well region 60 are shallower than the lower end of the isolation layer 11.

Figure 44A:
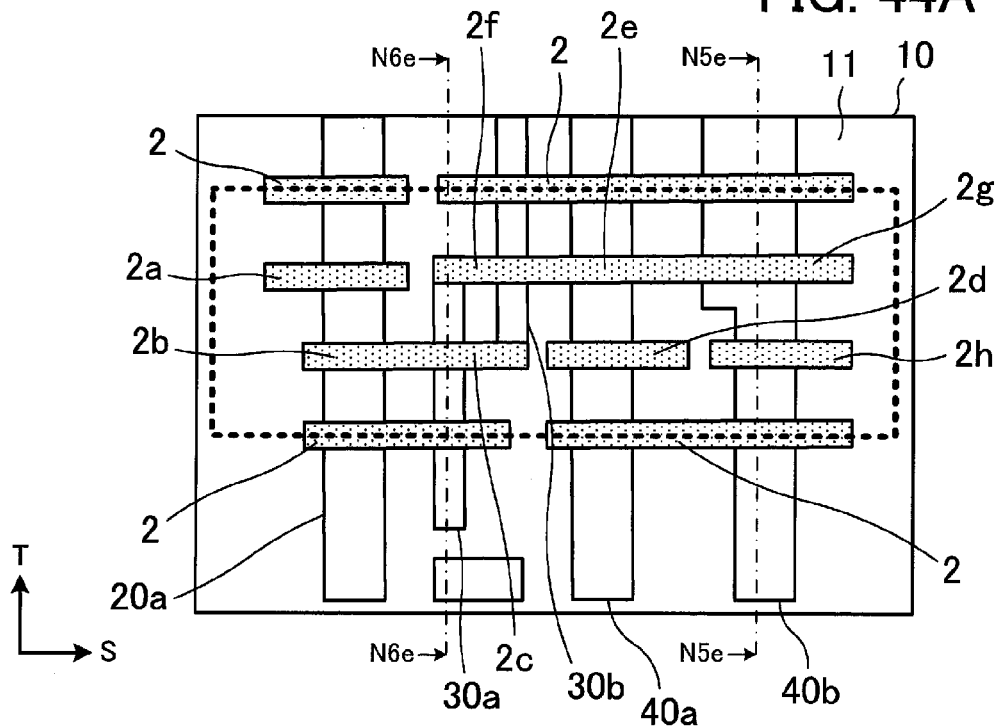
FIGS. 44A, 44B, and 44C are views for describing an example of a gate oxide film and gate electrode formation step in the third embodiment.
Figure 44B:
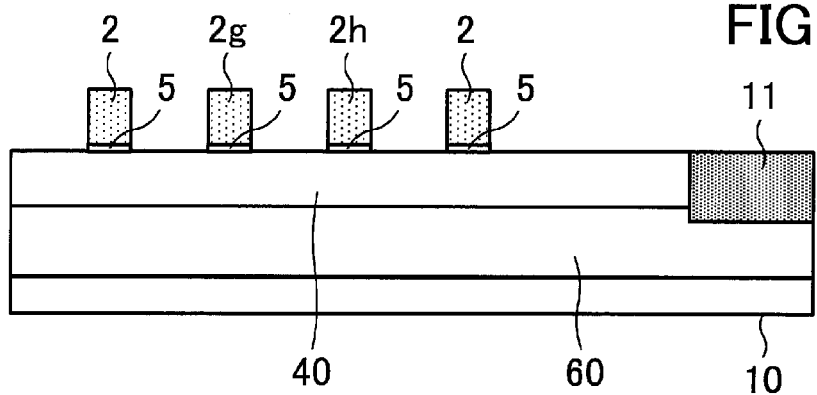
Figure 44C:
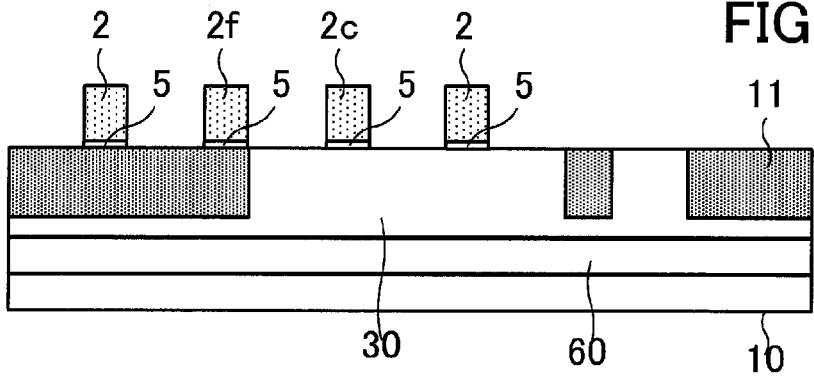

FIGS. 44A, 44B, and 44C are views for describing an example of a gate oxide film and gate electrode formation step in the third embodiment. FIG. 44A is a fragmentary schematic plan view of an example of a gate oxide film and gate electrode formation step in the third embodiment. FIG. 44B is a fragmentary schematic sectional view taken along lines N5e-N5e of FIG. 44A. FIG. 44C is a fragmentary schematic sectional view taken along lines N6e-N6e of FIG. 44A.

After the formation of the n-type well region 60, as illustrated in FIGS. 44A, 44B, and 44C, a gate oxide film 5, the gate electrodes 2e, 2f, 2g, and 2h, gate electrodes 2a, 2b, 2c, and 2d, and the dummy gate electrodes 2 are formed.

Figure 45A:
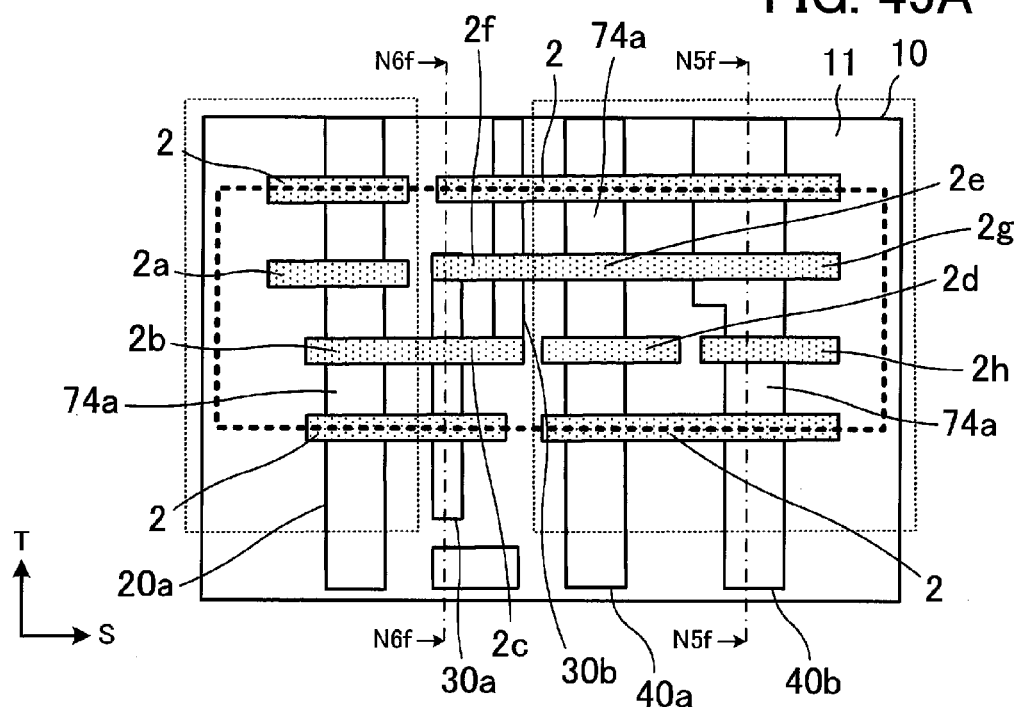
FIGS. 45A, 45B, and 45C are views for describing an example of an n-type extension region and p-type halo region formation step in the third embodiment.
Figure 45B:
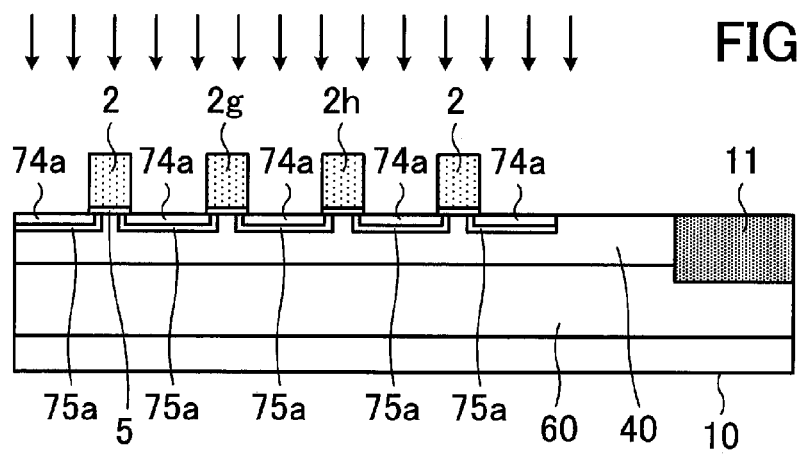
Figure 45C:
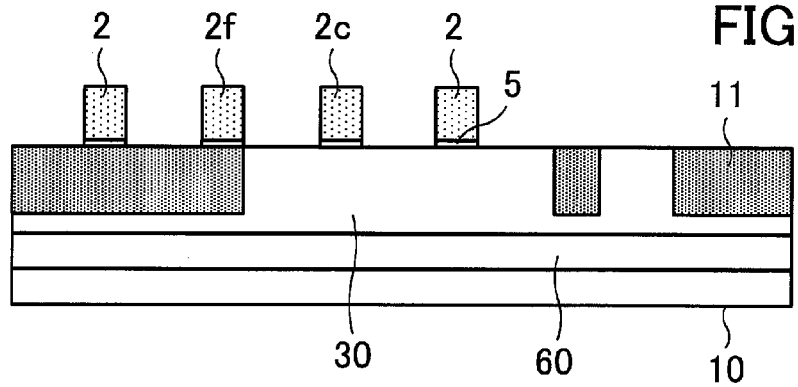

FIGS. 45A, 45B, and 45C are views for describing an example of an n-type extension region and p-type halo region formation step in the third embodiment. FIG. 45A is a fragmentary schematic plan view of an example of an n-type extension region and p-type halo region formation step in the third embodiment. FIG. 45B is a fragmentary schematic sectional view taken along lines N5f-N5f of FIG. 45A. FIG. 45C is a fragmentary schematic sectional view taken along lines N6f-N6f of FIG. 45A.

After the formation of the gate oxide film 5, the gate electrodes 2a through 2h, and the dummy gate electrodes 2, as illustrated in FIGS. 45A, 45B, and 45C, n-type extension regions 74a and p-type halo regions 75a are formed. The n-type extension regions 74a are formed on both sides of the gate electrodes 2a, 2b, 2d, 2e, 2g, and 2h of the nMOSes and dummy gate electrodes 2 (FIGS. 45A and 45B). The p-type halo regions 75a are formed in regions deeper than the n-type extension regions 74a so that they will surround the n-type extension regions 74a (FIG. 45B). Impurities introduced into the n-type extension regions 74a and the p-type halo regions 75a are diffused and activated by anneal performed in this step or a later step.

Figure 46A:
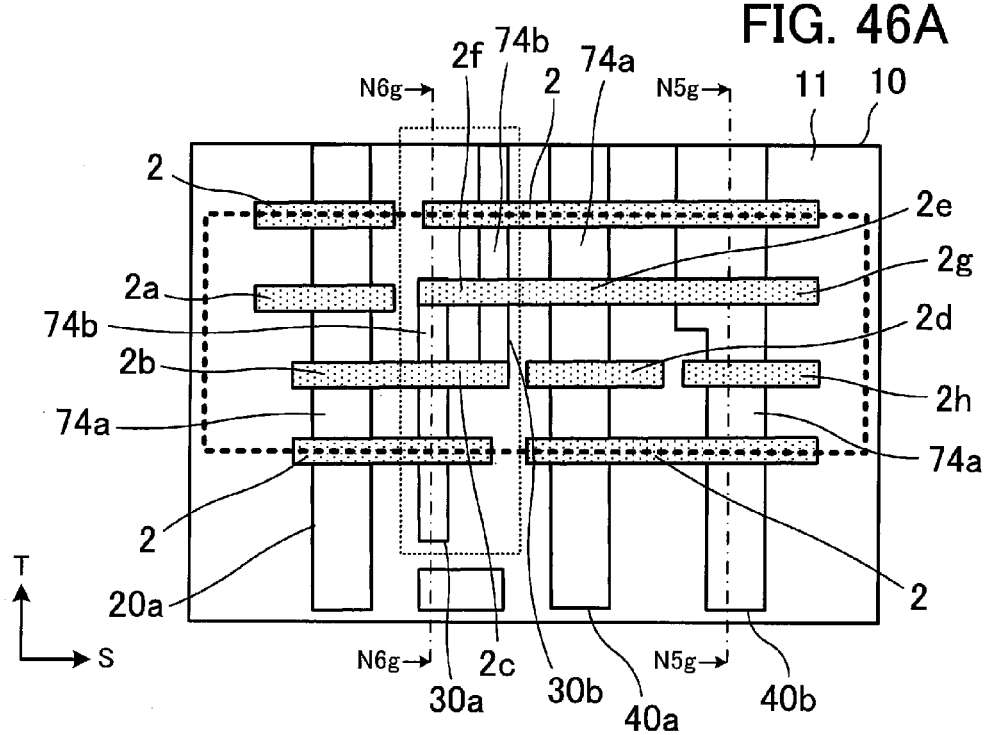
FIGS. 46A, 46B, and 46C are views for describing an example of a p-type extension region and n-type halo region formation step in the third embodiment.
Figure 46B:
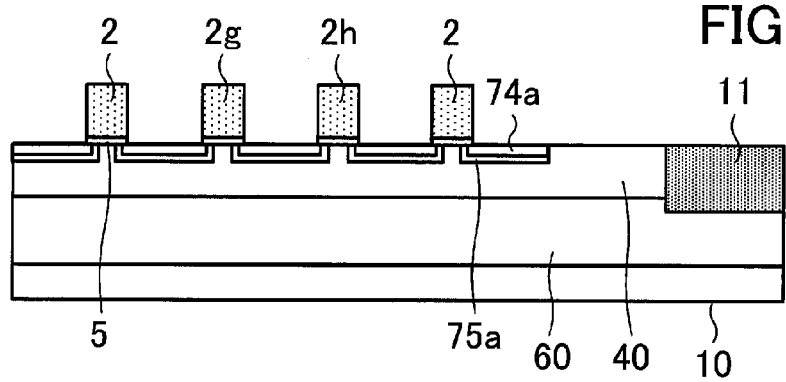
Figure 46C:
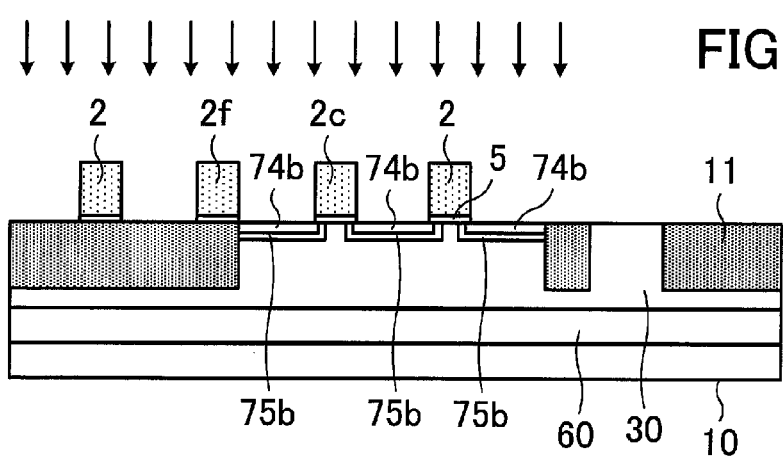

FIGS. 46A, 46B, and 46C are views for describing an example of a p-type extension region and n-type halo region formation step in the third embodiment.

FIG. 46A is a fragmentary schematic plan view of an example of a p-type extension region and n-type halo region formation step in the third embodiment. FIG. 46B is a fragmentary schematic sectional view taken along lines N5g-N5g of FIG. 46A. FIG. 46C is a fragmentary schematic sectional view taken along lines N6g-N6g of FIG. 46A.

As illustrated in FIGS. 46A, 46B, and 46C, p-type extension regions 74b and n-type halo regions 75b are formed. This is the same with FIGS. 45A, 45B, and 45C. The p-type extension regions 74b are formed on both sides of the gate electrodes 2c and 2f of the pMOSes and a dummy gate electrode 2 (FIGS. 46A and 46C). The n-type halo regions 75b are formed in regions deeper than the p-type extension regions 74b so that they will surround the p-type extension regions 74b (FIG. 46C). Impurities introduced into the p-type extension regions 74b and the n-type halo regions 75b are diffused and activated by anneal performed in this step or a later step.

Figure 47A:
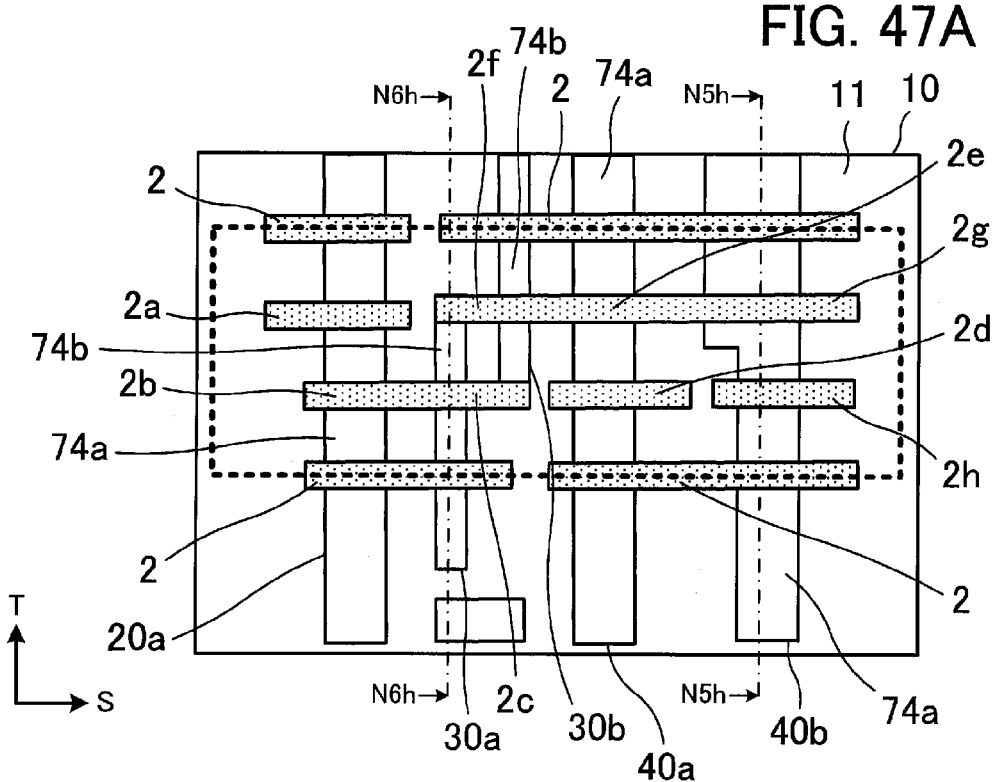
FIGS. 47A, 47B, and 47C are views for describing an example of a sidewall spacer formation step in the third embodiment.
Figure 47B:
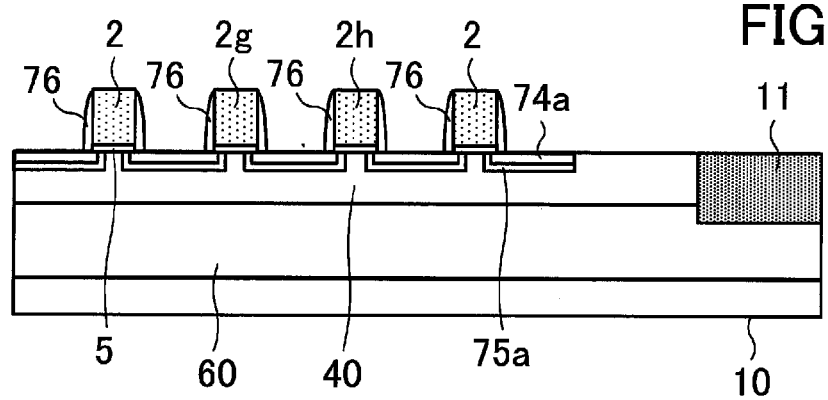
Figure 47C:
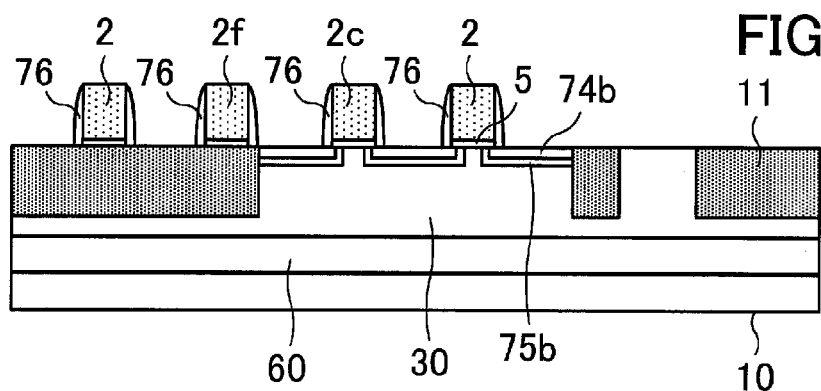

FIGS. 47A, 47B, and 47C are views for describing an example of a sidewall spacer formation step in the third embodiment. FIG. 47A is a fragmentary schematic plan view of an example of a sidewall spacer formation step in the third embodiment. FIG. 47B is a fragmentary schematic sectional view taken along lines N5h-N5h of FIG. 47A. FIG. 47C is a fragmentary schematic sectional view taken along lines N6h-N6h of FIG. 47A.

After the formation of the n-type extension regions 74a, the p-type extension regions 74b, and the like, as illustrated in FIGS. 47B and 47C, sidewall spacers 76 are formed on sidewalls of the gate electrodes 2a through 2h and the dummy gate electrodes 2 (not illustrated in FIG. 47A).

Figure 48A:
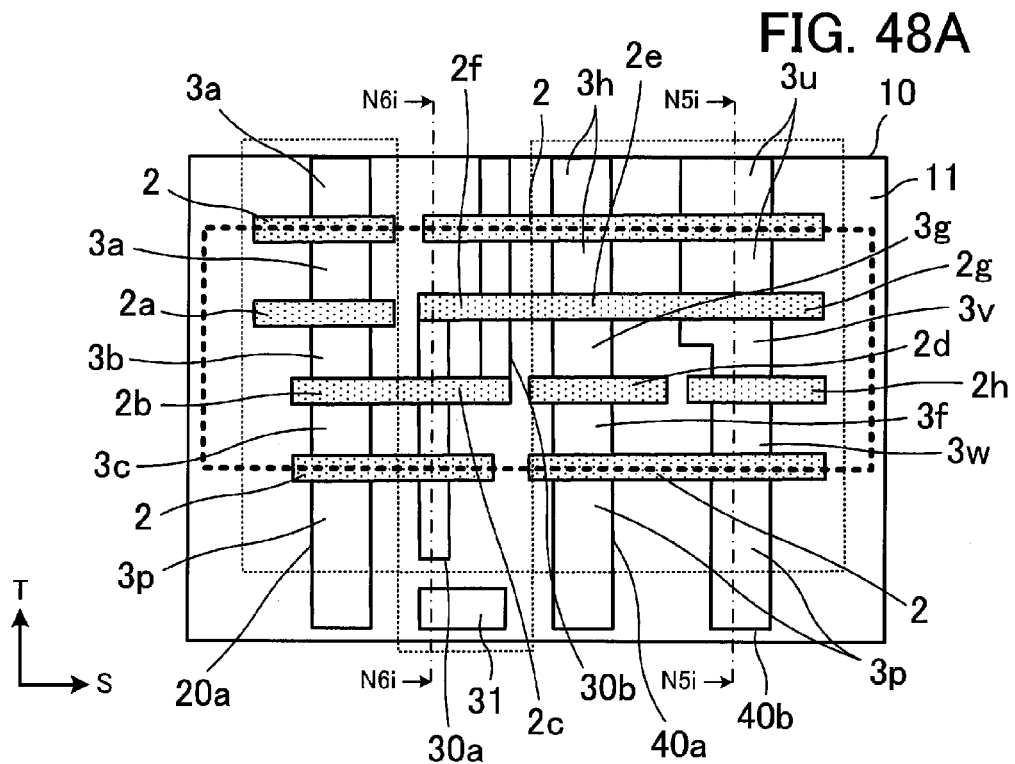
FIGS. 48A, 48B, and 48C are views for describing an example of an nMOS source-drain region formation step in the third embodiment.
Figure 48B:
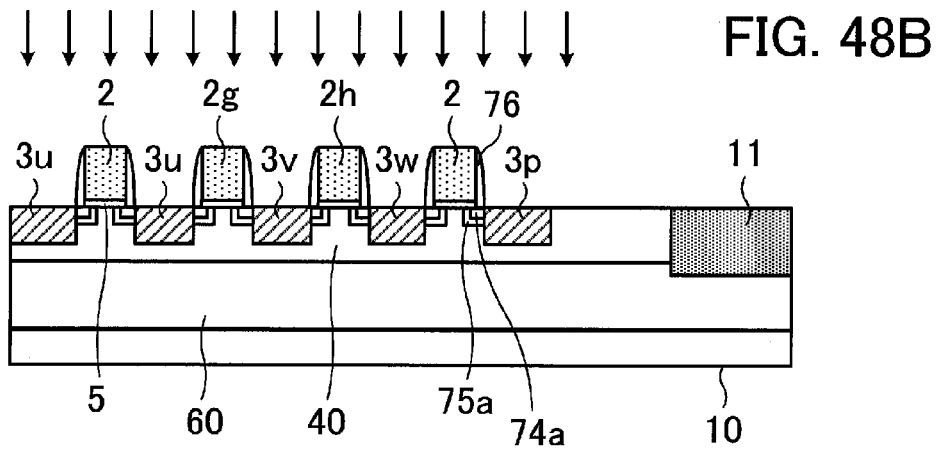
Figure 48C:
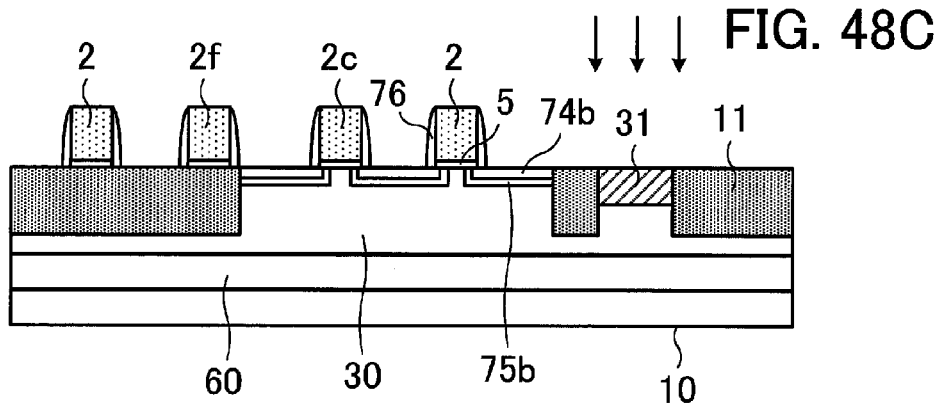

FIGS. 48A, 48B, and 48C are views for describing an example of an nMOS source-drain region formation step in the third embodiment. FIG. 48A is a fragmentary schematic plan view of an example of an nMOS source-drain region formation step in the third embodiment. FIG. 48B is a fragmentary schematic sectional view taken along lines N5i-N5i of FIG. 48A. FIG. 48C is a fragmentary schematic sectional view taken along lines N6i-N6i of FIG. 48A.

After the formation of the sidewall spacers 76, as illustrated in FIGS. 48A, 48B, and 48C, n-type regions 3a, 3c, 3f, 3g, 3h, and 3p and the n-type regions 3b, 3u, 3v, and 3w used as source-drain regions of the nMOSes are formed (FIGS. 48A and 48B). Impurities introduced at the time of forming the n-type regions 3a, 3b, 3c, 3f, 3g, 3h, 3u, 3v, 3w and 3p are also introduced into a region of the semiconductor substrate 10 in which the n-type tap region 31 is to be formed, and the n-type tap region 31 is formed (FIGS. 48A and 48C).

Figure 49A:
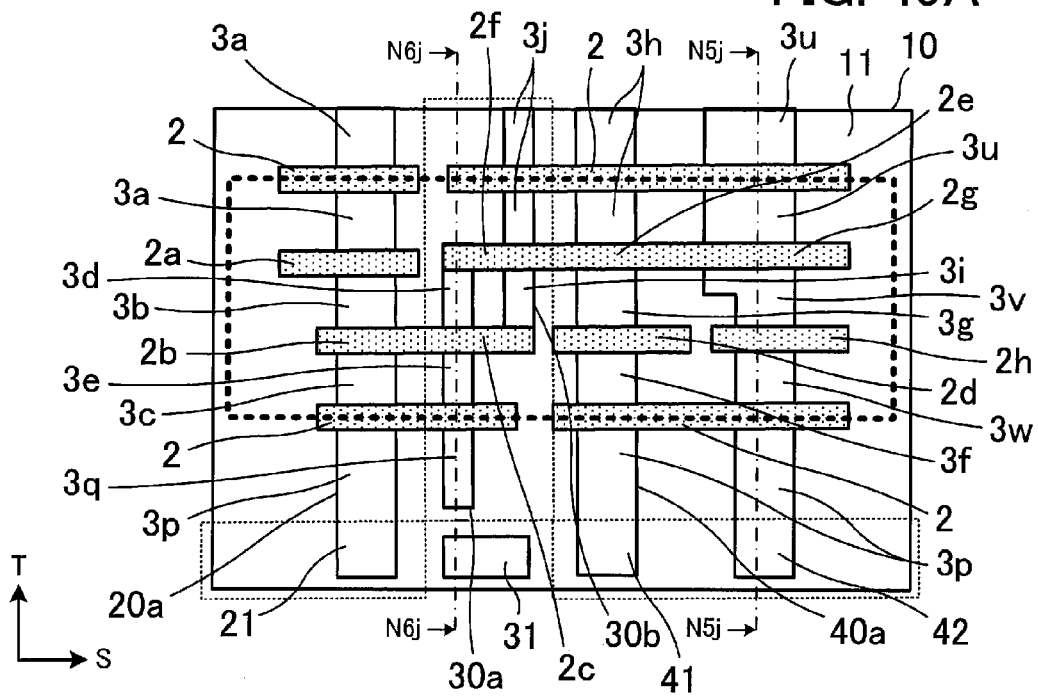
FIGS. 49A, 49B, and 49C are views for describing an example of a pMOS source-drain region formation step in the third embodiment.
Figure 49B:
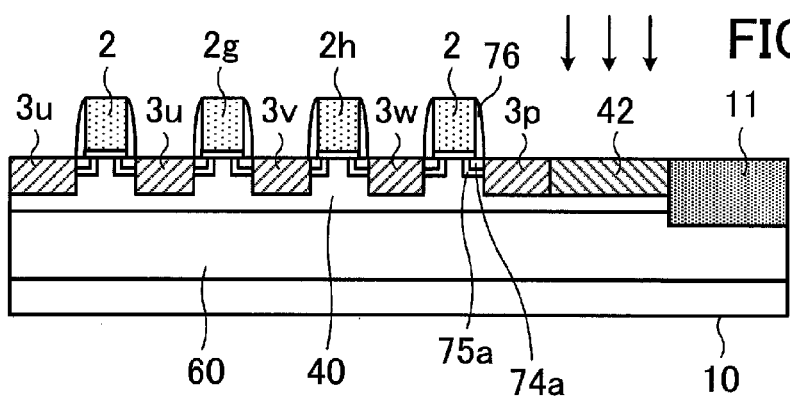
Figure 49C:
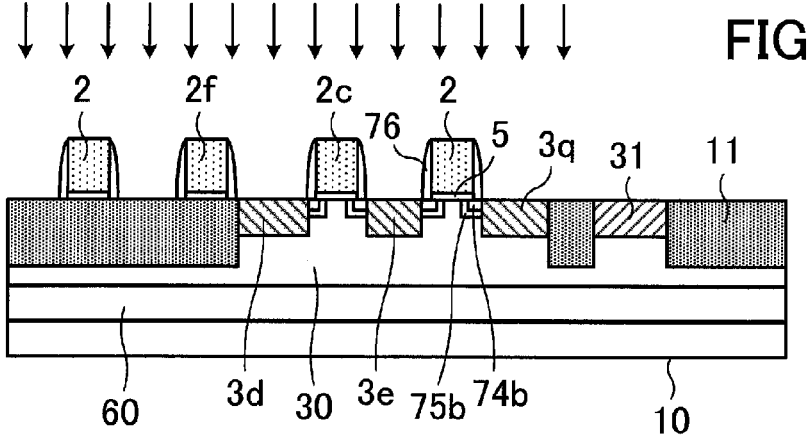

FIGS. 49A, 49B, and 49C are views for describing an example of a pMOS source-drain region formation step in the third embodiment. FIG. 49A is a fragmentary schematic plan view of an example of a pMOS source-drain region formation step in the third embodiment.

FIG. 49B is a fragmentary schematic sectional view taken along lines N5j-N5j of FIG. 49A. FIG. 49C is a fragmentary schematic sectional view taken along lines N6j-N6j of FIG. 49A.

As illustrated in FIGS. 49A, 49B, and 49C, p-type regions 3d, 3e, 3i, 3j, and 3q used as source-drain regions of the pMOSes are formed (FIGS. 49A and 49C). This is the same with FIGS. 48A, 48B, and 48C. Impurities introduced at the time of forming the p-type regions 3d, 3e, 3i, 3j, and 3q are also introduced into regions of the semiconductor substrate 10 in which the p-type tap regions 21, 41, and 42 are to be formed, and the p-type tap regions 21, 41, and 42 are formed (FIGS. 49A and 49B). The p-type tap regions 21 and 41 formed are connected to the n-type regions 3p.

Figure 50A:
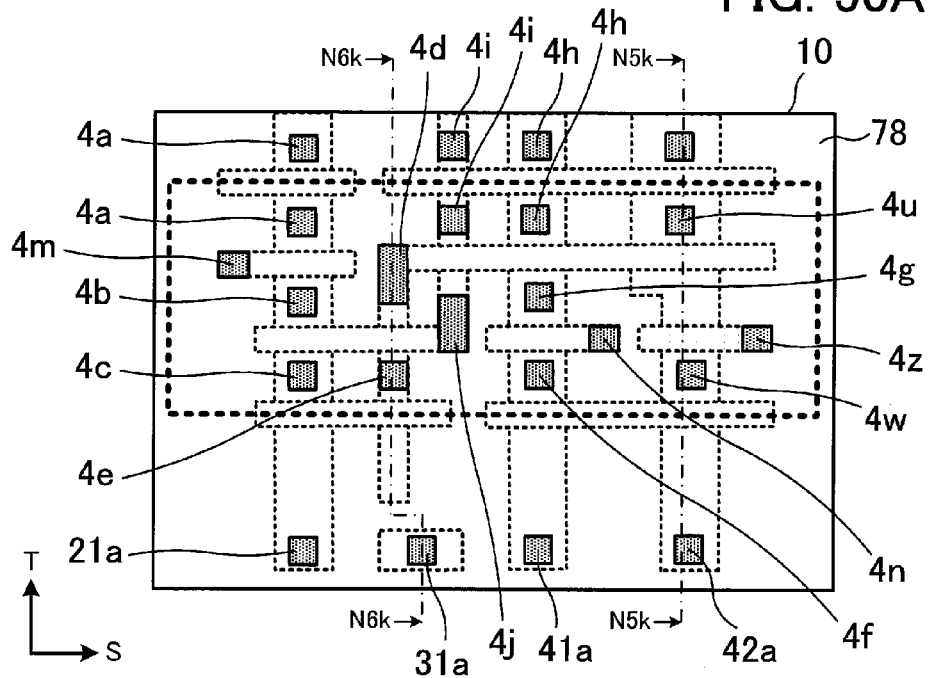
FIGS. 50A, 50B, and 50C are views for describing an example of a contact electrode formation step in the third embodiment.
Figure 50B:
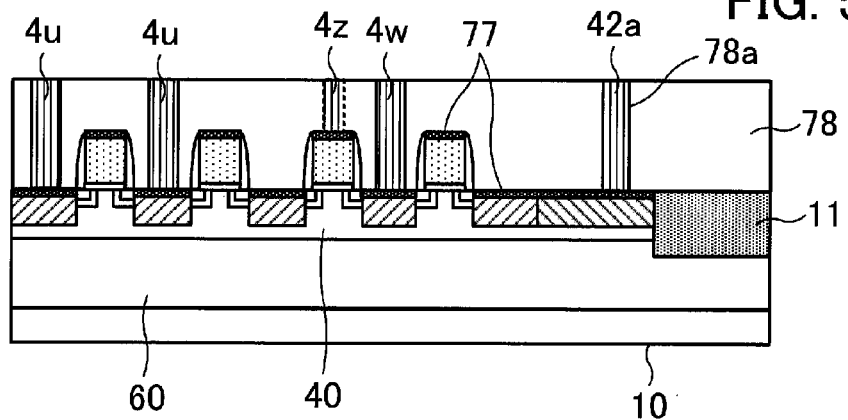
Figure 50C:
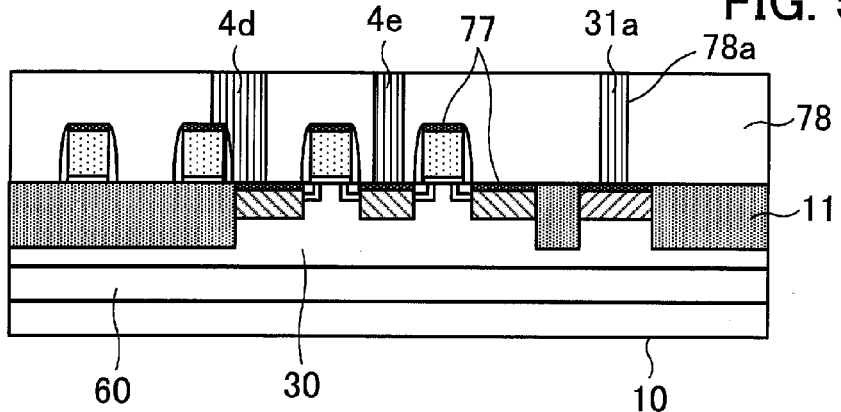

FIGS. 50A, 50B, and 50C are views for describing an example of a contact electrode formation step in the third embodiment. FIG. 50A is a fragmentary schematic plan view of an example of a contact electrode formation step in the third embodiment. FIG. 50B is a fragmentary schematic sectional view taken along lines N5k-N5k of FIG. 50A. FIG. 50C is a fragmentary schematic sectional view taken along lines N6k-N6k of FIG. 50A.

After the above step of FIGS. 49A, 49B, and 49C is performed, as illustrated in FIGS. 50A, 50B, and 50C, first a salicide layer 77 is formed in the n-type regions 3a, 3b, 3c, 3f, 3g, 3h, 3u, 3v, and 3w, the p-type regions 3d, 3e, 3i, and 3j, the n-type tap region 31, and the p-type tap regions 21, 41, and 42. After that, an interlayer dielectric 78 is formed and contact holes 78a are formed at determined positions of the interlayer dielectric 78. A determined conductive material is then buried in the contact holes 78a to form contact electrodes 4a through 4j, 4m, 4n, 4u, 4w, 4z, 31a, 21a, 41a, and 42a.

After that, a wiring layer including determined conductive portions (wirings, vias, or wirings and vias) is formed over a structure formed by the steps illustrated in FIGS. 40A, 40B, and 40C through FIGS. 50A, 50B, and 50C. Furthermore, a wiring layer including word lines WL1 and WL2 which extend in the second direction T and a wiring layer including bit lines BL and XBL which extend in the first direction S are formed.

The above SRAM 1B can be fabricated in the above way.

According to the disclosed techniques a semiconductor device including an SRAM in which an increase in the area of a memory cell is controlled and which can operate at low voltage can be realized. Furthermore, it is possible to realize such a semiconductor device without making a fabrication process complex or raising costs.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device comprising:
a first p-type well region, a first n-type well region, and a second p-type well region arranged in a first direction in a semiconductor substrate;
a first active region formed in the first p-type well region, a second active region formed in the second p-type well region, and a third active region and a fourth active region formed in the first n-type well region and arranged in the first direction;
memory cells formed by the use of the first p-type well region, the first n-type well region, and the second p-type well region and adjacent to each other in a second direction perpendicular to the first direction; and
signal lines electrically connected to the memory cells,
each of the memory cells including:
a first n-type transistor including a first gate electrode formed over the first active region and a first n-type region and a second n-type region formed in the first active region on both sides of the first gate electrode;
a second n-type transistor including a second gate electrode formed over the first active region on a second n-type region side from the first gate electrode and the second n-type region and a third n-type region formed in the first active region on both sides of the second gate electrode;
a first p-type transistor including a third gate electrode formed over the third active region and electrically connected to the second gate electrode and a first p-type region and a second p-type region formed in the third active region on both sides of the third gate electrode;
a third n-type transistor including a fourth gate electrode formed over the second active region and a fourth n-type region and a fifth n-type region formed in the second active region on both sides of the fourth gate electrode;
a fourth n-type transistor including a fifth gate electrode formed over the second active region on a fifth n-type region side from the fourth gate electrode and the fifth n-type region and a sixth n-type region formed in the second active region on both sides of the fifth gate electrode; and
a second p-type transistor including a sixth gate electrode formed over the fourth active region and electrically connected to the fifth gate electrode and a third p-type region and a fourth p-type region formed in the fourth active region on both sides of the sixth gate electrode,
the second n-type region, the first p-type region, and the sixth gate electrode being electrically connected to one another and the fifth n-type region, the third p-type region, and the third gate electrode being electrically connected to one another,
the signal lines including:
a first word line electrically connected to the first gate electrodes of the memory cells adjacent to each other in the second direction and the first p-type well region; and
a second word line electrically connected to the fourth gate electrodes of the memory cells adjacent to each other in the second direction and the second p-type well region.

2. The semiconductor device according to claim 1, wherein:
the memory cells adjacent to each other in the second direction are symmetrical with respect to a boundary between the memory cells;
first dummy gate electrodes are formed at the boundary; and
the first n-type regions of the memory cells adjacent to each other with the first dummy gate electrodes between are electrically isolated from each other by the first p-type well region under a first dummy gate electrode.

3. The semiconductor device according to claim 2, wherein the fourth p-type regions of the memory cells adjacent to each other are electrically isolated from each other by the first n-type well region under a first dummy gate electrode.

4. The semiconductor device according to claim 2, wherein the sixth n-type regions of the memory cells adjacent to each other are electrically isolated from each other by the second p-type well region under the first dummy gate electrode.

5. The semiconductor device according to claim 1, wherein:
the memory cells adjacent to each other in the second direction are symmetrical with respect to a boundary between the memory cells;
second dummy gate electrodes are formed at the boundary; and
the fourth n-type regions of the memory cells adjacent to each other with the second dummy gate electrodes between are electrically isolated from each other by the second p-type well region under a second dummy gate electrode.

6. The semiconductor device according to claim 5, wherein the third n-type regions of the memory cells adjacent to each other are electrically isolated from each other by the first p-type well region under a second dummy gate electrode.

7. The semiconductor device according to claim 5, wherein the second p-type regions of the memory cells adjacent to each other are electrically isolated from each other by the first n-type well region under the second dummy gate electrode.

8. The semiconductor device according to claim 1 further comprising other memory cells which are formed in the first direction and which are symmetrical to the memory cells adjacent to each other with respect to a straight line,
wherein:
the first gate electrodes of the memory cells adjacent to each other are electrically isolated from the first gate electrodes of the other memory cells; and
the fourth gate electrodes of the memory cells adjacent to each other are electrically isolated from the fourth gate electrodes of the other memory cells.

9. The semiconductor device according to claim 8 further comprising:
a second n-type well region which electrically isolates the first p-type well region of the memory cells adjacent to each other from the first p-type well region of the other memory cells; and
a third n-type well region which electrically isolates the second p-type well region of the memory cells adjacent to each other from the second p-type well region of the other memory cells.

10. The semiconductor device according to claim 8 further comprising:
a first isolation layer which electrically isolates the first p-type well region of the memory cells adjacent to each other from the first p-type well region of the other memory cells; and
a second isolation layer which electrically isolates the second p-type well region of the memory cells adjacent to each other from the second p-type well region of the other memory cells.

11. The semiconductor device according to claim 10, wherein:
a lower end of the first p-type well region is shallower than a lower end of the first isolation layer; and
a lower end of the second p-type well region is shallower than a lower end of the second isolation layer.

12. The semiconductor device according to claim 1, wherein the first word line and the second word line extend in the second direction.

13. The semiconductor device according to claim 1, wherein:
the signal lines further include:
a first bit line electrically connected to the first n-type regions of the memory cells; and
a second bit line electrically connected to the fourth n-type regions of the memory cells; and
the first bit line and the second bit line extend in the first direction.

14. The semiconductor device according to claim 1, wherein:
the third n-type region and the sixth n-type region are electrically connected to a ground potential line; and
the second p-type region and the fourth p-type region are electrically connected to a power supply potential line.

15. The semiconductor device according to claim 1 further comprising a fifth active region formed in the second p-type well region,
wherein:
said each memory cell further includes:
a fifth n-type transistor including a seventh gate electrode formed over the fifth active region and a seventh n-type region and an eighth n-type region formed in the fifth active region on both sides of the seventh gate electrode; and
a sixth n-type transistor including an eighth gate electrode formed over the fifth active region on an eighth n-type region side from the seventh gate electrode and the eighth n-type region and a ninth n-type region formed in the fifth active region on both sides of the eighth gate electrode;
the seventh gate electrode is electrically connected to the fifth gate electrode; and
the signal lines further include a third word line electrically connected to the eighth gate electrodes of the memory cells adjacent to each other in the second direction and the second p-type well region.

16. The semiconductor device according to claim 15 further comprising third dummy gate electrodes formed on a ninth n-type region side from the eighth gate electrode, wherein the ninth n-type regions of the memory cells adjacent to each other with the third dummy gate electrodes between are electrically isolated from each other by the second p-type well region under a third dummy gate electrode.

17. The semiconductor device according to claim 15, wherein the third word line extends in the second direction.

18. The semiconductor device according to claim 15, wherein:
the signal lines further include a third bit line electrically connected to the ninth n-type regions of the memory cells; and
the third bit line extends in the first direction.

19. A semiconductor device comprising:
a first p-type well region, a first n-type well region, and a second p-type well region arranged in a first direction in a semiconductor substrate;
memory cells formed by the use of the first p-type well region, the first n-type well region, and the second p-type well region and adjacent to each other in a second direction perpendicular to the first direction; and
signal lines electrically connected to the memory cells,
each of the memory cells including:
a data storage section formed by the use of the first p-type well region, the first n-type well region, and the second p-type well region; and
a first n-type transistor and a second n-type transistor formed in the first p-type well region and the second p-type well region, respectively, and used for writing data to or reading data from the data storage section,
the signal lines including:
a first word line electrically connected to gate electrodes of the first n-type transistors of the memory cells adjacent to each other in the second direction and the first p-type well region; and
a second word line electrically connected to gate electrodes of the second n-type transistors of the memory cells adjacent to each other in the second direction and the second p-type well region.

* * * * *